(12) United States Patent
Yamaguchi et al.

(10) Patent No.: US 11,152,244 B2
(45) Date of Patent: Oct. 19, 2021

(54) ELECTROSTATIC CHUCK

(71) Applicant: TOTO LTD., Kitakyushu (JP)

(72) Inventors: Kosuke Yamaguchi, Kitakyushu (JP); Hitoshi Sasaki, Kitakyushu (JP); Kengo Maehata, Kitakyushu (JP); Shumpei Kondo, Kitakyushu (JP); Yuichi Yoshii, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 389 days.

(21) Appl. No.: 16/243,756

(22) Filed: Jan. 9, 2019

(65) Prior Publication Data
US 2019/0148204 A1 May 16, 2019

Related U.S. Application Data

(63) Continuation of application No. PCT/JP2017/026292, filed on Jul. 20, 2017.

(30) Foreign Application Priority Data

Jul. 20, 2016 (JP) .............................. JP2016-142662
Mar. 16, 2017 (JP) .............................. JP2017-051448

(51) Int. Cl.
*H01L 21/683* (2006.01)
*H02N 13/00* (2006.01)
(Continued)

(52) U.S. Cl.
CPC .... *H01L 21/6833* (2013.01); *H01L 21/67103* (2013.01); *H01L 21/67109* (2013.01); *H01L 21/67248* (2013.01); *H01L 21/68757* (2013.01); *H01L 21/68785* (2013.01); *H02N 13/00* (2013.01); *H05B 1/0233* (2013.01);
(Continued)

(58) Field of Classification Search
None
See application file for complete search history.

(56) References Cited

U.S. PATENT DOCUMENTS 6,150,636 A * 11/2000 Bogdanski ............ F24C 15/102
219/461.1
2005/0215073 A1 9/2005 Nakamura et al.
(Continued)

FOREIGN PATENT DOCUMENTS

JP 2010-040644 A 2/2010

*Primary Examiner* — Phuong T Nguyen
(74) *Attorney, Agent, or Firm* — Carrier Blackman & Associates, P.C.; Joseph P. Carrier; William D. Blackman

(57) ABSTRACT

An electrostatic chuck includes: a ceramic dielectric substrate; a base plate; and a heater plate. The heater plate includes a first and a second support plates including a metal, a heater element provided between the first and the second support plates, a first resin layer provided between the first support plate and the heater element, and a second resin layer provided between the second support plate and the heater element. A surface of the first support plate on the second support plate side includes a first region and a second region, the first region overlapping the heater element when viewed along the stacking direction, the second region not overlapping the heater element when viewed along the stacking direction. In a cross section parallel to the stacking direction, the second region protrudes toward the second support plate side compared to the first region.

30 Claims, 30 Drawing Sheets

(51) Int. Cl.
*H01L 21/67* (2006.01)
*H01L 21/687* (2006.01)
*H05B 1/02* (2006.01)
*H05B 3/03* (2006.01)
*H05B 3/26* (2006.01)

(52) U.S. Cl.
CPC ............... *H05B 3/03* (2013.01); *H05B 3/265* (2013.01); *H05B 2203/002* (2013.01)

(56) References Cited

U.S. PATENT DOCUMENTS

| | | | |
|---|---|---|---|
| 2006/0011610 A1* | 1/2006 | Kondou | H01L 21/67103 219/444.1 |
| 2006/0144516 A1* | 7/2006 | Ricci | H01L 21/67103 156/345.27 |
| 2008/0006618 A1* | 1/2008 | Futakuchiya | H01L 21/68792 219/444.1 |
| 2013/0334199 A1 | 12/2013 | Yousif et al. | |
| 2015/0279714 A1 | 10/2015 | Yamaguchi et al. | |

\* cited by examiner

ELECTROSTATIC CHUCK

CROSS-REFERENCE TO RELATED APPLICATIONS

This is a continuation application of International Application PCT/JP2017/026292, filed on Jul. 20, 2017. This application also claims priority to Japanese Application No. 2016-142662, filed on Jul. 20, 2016, and Japanese Application No. 2017-051448, filed on Mar. 16, 2017; the entire contents of each are incorporated herein by reference.

FIELD OF THE INVENTION

Embodiments of the invention relate generally to an electrostatic chuck.

BACKGROUND OF THE INVENTION

An electrostatic chuck is used to attract and hold a processing object such as a semiconductor wafer, a glass substrate, etc., inside a plasma processing chamber that performs etching, CVD (Chemical Vapor Deposition), sputtering, ion implantation, ashing, etc. The electrostatic chuck applies electrical power for electrostatic attraction to a built-in electrode and attracts and holds a substrate such as a silicon wafer, etc., by an electrostatic force.

Temperature control of the wafer is desirable in a substrate processing apparatus including an electrostatic chuck to increase the yield and improve the quality (e.g., increase the patterning precision of the wafer). For example, two types of temperature control of the wafer are desirable for the electrostatic chuck. One is the ability to cause the temperature distribution in the wafer surface to be uniform (temperature uniformity). The other is the ability to cause the wafer to reach the prescribed temperature in a short length of time. For example, the heating performance (the temperature increase rate) of the heater is desirable. The temperature increase rate has a relationship with the takt time when processing the wafer and therefore affects the throughput. Also, there are cases where the ability to deliberately set a temperature difference in the wafer surface (temperature controllability) is desirable in the electrostatic chuck.

As a method for controlling the temperature of the wafer, a method is known in which an electrostatic chuck including a built-in heater (heating element) and/or cooling plate is used. Normally, the temperature uniformity has a trade-off relationship with the temperature controllability. Simultaneously, the reliability of the heater, and particularly the withstand voltage characteristics, are desirable for the electrostatic chuck.

An RF (Radio Frequency) voltage (a high frequency voltage) is applied in the processes of wafer processing. When the RF voltage is applied, a general heater is affected by the high frequency waves and generates heat. Thereby, the temperature of the wafer is affected. Also, when the RF voltage is applied, a leakage current flows in the equipment side. Therefore, a mechanism such as a filter or the like is necessary on the equipment side.

In the processes in a plasma etching apparatus, etc., plasma that has various intensities and various distributions is irradiated on the wafer. In such a case, it is desirable to control the temperature of the wafer to be a temperature suited to the process (temperature uniformity and temperature controllability). Also, to increase the productivity, it is desirable to cause the temperature of the wafer to reach the prescribed temperature in a short length of time. Thermal/electrical/mechanical loads on the electrostatic chuck are generated by an abrupt temperature change, the incidence of heat, and the application of the high frequency voltage. It is desirable for the electrostatic chuck to have high reliability for these loads (especially insulation breakdown voltage/bonding reliability).

For example, it has been attempted to satisfy these requirements by performing the temperature control of a heater built into an electrostatic chuck. However, it has been difficult to simultaneously satisfy these requirements.

The invention is carried out based on recognition of such problems and is directed to provide an electrostatic chuck that can withstand thermal/electrical/mechanical loads and has high reliability.

SUMMARY OF THE INVENTION

According to an aspect of the invention, an electrostatic chuck comprises: a ceramic dielectric substrate having a first major surface where a processing object is placed, and a second major surface on a side opposite to the first major surface; a base plate supporting the ceramic dielectric substrate and being provided at a position separated from the ceramic dielectric substrate in a stacking direction; and a heater plate provided between the ceramic dielectric substrate and the base plate, the heater plate including a first support plate including a metal, a second support plate including a metal, a heater element provided between the first support plate and the second support plate, the heater element emitting heat due to a current flowing, a first resin layer provided between the first support plate and the heater element, and a second resin layer provided between the second support plate and the heater element, a surface of the first support plate on the second support plate side including a first region and a second region, the first region overlapping the heater element when viewed along the stacking direction, the second region not overlapping the heater element when viewed along the stacking direction, in a cross section parallel to the stacking direction, the second region protruding toward the second support plate side compared to the first region.

A first invention is an electrostatic chuck that includes a ceramic dielectric substrate, a base plate, and a heater plate; the ceramic dielectric substrate has a first major surface where a processing object is placed, and a second major surface on a side opposite to the first major surface; the base plate supports the ceramic dielectric substrate and is provided at a position separated from the ceramic dielectric substrate in a stacking direction; the heater plate is provided between the ceramic dielectric substrate and the base plate; the heater plate includes a first support plate, a second support plate, a heater element provided between the first support plate and the second support plate, a first resin layer provided between the first support plate and the heater element, and a second resin layer provided between the second support plate and the heater element; the first support plate includes a metal; the second support plate includes a metal; the heater element generates heat due to a current flowing; a surface of the first support plate on the second support plate side includes a first region and a second region; the first region overlaps the heater element when viewed along the stacking direction; the second region does not overlap the heater element when viewed along the stacking direction; and in a cross section parallel to the stacking direction, the second region protrudes toward the second support plate side compared to the first region.

According to the electrostatic chuck, the heater element is provided between the first support plate and the second support plate. Thereby, the uniformity of the temperature distribution in the surface of the heater plate can be increased; and the uniformity of the temperature distribution in the surface of the processing object can be increased. Also, the first support plate and the second support plate shield the heater element from the high frequency waves; and the heat generation of the heater element to an abnormal temperature can be suppressed. Accordingly, the reliability of the electrostatic chuck can be increased.

A second invention is an electrostatic chuck that includes a ceramic dielectric substrate, a base plate, and a heater plate; the ceramic dielectric substrate has a first major surface where a processing object is placed, and a second major surface on a side opposite to the first major surface; the base plate supports the ceramic dielectric substrate and is provided at a position separated from the ceramic dielectric substrate in a stacking direction; the heater plate is provided between the ceramic dielectric substrate and the base plate; the heater plate includes a first support plate, a second support plate, a heater element provided between the first support plate and the second support plate, a first resin layer provided between the first support plate and the heater element, and a second resin layer provided between the second support plate and the heater element; the first support plate includes a metal; the second support plate includes a metal; the heater element generates heat due to a current flowing; a surface of the second support plate on the first support plate side includes a region overlapping the heater element when viewed along the stacking direction, and a region not overlapping the heater element when viewed along the stacking direction; and in a cross section parallel to the stacking direction, the region not overlapping the heater element protrudes toward the first support plate side compared to the region overlapping the heater element.

According to the electrostatic chuck, the heater element is provided between the first support plate and the second support plate. Thereby, the uniformity of the temperature distribution in the surface of the heater plate can be increased; and the uniformity of the temperature distribution in the surface of the processing object can be increased. Also, the first support plate and the second support plate shield the heater element from the high frequency waves; and the heat generation of the heater element to an abnormal temperature can be suppressed. Accordingly, the reliability of the electrostatic chuck can be increased.

A third invention is the electrostatic chuck of the first invention, wherein a surface of the second support plate on the first support plate side includes a third region and a fourth region; the third region overlaps the heater element when viewed along the stacking direction; the fourth region does not overlap the heater element when viewed along the stacking direction; and in a cross section parallel to the stacking direction, the fourth region protrudes toward the first support plate side compared to the third region.

According to the electrostatic chuck, the heater element is provided between the first support plate and the second support plate. Thereby, the uniformity of the temperature distribution in the surface of the heater plate can be increased; and the uniformity of the temperature distribution in the surface of the processing object can be increased. Also, the first support plate and the second support plate shield the heater element from the high frequency waves; and the heat generation of the heater element to an abnormal temperature can be suppressed.

A fourth invention is the electrostatic chuck of the first invention, wherein a surface of the first support plate on the second support plate side includes an unevenness following a configuration of the heater element; and a surface of the second support plate on the first support plate side includes an unevenness following a configuration of the heater element.

According to the electrostatic chuck, the adhesion between the first support plate and the layers proximal to the first support plate is high. Also, the adhesion between the second support plate and the layers proximal to the second support plate is high. Thereby, the thermal uniformity and the withstand voltage characteristics can be realized as designed. Also, the rate of increasing the temperature of the processing object can be increased. Accordingly, for example, it is possible to realize both the "heating performance of the heater (the temperature increase rate)" and the "temperature uniformity" "withstand voltage reliability."

A fifth invention is the electrostatic chuck of the third invention, wherein a distance along the stacking direction between the second region and the fourth region is shorter than a distance along the stacking direction between the first region and the third region.

According to the electrostatic chuck, the adhesion between the first support plate and the layers proximal to the first support plate is high. Also, the adhesion between the second support plate and the layers proximal to the second support plate is high. Thereby, the thermal uniformity and the withstand voltage characteristics can be realized as designed. Also, the rate of increasing the temperature of the processing object can be increased. Accordingly, for example, it is possible to realize both the "heating performance of the heater (the temperature increase rate)" and the "temperature uniformity" "withstand voltage reliability."

A sixth invention is the electrostatic chuck of the third invention, wherein a distance along the stacking direction between the first region and the second region is shorter than a distance along the stacking direction between the second region and the fourth region; and a distance along the stacking direction between the third region and the fourth region is shorter than the distance along the stacking direction between the second region and the fourth region.

According to the electrostatic chuck, the distortion that is generated in the first support plate, the second support plate, etc., is prevented from becoming too large while ensuring the adhesion between the first support plate and the layers proximal to the first support plate and the adhesion between the second support plate and the layers proximal to the second support plate.

A seventh invention is an electrostatic chuck of the first invention, wherein a width of a surface of the heater element on the first support plate side is different from a width of a surface of the heater element on the second support plate side.

According to the electrostatic chuck, the stress that is applied to the first resin layer, etc., can be reduced even when the heater element deforms due to thermal expansion. Thereby, the peeling of the layers (e.g., the first resin layer) proximal to the heater element can be suppressed. The temperature change of the processing object occurring due to the peeling can be suppressed. Accordingly, the reliability of the electrostatic chuck can be increased.

An eighth invention is the electrostatic chuck of the seventh invention, wherein the width of the surface of the heater element on the first support plate side is narrower than the width of the surface of the heater element on the second support plate side.

According to the electrostatic chuck, the stress that is applied to the layers contacting the surface of the heater element on the first support plate side can be reduced; and the peeling can be suppressed. For example, the peeling of the first resin layer can be suppressed. Also, the heat generation amount on the base plate side where the heat escapes easily is more than the heat generation amount on the ceramic dielectric side; and the fluctuation of the heat distribution in the vertical direction can be suppressed. For example, the thermal uniformity can be improved further.

A ninth invention is the electrostatic chuck of the seventh invention, wherein the width of the surface of the heater element on the first support plate side is wider than the width of the surface of the heater element on the second support plate side.

According to the electrostatic chuck, the stress that is applied to the layers contacting the surface of the heater element on the second support plate side can be reduced; and the peeling can be suppressed. Also, the surface of the heater element on the first support plate side can hold heat easily; the surface of the heater element on the second support plate side can cool heat easily; and the temperature responsiveness (the ramp rate) can be improved further.

A tenth invention is the electrostatic chuck of the first invention, wherein a side surface of the heater element has a curved configuration in the cross section.

According to the electrostatic chuck, the stress that is applied to the layers proximal to the side surface can be reduced; and the peeling of the layers proximal to the side surface can be suppressed.

An eleventh invention is the electrostatic chuck of the first invention, wherein a side surface of the heater element is rougher than at least one of a surface of the heater element on the first support plate side or a surface of the heater element on the second support plate side.

According to the electrostatic chuck, the adhesion at the side surface portion can be improved; and the peeling of the layers proximal to the heater element can be suppressed further.

A twelfth invention is the electrostatic chuck of the first invention, wherein the first support plate is electrically coupled to the second support plate.

According to the electrostatic chuck, the heater element can be shielded from the high frequency waves. Thereby, the heat generation of the heater element to an abnormal temperature can be suppressed. Also, the impedance of the heater plate can be suppressed.

A thirteenth invention is the electrostatic chuck of the twelfth invention, wherein a surface area of a region where the first support plate is coupled to the second support plate is narrower than a surface area of an upper surface of the first support plate and narrower than a surface area of a lower surface of the second support plate.

According to the electrostatic chuck, the heater element can be shielded from the high frequency waves. Thereby, the heat generation of the heater element to an abnormal temperature can be suppressed. Also, the impedance of the heater plate can be suppressed.

A fourteenth invention is the electrostatic chuck of the first invention, wherein the heater element includes a heater electrode having a band configuration; and the heater electrode is provided in a mutually-independent state in multiple regions.

According to the electrostatic chuck, the temperature in the surface of the processing object can be controlled independently for each region because the heater electrode is provided in a mutually-independent state in multiple regions. Thereby, a temperature difference can be set deliberately in the surface of the processing object.

A fifteenth invention is the electrostatic chuck of the first invention, wherein the heater element is multiply provided; and the multiple heater elements are provided in an independent state in mutually-different layers.

According to the electrostatic chuck, the temperature in the surface of the processing object can be controlled independently for each region because the heater element is provided in an independent state in mutually-different layers. Thereby, a temperature difference can be set deliberately in the surface of the processing object (temperature controllability).

A sixteenth invention is the electrostatic chuck of the first invention, further including a bypass layer that is electrically conductive and is provided between the heater element and the second support plate.

According to the electrostatic chuck, more degrees of freedom can be provided for the arrangement of the terminals supplying the electrical power to the heater element. By providing the bypass layer, compared to the case where the bypass layer is not provided, the terminals that have large thermal capacities may not be directly coupled to the heater element. Thereby, the uniformity of the temperature distribution in the surface of the processing object can be increased. Also, compared to the case where the bypass layer is not provided, the terminal may not be coupled to a thin heater element. Thereby, the reliability of the heater plate can be increased.

A seventeenth invention is the electrostatic chuck of the sixteenth invention, wherein a surface of the first support plate on the second support plate side includes a first portion and a second portion; the first portion overlaps the bypass layer when viewed along the stacking direction; the second portion does not overlap the bypass layer when viewed along the stacking direction; a surface of the second support plate on the first support plate side includes a third portion and a fourth portion; the third portion overlaps the bypass layer when viewed along the stacking direction; the fourth portion does not overlap the bypass layer when viewed along the stacking direction; and a distance along the stacking direction between the first portion and the second portion is shorter than a distance along the stacking direction between the third and the fourth portions.

According to the electrostatic chuck, the structural distortion of the first support plate positioned on the heater element side is smaller than the structural distortion of the second support plate positioned on the bypass layer side. By reducing the structural distortion of the heater element side where thermal distortion is generated easily, the load that is applied to the entire heater plate by the stress due to the thermal distortion can be suppressed.

An eighteenth invention is the electrostatic chuck of the sixteenth or seventeenth invention, wherein the heater element is electrically coupled to the bypass layer and electrically insulated from the first support plate and the second support plate.

According to the electrostatic chuck, electrical power can be supplied from the outside to the heater element via the bypass layer.

A nineteenth invention is the electrostatic chuck of the sixteenth invention, wherein a thickness of the bypass layer is thicker than a thickness of the first resin layer.

According to the electrostatic chuck, more degrees of freedom can be provided for the arrangement of the terminals supplying the electrical power to the heater element.

Also, the electrical resistance of the bypass layer can be suppressed; and the heat generation amount of the bypass layer can be suppressed.

A twentieth invention is the electrostatic chuck of the sixteenth invention, wherein a thickness of the bypass layer is thicker than a thickness of the heater element.

According to the electrostatic chuck, more degrees of freedom can be provided for the arrangement of the terminals supplying the electrical power to the heater element. Also, the electrical resistance of the bypass layer can be suppressed; and the heat generation amount of the bypass layer can be suppressed.

A twenty-first invention is the electrostatic chuck of the sixteenth invention, wherein the bypass layer is provided between the heater element and the base plate.

According to the electrostatic chuck, the bypass layer suppresses the transfer of the heat supplied from the heater element to the base plate. That is, the bypass layer has a thermal insulation effect for the base plate side when viewed from the bypass layer; and the uniformity of the temperature distribution in the surface of the processing object can be increased.

A twenty-second invention is the electrostatic chuck of the sixteenth invention, wherein the bypass layer is provided between the heater element and the ceramic dielectric substrate.

According to the electrostatic chuck, the unevenness of the temperature distribution generated by the pattern of the heater element can be relaxed by the bypass layer; and the uniformity of the temperature distribution can be increased.

A twenty-third invention is the electrostatic chuck of the sixteenth invention, wherein a size relationship of a width of a lower surface of the bypass layer with respect to a width of an upper surface of the bypass layer is the same as a size relationship of a width of a lower surface of the heater element with respect to a width of an upper surface of the heater element.

For each of the bypass layer and the heater element, the upper portion of the heater plate can be heated easily in the case where the upper surface is wider than the lower surface. Also, because the lower surface is relatively short, the lower portion of the heater plate can be cooled easily. Thereby, the temperature responsiveness (the ramp rate) can be improved. For each of the bypass layer and the heater element, the bias of the heat distribution in the vertical direction can be suppressed in the case where the lower surface is wider than the upper surface.

A twenty-fourth invention is the electrostatic chuck of the sixteenth invention, wherein a size relationship of a width of a lower surface of the bypass layer with respect to a width of an upper surface of the bypass layer is the reverse of a size relationship of a width of a lower surface of the heater element with respect to a width of an upper surface of the heater element.

According to the electrostatic chuck, the direction of the stress applied by the thermal expansion of the bypass layer can be the reverse orientation of the direction of the stress applied by the thermal expansion of the heater element. Thereby, the effects of the stress can be suppressed further.

A twenty-fifth invention is the electrostatic chuck of the first invention, wherein a surface area of an upper surface of the first support plate is greater than a surface area of a lower surface of the second support plate.

According to the electrostatic chuck, the terminals supplying the electrical power to the heater element can be connected more easily on the second support plate side when viewed from the heater element.

A twenty-sixth invention is the electrostatic chuck of the first invention, wherein the first support plate includes multiple supporters; and the multiple supporters are provided in a mutually-independent state.

According to the electrostatic chuck, a temperature difference can be provided deliberately in the diametrical direction in the surface of the first support plate (temperature controllability). For example, the temperature difference can be provided in a step configuration from the central portion to the outer perimeter portion in the surface of the first support plate. Thereby, the temperature difference can be provided deliberately in the surface of the processing object (temperature controllability).

A twenty-seventh invention is the electrostatic chuck of the first invention that further includes a power supply terminal that is provided from the heater plate toward the base plate and supplies electrical power to the heater plate.

According to the electrostatic chuck, because the power supply terminal is provided from the heater plate toward the base plate, the electrical power can be supplied to the power supply terminal via a member called a socket, etc., from the lower surface side of the base plate. Thereby, the wiring of the heater is realized while suppressing the exposure of the power supply terminal inside the chamber where the electrostatic chuck is mounted.

A twenty-eighth invention is the electrostatic chuck of the twenty-seventh invention, wherein the power supply terminal includes a pin portion, a conducting lead portion, a supporter, and a coupling portion; the pin portion is connected to a socket supplying electrical power from the outside; the conducting lead portion is finer than the pin portion; the supporter is connected to the conducting lead portion; and the coupling portion is connected to the supporter and coupled to the heater element.

According to the electrostatic chuck, the pin portion can supply a relatively large current to the heater element because the pin portion is wider than the conducting lead portion. Also, because the conducting lead portion is finer than the pin portion, the conducting lead portion deforms more easily than the pin portion; and the position of the pin portion can be shifted from the center of the coupling portion. Thereby, the power supply terminal can be fixed to a member (e.g., the base plate) that is different from the heater plate. For example, in the case where the supporter is coupled to the conducting lead portion and the coupling portion by welding, coupling utilizing a laser beam, soldering, brazing, etc., a wider contact surface area with the heater element can be ensured while relaxing the stress applied to the power supply terminal.

A twenty-ninth invention is the electrostatic chuck of the sixteenth invention that further includes a power supply terminal that is provided from the heater plate toward the base plate and supplies electrical power to the heater plate; the power supply terminal includes a pin portion, a conducting lead portion, a supporter, and a coupling portion; the pin portion is connected to a socket supplying electrical power from the outside; the conducting lead portion is finer than the pin portion; the supporter is connected to the conducting lead portion; the coupling portion is connected to the supporter and coupled to the bypass layer; and the electrical power is supplied to the heater element via the bypass layer.

According to the electrostatic chuck, the pin portion can supply a relatively large current to the heater element because the pin portion is wider than the conducting lead portion. Also, because the conducting lead portion is finer than the pin portion, the conducting lead portion deforms more easily than the pin portion; and the position of the pin portion can be shifted from the center of the coupling portion. Thereby, the power supply terminal can be fixed to a member (e.g., the base plate) that is different from the heater plate. For example, in the case where the supporter is coupled to the conducting lead portion and the coupling portion by welding, coupling utilizing a laser beam, soldering, brazing, etc., a wider contact surface area with the bypass layer can be ensured while relaxing the stress applied to the power supply terminal. Also, for example, in the case where the supporter is coupled to the conducting lead portion and the coupling portion by welding, coupling utilizing a laser beam, soldering, brazing, etc., the coupling portion that has substantially the same thickness as the heater plate and the bypass layer can be provided.

A thirtieth invention is the electrostatic chuck of the first invention that further includes a power supply terminal that is provided in the base plate and supplies electrical power to the heater plate; the power supply terminal includes a power supply portion and a terminal portion; the power supply portion is connected to a socket supplying electrical power from the outside; and the terminal portion is connected to the power supply portion and pressed onto the heater plate.

According to the electrostatic chuck, compared to the case where the power supply terminal is coupled by welding, etc., the diameters of the holes provided for supplying power can be reduced.

According to embodiments of the invention, an electrostatic chuck is provided that can withstand thermal/electrical/mechanical loads and has high reliability.

DETAILED DESCRIPTION

Figure 1:
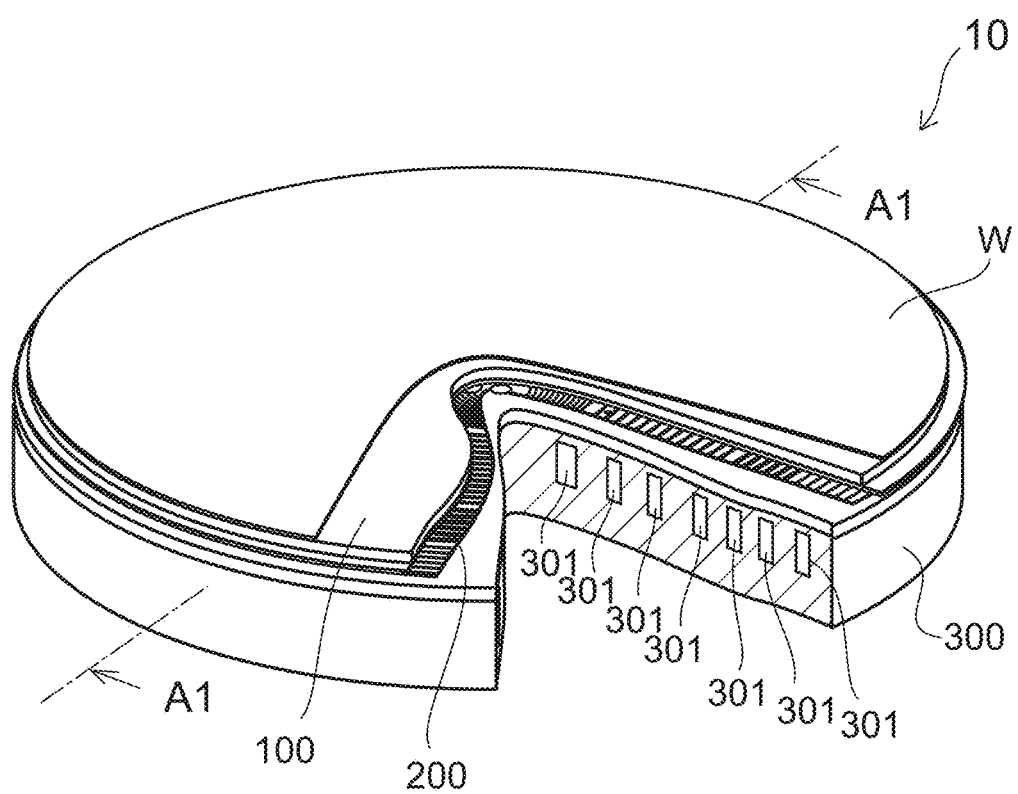
FIG. 1 is a schematic perspective view illustrating an electrostatic chuck according to an embodiment.
Figure 1:
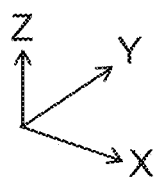

Embodiments of the invention will now be described with reference to the drawings. Similar components in the drawings are marked with the same reference numerals; and a detailed description is omitted as appropriate.

FIG. 1 is a schematic perspective view illustrating an electrostatic chuck according to the embodiment.

Figure 2A:
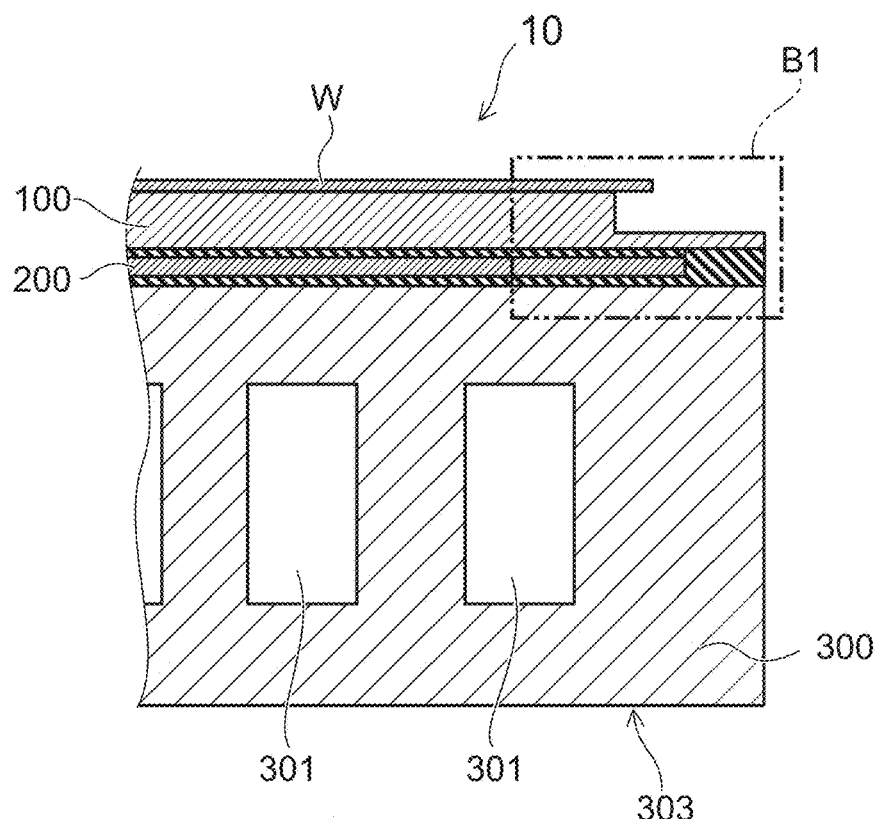
FIG. 2A and FIG. 2B are schematic cross-sectional views illustrating the electrostatic chuck according to the embodiment.
Figure 2B:
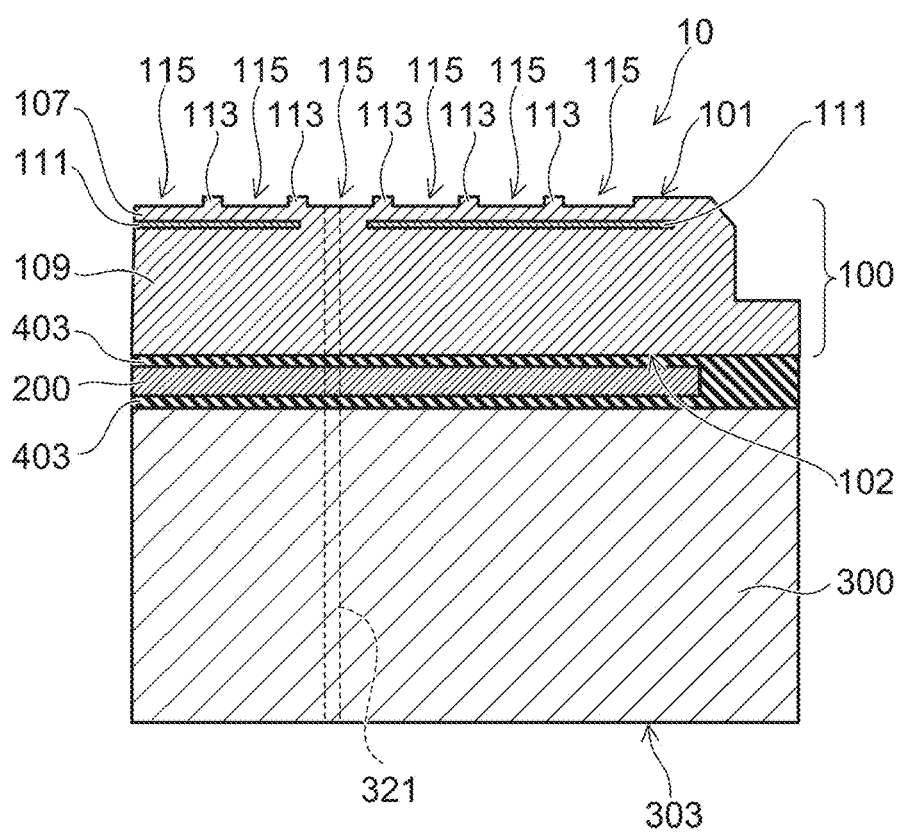

FIG. 2A and FIG. 2B are schematic cross-sectional views illustrating the electrostatic chuck according to the embodiment.

In FIG. 1, a cross-sectional view of a portion of the electrostatic chuck is illustrated for convenience of description. FIG. 2A is, for example, a schematic cross-sectional view of a cross section A1-A1 illustrated in FIG. 1. FIG. 2B is an enlarged schematic view of region B1 illustrated in FIG. 2A.

The electrostatic chuck 10 according to the embodiment includes a ceramic dielectric substrate 100, a heater plate 200, and a base plate 300.

The ceramic dielectric substrate 100 is provided at a position separated from the base plate 300. The heater plate 200 is provided between the base plate 300 and the ceramic dielectric substrate 100.

A bonding agent 403 is provided between the base plate 300 and the heater plate 200. The bonding agent 403 is provided between the heater plate 200 and the ceramic dielectric substrate 100. A heat-resistant resin such as silicone that has a relatively high thermal conductivity or the like is an example of the material of the bonding agent 403. The thickness of the bonding agent 403 is, for example, not less than about 0.1 millimeters (mm) and not more than about 1.0 mm. The thickness of the bonding agent 403 is the same as the distance between the base plate 300 and the heater plate 200 or the distance between the heater plate 200 and the ceramic dielectric substrate 100.

The ceramic dielectric substrate 100 is, for example, a base material having a flat plate configuration made of a polycrystalline ceramic sintered body, has a first major surface 101 where a processing object W such as a semiconductor wafer or the like is placed, and has a second major surface 102 on the side opposite to the first major surface 101.

Here, in the description of the embodiment, a direction (the stacking direction) that connects the first major surface 101 and the second major surface 102 is taken as a Z-direction; one direction orthogonal to the Z-direction is taken as an X-direction; and a direction that is orthogonal to the Z-direction and the X-direction is taken as a Y-direction.

For example, $Al_2O_3$, $Y_2O_3$, YAG, etc., are examples of the material of the crystal included in the ceramic dielectric substrate 100. By using such materials, the infrared transmissivity, the insulation stability, and the plasma resistance of the ceramic dielectric substrate 100 can be increased.

An electrode layer 111 is provided in the interior of the ceramic dielectric substrate 100. The electrode layer 111 is interposed between the first major surface 101 and the second major surface 102. In other words, the electrode layer 111 is formed to be inserted into the ceramic dielectric substrate 100. The electrode layer 111 is sintered as one body with the ceramic dielectric substrate 100.

The electrode layer 111 is not limited to being interposed between the first major surface 101 and the second major surface 102 and may be additionally provided at the second major surface 102.

By applying a chucking voltage to the electrode layer 111, the electrostatic chuck 10 generates a charge on the first major surface 101 side of the electrode layer 111 and attracts and holds the processing object W by an electrostatic force. The heater plate 200 generates heat by a heater current flowing; and the temperature of the processing object W can be higher compared to the case where the heater plate 200 does not generate heat.

The electrode layer 111 is provided along the first major surface 101 and the second major surface 102. The electrode layer 111 is a chucking electrode for attracting and holding the processing object W. The electrode layer 111 may be a unipole-type or a dipole-type. The electrode layer 111 also may be a tripole-type or another multi-pole type. The number of the electrode layers 111 and the arrangement of the electrode layers 111 are appropriately selected.

The ceramic dielectric substrate 100 includes a first dielectric layer 107 between the electrode layer 111 and the first major surface 101, and a second dielectric layer 109 between the electrode layer 111 and the second major surface 102. It is favorable for the infrared spectral transmittance of at least the first dielectric layer 107 of the ceramic dielectric substrate 100 to be 20% or more. In the embodiment, the infrared spectral transmittance is a value converted to a thickness of 1 mm.

The infrared rays that are emitted from the heater plate 200 in the state in which the processing object W is placed on the first major surface 101 can efficiently pass through the ceramic dielectric substrate 100 by setting the infrared spectral transmittance of at least the first dielectric layer 107 of the ceramic dielectric substrate 100 to be 20% or more. Accordingly, the heat is not stored easily in the processing object W; and the controllability of the temperature of the processing object W increases.

For example, in the case where the electrostatic chuck 10 is used inside a chamber in which plasma processing is performed, the temperature of the processing object W increases more easily as the plasma power increases. In the electrostatic chuck 10 of the embodiment, the heat that is transferred to the processing object W by the plasma power is transferred efficiently to the ceramic dielectric substrate 100. Further, the heat that is transferred to the ceramic dielectric substrate 100 by the heater plate 200 is transferred efficiently to the processing object W. Accordingly, the processing object W is maintained more easily at the desired temperature by efficiently transferring heat.

In the electrostatic chuck 10 according to the embodiment, it is desirable for the infrared spectral transmittance of the second dielectric layer 109, in addition to the first dielectric layer 107, to be 20% or more. By setting the infrared spectral transmittances of the first dielectric layer 107 and the second dielectric layer 109 to be 20% or more, the infrared rays that are emitted from the heater plate 200 pass through the ceramic dielectric substrate 100 more efficiently; and the temperature controllability of the processing object W can be increased.

The base plate 300 is provided on the second major surface 102 side of the ceramic dielectric substrate 100 and supports the ceramic dielectric substrate 100 via the heater plate 200. A passageway 301 is provided in the base plate 300. Namely, the passageway 301 is provided in the interior of the base plate 300. For example, aluminum is an example of the material of the base plate 300.

The base plate 300 performs the role of the temperature adjustment of the ceramic dielectric substrate 100. For example, in the case where the ceramic dielectric substrate 100 is cooled, a cooling medium is caused to flow into the passageway 301 and pass through the passageway 301; and the cooling medium is caused to flow out from the passageway 301. Thereby, the heat of the base plate 300 is absorbed by the cooling medium; and the ceramic dielectric substrate 100 that is mounted on the base plate 300 can be cooled.

On the other hand, in the case where the ceramic dielectric substrate 100 is heated, it is also possible to provide a heating medium into the passageway 301. Or, it is also possible for a not-illustrated heater to be built into the base plate 300. Thus, when the temperature of the ceramic dielectric substrate 100 is adjusted by the base plate 300, the temperature of the processing object W held by the electrostatic chuck 10 can be adjusted easily.

Also, protrusions 113 are provided as necessary on the first major surface 101 side of the ceramic dielectric substrate 100. Grooves 115 are provided between mutually-adjacent protrusions 113. The grooves 115 communicate with each other. A space is formed between the grooves 115 and the back surface of the processing object W placed on the electrostatic chuck 10.

An introduction path 321 that pierces the base plate 300 and the ceramic dielectric substrate 100 is connected to the grooves 115. If a transfer gas such as helium (He) or the like is introduced from the introduction path 321 in the state in which the processing object W is held, the transfer gas flows in the space provided between the processing object W and the grooves 115; and the processing object W can be directly heated or cooled by the transfer gas.

Figure 3:
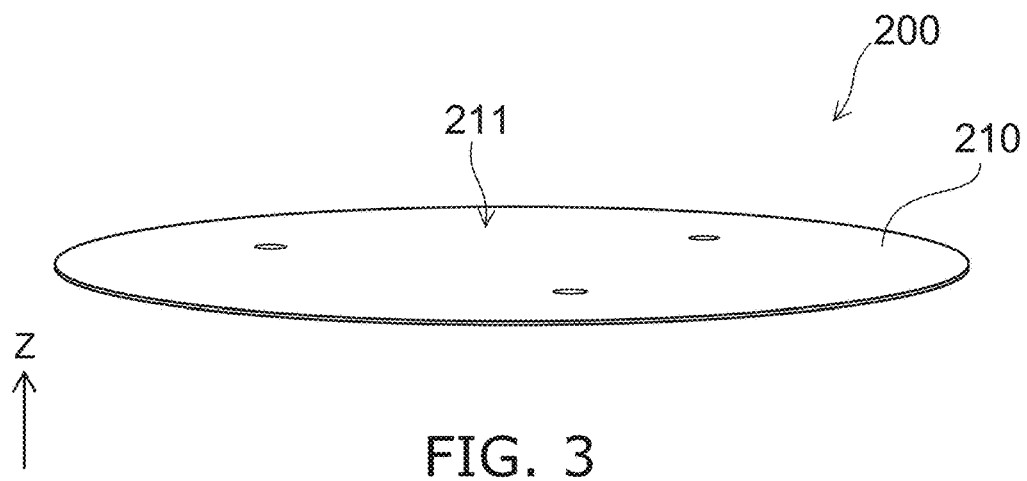
FIG. 3 is a schematic perspective view illustrating the heater plate of the embodiment.

FIG. 3 is a schematic perspective view illustrating the heater plate of the embodiment.

Figure 4A:
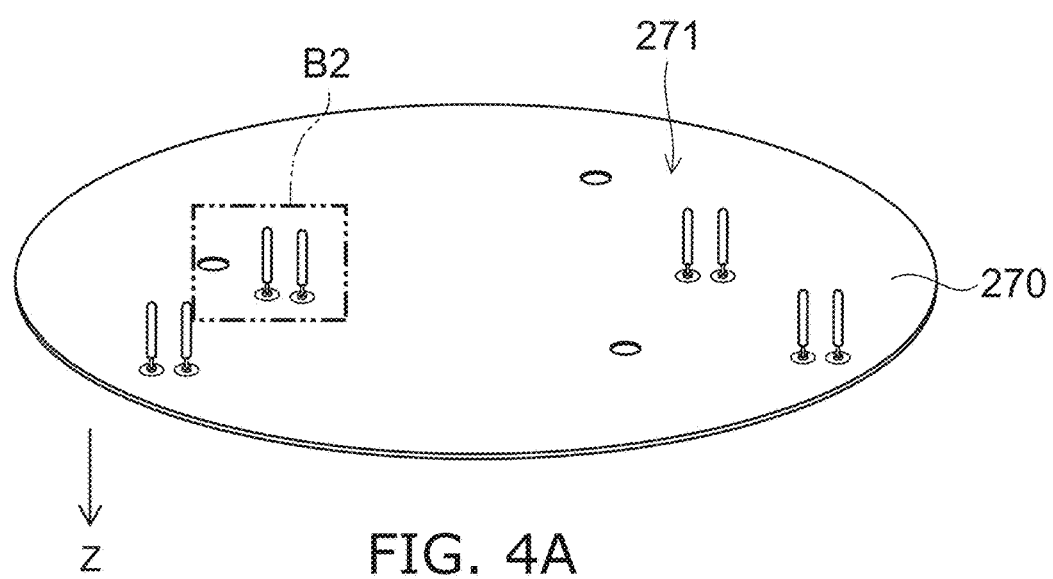
FIG. 4A and FIG. 4B are schematic perspective views illustrating the heater plate of the embodiment.
Figure 4B:
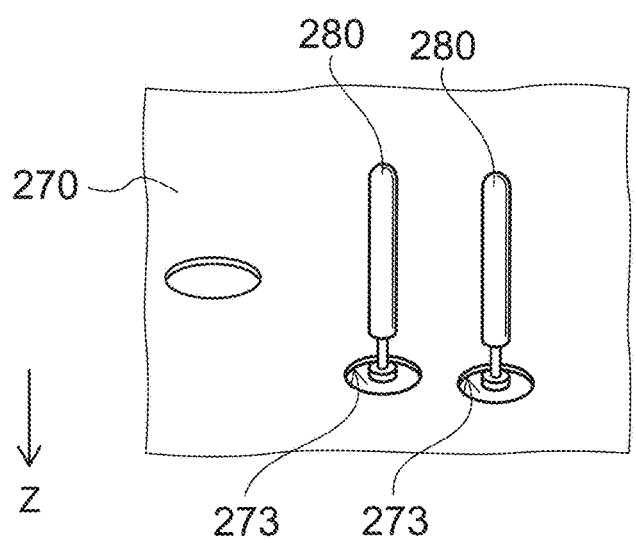

FIG. 4A and FIG. 4B are schematic perspective views illustrating the heater plate of the embodiment.

Figure 5:
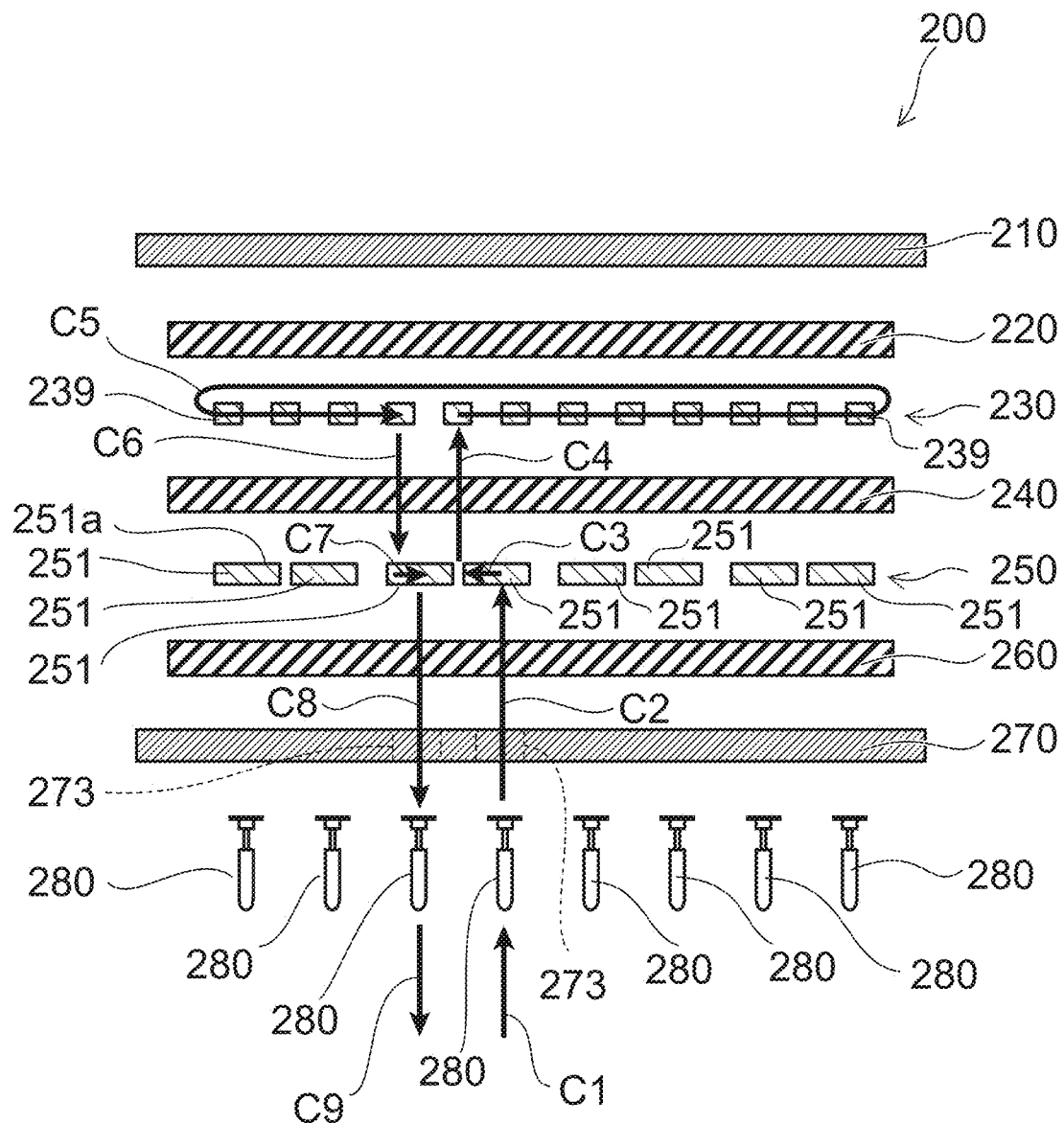
FIG. 5 is a schematic exploded view illustrating the heater plate of the embodiment.

FIG. 5 is a schematic exploded view illustrating the heater plate of the embodiment.

Figure 6:
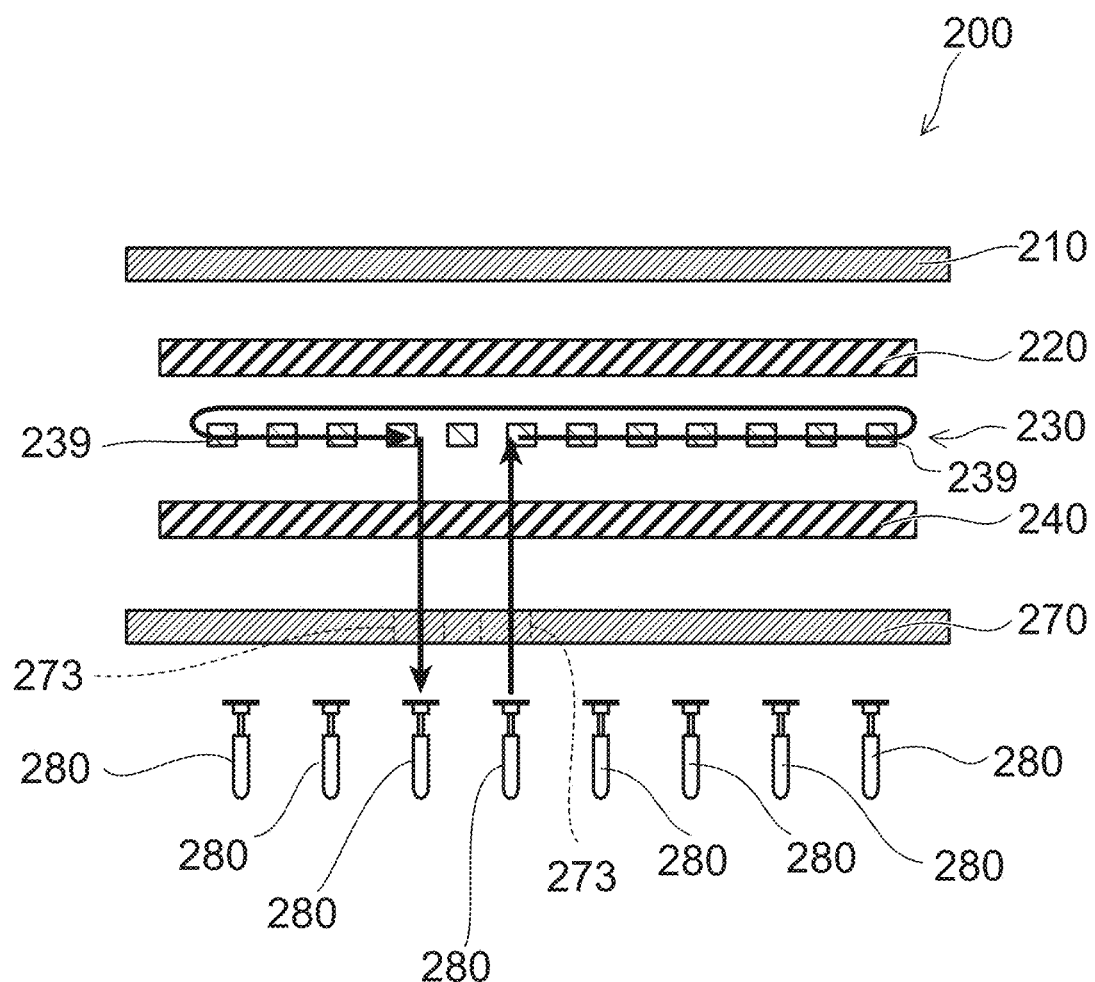
FIG. 6 is a schematic exploded view illustrating a modification of the heater plate of the embodiment.

FIG. 6 is a schematic exploded view illustrating a modification of the heater plate of the embodiment.

FIG. 3 is a schematic perspective view of the heater plate of the embodiment viewed from the upper surface (the surface on the ceramic dielectric substrate 100 side). FIG. 4A is a schematic perspective view of the heater plate of the embodiment viewed from the lower surface (the surface on the base plate 300 side). FIG. 4B is an enlarged schematic view of region B2 illustrated in FIG. 4A.

As illustrated in FIG. 5, the heater plate 200 of the embodiment includes a first support plate 210, a first resin layer 220, a heater element (a heating layer) 230, a second resin layer 240, a bypass layer 250, a third resin layer 260, a second support plate 270, and a power supply terminal 280. As illustrated in FIG. 3, a surface 211 (the upper surface) of the first support plate 210 forms the upper surface of the heater plate 200. As illustrated in FIG. 4, a surface 271 (the lower surface) of the second support plate 270 forms the lower surface of the heater plate 200. The first support plate 210 and the second support plate 270 are support plates that support the heater element 230, etc. In the example, the first support plate 210 and the second support plate 270 clamp and support the first resin layer 220, the heater element 230, the second resin layer 240, the bypass layer 250, and the third resin layer 260.

The first resin layer 220 is provided between the first support plate 210 and the second support plate 270. The heater element 230 is provided between the first resin layer 220 and the second support plate 270. Thus, the heater element 230 is provided to overlap the first support plate 210. In other words, the first resin layer 220 is provided between the first support plate 210 and the heater element 230.

The second resin layer 240 is provided between the heater element 230 and the second support plate 270. The bypass layer 250 is provided between the second resin layer 240 and the second support plate 270. The third resin layer 260 is provided between the bypass layer 250 and the second support plate 270. In other words, the heater element 230 is provided between the first resin layer 220 and the second resin layer 240. In other words, the bypass layer 250 is provided between the second resin layer 240 and the third resin layer 260. For example, the heater element 230 contacts the first resin layer 220 and the second resin layer 240. For example, the bypass layer 250 contacts the second resin layer 240 and the third resin layer 260.

As illustrated in FIG. 6, the bypass layer 250 and the third resin layer 260 may not always be provided. In the case where the bypass layer 250 and the third resin layer 260 are not provided, the second resin layer 240 is provided between the heater element 230 and the second support plate 270. In the description hereinbelow, the case where the heater plate 200 includes the bypass layer 250 and the third resin layer 260 is used as an example.

The first support plate 210 has a relatively high thermal conductivity. For example, a metal that includes at least one of aluminum, copper, or nickel, graphite that has a multi-layered structure, etc., are examples of the material of the first support plate 210. The thickness (the length in the Z-direction) of the first support plate 210 is, for example, not less than about 0.1 mm and not more than about 3.0 mm. More favorably, the thickness of the first support plate 210 is, for example, not less than 0.3 mm and not more than about 1.0 mm. The first support plate 210 increases the uniformity of the temperature distribution in the surface of the heater plate 200. The first support plate 210 suppresses the warp of the heater plate 200. The first support plate 210 increases the strength of the bond between the heater plate 200 and the ceramic dielectric substrate 100.

An RF (Radio Frequency) voltage (high frequency voltage) is applied in the processing processes of the processing object W. When the high frequency voltage is applied, the heater element 230 may generate heat due to the effects of the high frequency waves. The temperature controllability of the heater element 230 degrades.

Conversely, in the embodiment, the first support plate 210 shields the heater element 230 and the bypass layer 250 from the high frequency waves. Thereby, the first support plate 210 can suppress the heat generation of the heater element 230 to an abnormal temperature.

The material, thickness, and function of the second support plate 270 are respectively the same as the material, thickness, and function of the first support plate 210. The first support plate 210 is electrically coupled to the second support plate 270. Here, in this specification, contact is within the scope of "coupled." Details of the electrical coupling between the second support plate 270 and the first support plate 210 are described below.

Thus, the first support plate 210 and the second support plate 270 have relatively high thermal conductivities. Thereby, the first support plate 210 and the second support plate 270 improve the thermal diffusion of the heat supplied from the heater element 230. Also, by providing the first support plate 210 and the second support plate 270 with moderate thicknesses and rigidities, for example, the warp of the heater plate 200 is suppressed. Further, for example, the first support plate 210 and the second support plate 270 improve the shielding performance for the RF voltage applied to the electrodes of the wafer processing apparatus, etc. For example, the effects of the RF voltage on the heater element 230 are suppressed. Thus, the first support plate 210 and the second support plate 270 have the function of thermal diffusion, the function of warp suppression, and the function of shielding from the RF voltage.

For example, polyimide, polyamide-imide, etc., are examples of the material of the first resin layer 220. The thickness (the length in the Z-direction) of the first resin layer 220 is, for example, not less than about 0.01 mm and not more than about 0.20 mm. The first resin layer 220 couples the first support plate 210 and the heater element 230 to each other. The first resin layer 220 electrically insulates between the first support plate 210 and the heater element 230. Thus, the first resin layer 220 has the function of electric insulation and the function of surface coupling.

The material and thickness of the second resin layer 240 are respectively about the same as the material and thickness of the first resin layer 220. The material and thickness of the third resin layer 260 are respectively about the same as the material and thickness of the first resin layer 220.

The second resin layer 240 couples the heater element 230 and the bypass layer 250 to each other. The second resin layer 240 electrically insulates between the heater element 230 and the bypass layer 250. Thus, the second resin layer 240 has the function of electric insulation and the function of surface coupling.

The third resin layer 260 couples the bypass layer 250 and the second support plate 270 to each other. The third resin layer 260 electrically insulates between the bypass layer 250 and the second support plate 270. Thus, the third resin layer 260 has the function of electric insulation and the function of surface coupling.

For example, a metal that includes at least one of stainless steel, titanium, chrome, nickel, copper, or aluminum or the like is an example of the material of the heater element 230. The thickness (the length in the Z-direction) of the heater element 230 is, for example, not less than about 0.01 mm and not more than about 0.20 mm. The heater element 230 is electrically coupled to the bypass layer 250. On the other hand, the heater element 230 is electrically insulated from the first support plate 210 and the second support plate 270. Details of the electrical coupling between the heater element 230 and the bypass layer 250 are described below.

The heater element 230 generates heat when a current flows, and controls the temperature of the processing object W. For example, the heater element 230 heats the processing object W to a prescribed temperature. For example, the heater element 230 causes the temperature distribution in the surface of the processing object W to be uniform. For example, the heater element 230 deliberately provides a temperature difference in the surface of the processing object W.

The bypass layer 250 is disposed to be substantially parallel to the first support plate 210 and disposed to be substantially parallel to the second support plate 270. The bypass layer 250 includes multiple bypass portions 251. The bypass layer 250 includes, for example, eight bypass portions 251. The number of the bypass portions 251 is not limited to eight. The bypass layer 250 has a plate configuration.

Conversely, the heater element 230 includes a heater electrode 239 having a band configuration. When viewed perpendicularly to the surface of the bypass layer 250 (surfaces 251a of the bypass portions 251), the surface area of the bypass layer 250 is greater than the surface area of the heater element 230 (the surface area of the heater electrode 239). The details are described below.

The bypass layer 250 is electrically conductive. The bypass layer 250 is electrically insulated from the first support plate 210 and the second support plate 270. For example, a metal that includes stainless steel or the like is an example of the material of the bypass layer 250. The thickness (the length in the Z-direction) of the bypass layer 250 is, for example, not less than about 0.03 mm and not more than about 0.30 mm. The thickness of the bypass layer 250 is thicker than the thickness of the first resin layer 220. The thickness of the bypass layer 250 is thicker than the thickness of the second resin layer 240. The thickness of the bypass layer 250 is thicker than the thickness of the third resin layer 260.

For example, the material of the bypass layer 250 is the same as the material of the heater element 230. On the other hand, the thickness of the bypass layer 250 is thicker than the thickness of the heater element 230. Therefore, the electrical resistance of the bypass layer 250 is lower than the electrical resistance of the heater element 230. Thereby, even in the case where the material of the bypass layer 250 is the same as the material of the heater element 230, heat generation by the bypass layer 250 that is similar to that of the heater element 230 can be suppressed. That is, the electrical resistance of the bypass layer 250 can be suppressed; and the heat generation amount of the bypass layer 250 can be suppressed. The method for suppressing the electrical resistance of the bypass layer 250 and suppressing the heat generation amount of the bypass layer 250 may be realized not by setting the thickness of the bypass layer 250 but by using a material having a relatively low volume resistivity. In other words, the material of the bypass layer 250 may be different from the material of the heater element 230. For example, a metal that includes at least one of stainless steel, titanium, chrome, nickel, copper, or aluminum or the like is an example of the material of the bypass layer 250.

The power supply terminal 280 is electrically coupled to the bypass layer 250. The power supply terminal 280 is provided from the heater plate 200 toward the base plate 300 in the state in which the heater plate 200 is provided between the base plate 300 and the ceramic dielectric substrate 100. The power supply terminal 280 supplies, via the bypass layer 250 to the heater element 230, electrical power supplied from outside the electrostatic chuck 10. For example, the power supply terminal 280 may be connected directly to the heater element 230. Thereby, the bypass layer 250 is omissible.

The heater plate 200 includes the multiple power supply terminals 280. The heater plate 200 illustrated in FIG. 3 to FIG. 5 includes eight power supply terminals 280. The number of the power supply terminals 280 is not limited to eight. One power supply terminal 280 is electrically coupled to one bypass portion 251. Holes 273 pierce the second support plate 270. The power supply terminals 280 are electrically coupled to the bypass portions 251 by passing through the holes 273.

As illustrated by arrow C1 and arrow C2 illustrated in FIG. 5, when the electrical power is supplied to the power supply terminals 280 from outside the electrostatic chuck 10, the current flows from the power supply terminals 280 toward the bypass layer 250. As illustrated by arrow C3 and arrow C4 illustrated in FIG. 5, the current that flows toward the bypass layer 250 flows from the bypass layer 250 toward the heater element 230. As illustrated by arrow C5 and arrow C6 illustrated in FIG. 5, the current that flows toward the heater element 230 flows through a prescribed zone (region) of the heater element 230 and flows from the heater element 230 toward the bypass layer 250. The details of the zone of the heater element 230 are described below. As illustrated by arrow C7 and arrow C8 illustrated in FIG. 5, the current that flows toward the bypass layer 250 flows from the bypass layer 250 toward the power supply terminals 280. As illustrated by arrow C9 illustrated in FIG. 5, the current that flows toward the power supply terminals 280 flows outside the electrostatic chuck 10.

Thus, in the coupling portions between the heater element 230 and the bypass layer 250, a portion where the current enters the heater element 230 exists; and a portion where the current exits from the heater element 230 exists. That is, a pair of coupling portions between the heater element 230 and the bypass layer 250 exists. Because the heater plate 200 illustrated in FIG. 3 to FIG. 5 includes eight power supply terminals 280, four pairs of coupling portions exist between the heater element 230 and the bypass layer 250.

According to the embodiment, the heater element 230 is provided between the first support plate 210 and the second support plate 270. Thereby, the uniformity of the temperature distribution in the surface of the heater plate 200 can be increased; and the uniformity of the temperature distribution in the surface of the processing object W can be increased.

Also, the first support plate 210 and the second support plate 270 shield the heater element 230 and the bypass layer 250 from the high frequency waves; and the heat generation of the heater element 230 to an abnormal temperature can be suppressed.

As described above, the bypass layer 250 is provided between the heater element 230 and the second support plate 270. That is, the bypass layer 250 is provided between the heater element 230 and the base plate 300. The thermal conductivity of stainless steel is lower than the thermal conductivity of aluminum and the thermal conductivity of copper. Therefore, the bypass layer 250 suppresses the transfer into the second support plate 270 of the heat supplied from the heater element 230. That is, the bypass layer 250 has a thermal insulation effect for the second support plate 270 side when viewed from the bypass layer 250; and the uniformity of the temperature distribution in the surface of the processing object W can be increased.

The bypass layer 250 can provide more degrees of freedom for the arrangement of the power supply terminals 280. By providing the bypass layer 250, compared to the case where the bypass layer 250 is not provided, the power supply terminals that have large thermal capacities may not be directly coupled to the heater element 230. Thereby, the uniformity of the temperature distribution in the surface of the processing object W can be increased. Also, compared to the case where the bypass layer 250 is not provided, the power supply terminals 280 may not be coupled to the thin heater element 230. Thereby, the reliability of the heater plate 200 can be increased.

As described above, the power supply terminal 280 is provided from the heater plate 200 toward the base plate 300. Therefore, the electrical power can be supplied to the power supply terminal 280 via a member called a socket, etc., from a lower surface 303 (referring to FIG. 2A and FIG. 2B) side of the base plate 300. Thereby, the wiring of the heater is realized while suppressing the exposure of the power supply terminal 280 inside the chamber in which the electrostatic chuck 10 is mounted.

A method for manufacturing the heater plate 200 of the embodiment will now be described with reference to the drawings.

Figure 7A:
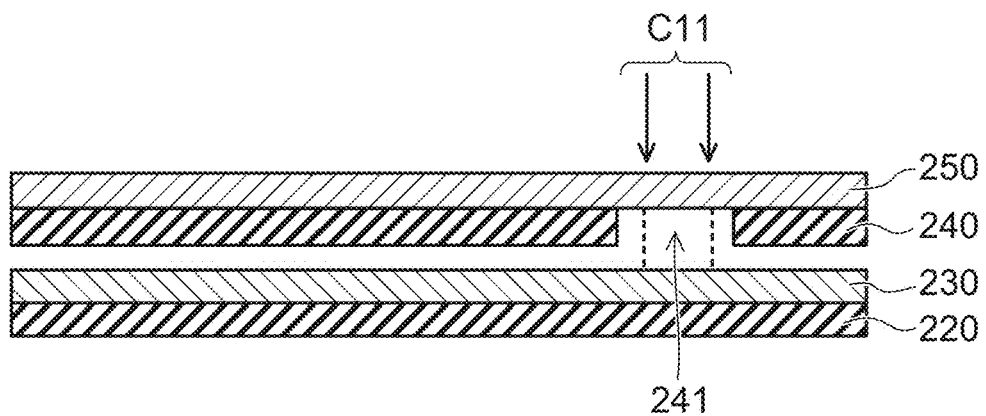
FIG. 7A and FIG. 7B are schematic cross-sectional views illustrating an example of the manufacturing method of the embodiment.
Figure 7B:
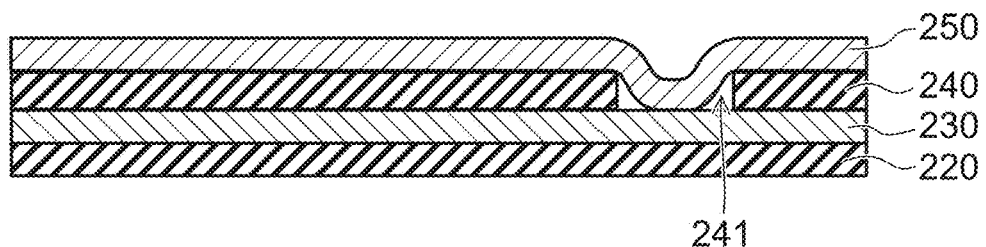

FIG. 7A and FIG. 7B are schematic cross-sectional views illustrating an example of the manufacturing method of the embodiment.

Figure 8:
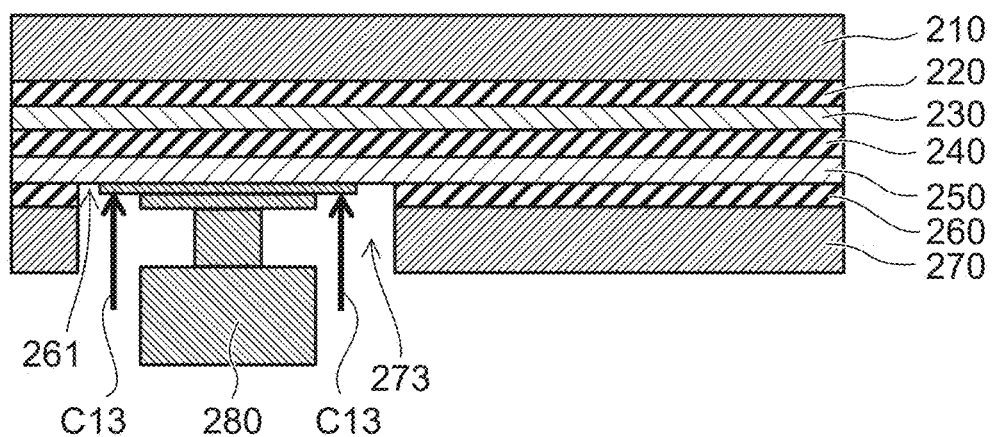
FIG. 8 is a schematic cross-sectional view illustrating another example of the manufacturing method of the embodiment.

FIG. 8 is a schematic cross-sectional view illustrating another example of the manufacturing method of the embodiment.

FIG. 7A is a schematic cross-sectional view illustrating the state before coupling the bypass layer and the heater element. FIG. 7B is a schematic cross-sectional view illustrating the state after coupling the bypass layer and the heater element. FIG. 8 is a schematic cross-sectional view illustrating an example of the coupling process between the bypass layer and the power supply terminal.

In the method for manufacturing the electrostatic chuck 10 according to the embodiment, for example, first, the first support plate 210 and the second support plate 270 are manufactured by machining aluminum. Inspections of the first support plate 210 and the second support plate 270 are performed using, for example, a three-dimensional measuring instrument, etc.

Then, the first resin layer 220, the second resin layer 240, and the third resin layer 260 are manufactured by, for example, cutting a polyimide film using lasering, machining, punching, melting, etc. Inspections of the first resin layer 220, the second resin layer 240, and the third resin layer 260 are performed using, for example, the naked eye, etc.

Then, a heater pattern is formed by cutting stainless steel using etching utilizing photolithography technology and/or printing technology, machining, punching, etc. Thereby, the heater element 230 is manufactured. Also, the measuring of the resistance value of the heater element 230 and the like are performed.

Continuing as illustrated in FIG. 7A and FIG. 7B, the coupling between the heater element 230 and the bypass layer 250 is performed. The coupling between the heater element 230 and the bypass layer 250 is performed by soldering, brazing, welding, contacting, etc. As illustrated in FIG. 7A, a hole 241 is provided in the second resin layer 240. The hole 241 pierces the second resin layer 240. For example, as illustrated by arrow C11 illustrated in FIG. 7A, the heater element 230 and the bypass layer 250 are coupled by spot welding from the bypass layer 250 side.

The coupling between the heater element 230 and the bypass layer 250 is not limited to welding. For example, the coupling between the heater element 230 and the bypass layer 250 may be performed by coupling utilizing a laser beam, soldering, brazing, contacting, etc.

Continuing, the members of the heater plate 200 are stacked and pressed using a hot pressing machine.

Continuing as illustrated in FIG. 8, the coupling between the power supply terminal 280 and the bypass layer 250 is performed. The coupling between the power supply terminal 280 and the bypass layer 250 is performed by welding, lasering, soldering, brazing, etc. As illustrated in FIG. 8, the hole 273 is provided in the second support plate 270. The hole 273 pierces the second support plate 270. This is as described above in reference to FIG. 4B. A hole 261 is provided in the third resin layer 260. The hole 261 pierces the third resin layer 260. As illustrated by arrow C13 illustrated in FIG. 8, the power supply terminal 280 and the bypass layer 250 are coupled by performing welding, lasering, soldering, brazing, etc., from the second support plate 270 toward the first support plate 210.

Thus, the heater plate 200 of the embodiment is manufactured.

Inspections of the heater plate 200 and the like are performed as appropriate after the manufacturing.

Figure 9:
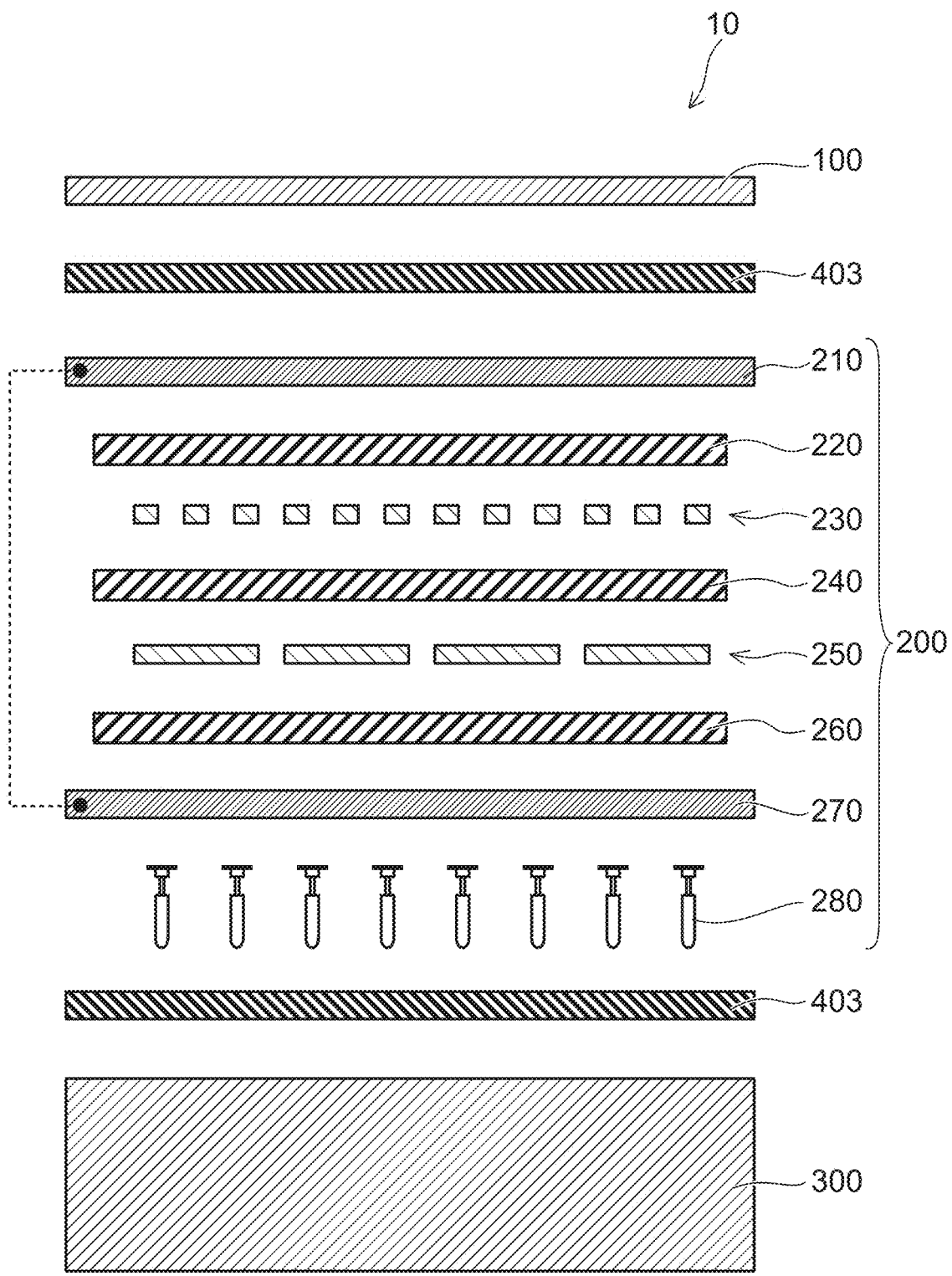
FIG. 9 is a schematic exploded view illustrating the electrostatic chuck according to the embodiment.

FIG. 9 is a schematic exploded view illustrating the electrostatic chuck according to the embodiment.

Figure 10A:
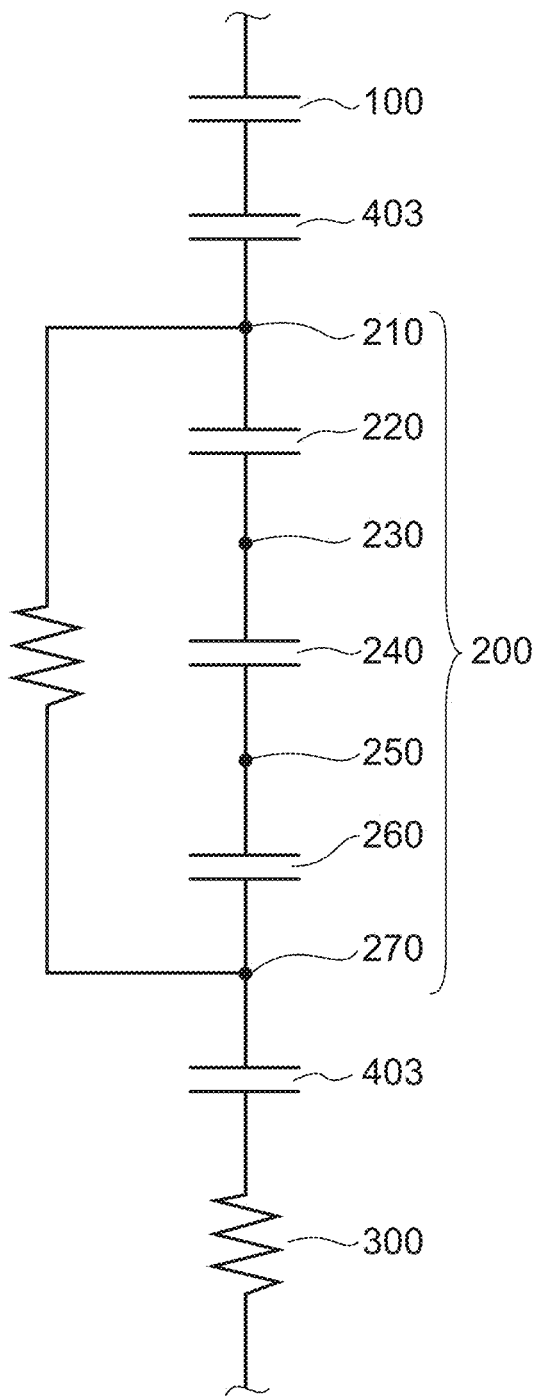
FIG. 10A and FIG. 10B are electrical circuit diagrams illustrating the electrostatic chuck according to the embodiment.
Figure 10B:
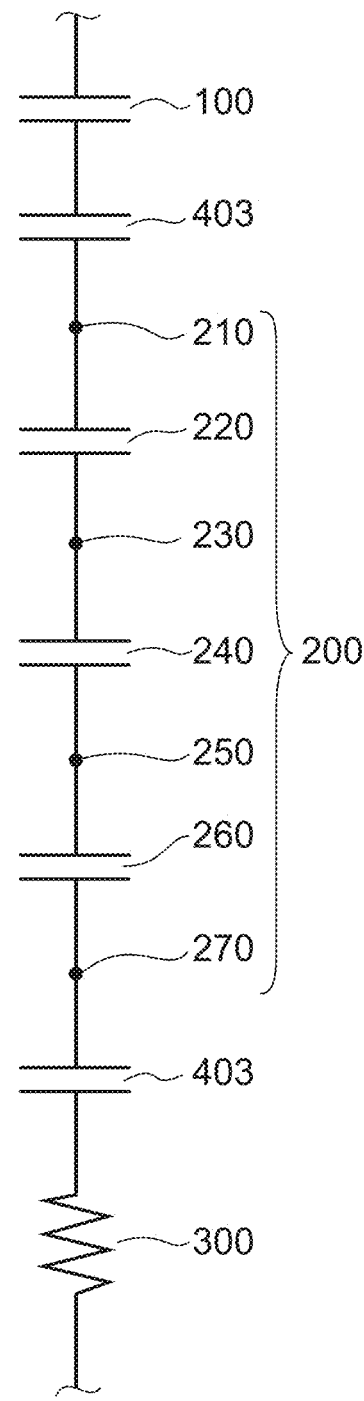

FIG. 10A and FIG. 10B are electrical circuit diagrams illustrating the electrostatic chuck according to the embodiment.

FIG. 10A is an electrical circuit diagram illustrating an example in which the first support plate and the second support plate are electrically coupled. FIG. 10B is an electrical circuit diagram illustrating an example in which the first support plate and the second support plate are not electrically coupled.

As illustrated in FIG. 9 and FIG. 10A, the first support plate 210 is electrically coupled to the second support plate 270. The coupling between the first support plate 210 and the second support plate 270 is performed by, for example, welding, coupling utilizing a laser beam, soldering, contacting, etc.

For example, as illustrated in FIG. 10B, if the first support plate 210 is not electrically coupled reliably to the second support plate 270, the first support plate 210 may be electrically coupled to the second support plate 270 and then not electrically coupled to the second support plate 270. Then, fluctuation of the etching rate may occur when the plasma is generated. Also, even if the first support plate 210 is not electrically coupled to the second support plate 270, when the plasma is generated, a current may flow in the heater element 230; and the heater element 230 may generate heat. In other words, if the first support plate 210 is not electrically coupled reliably to the second support plate 270, the heater element 230 may generate heat due to a current other than the heater current.

Conversely, in the electrostatic chuck 10 according to the embodiment as illustrated in FIG. 10A, the first support plate 210 is electrically coupled to the second support plate 270. Thereby, the occurrence of the fluctuation of the etching rate when the plasma is generated due to the current flowing from the first support plate 210 toward the second support plate 270 or the current flowing from the second support plate 270 toward the first support plate 210 can be suppressed. Also, the heat generation of the heater element 230 due to the current other than the heater current can be suppressed.

Further, the heater element 230 and the bypass layer 250 can be shielded from the high frequency waves. Thereby, the heat generation of the heater element 230 to an abnormal temperature can be suppressed. Also, the impedance of the heater plate 200 can be suppressed.

Specific examples of the heater plate 200 of the embodiment will now be described with reference to the drawings.

Figure 11A:
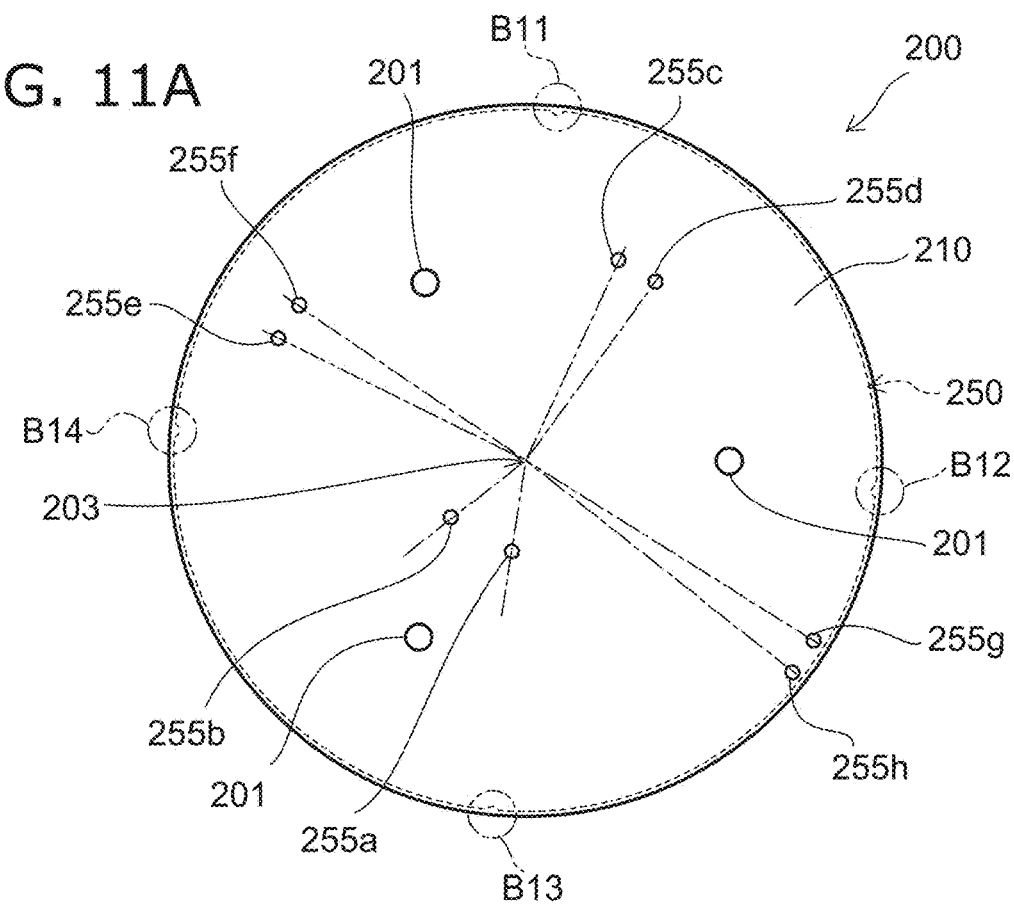
FIG. 11A and FIG. 11B are schematic plan views illustrating a specific example of the heater plate of the embodiment.
Figure 11B:
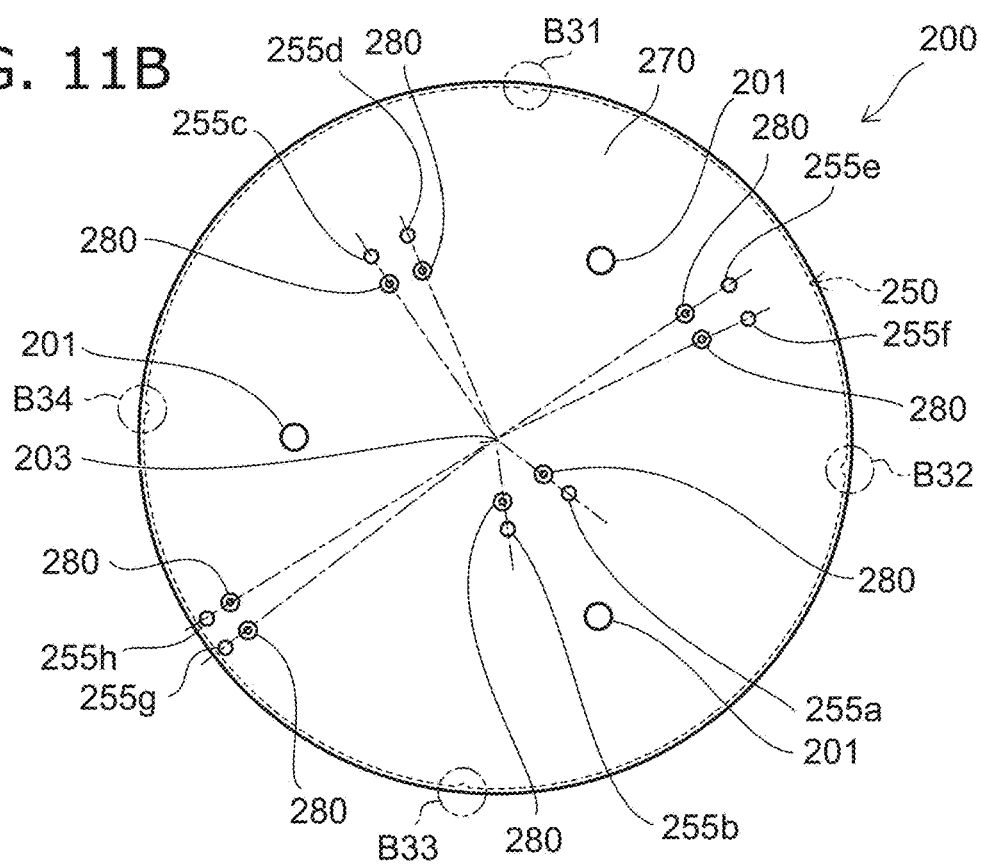

FIG. 11A and FIG. 11B are schematic plan views illustrating a specific example of the heater plate of the embodiment.

Figure 12A:
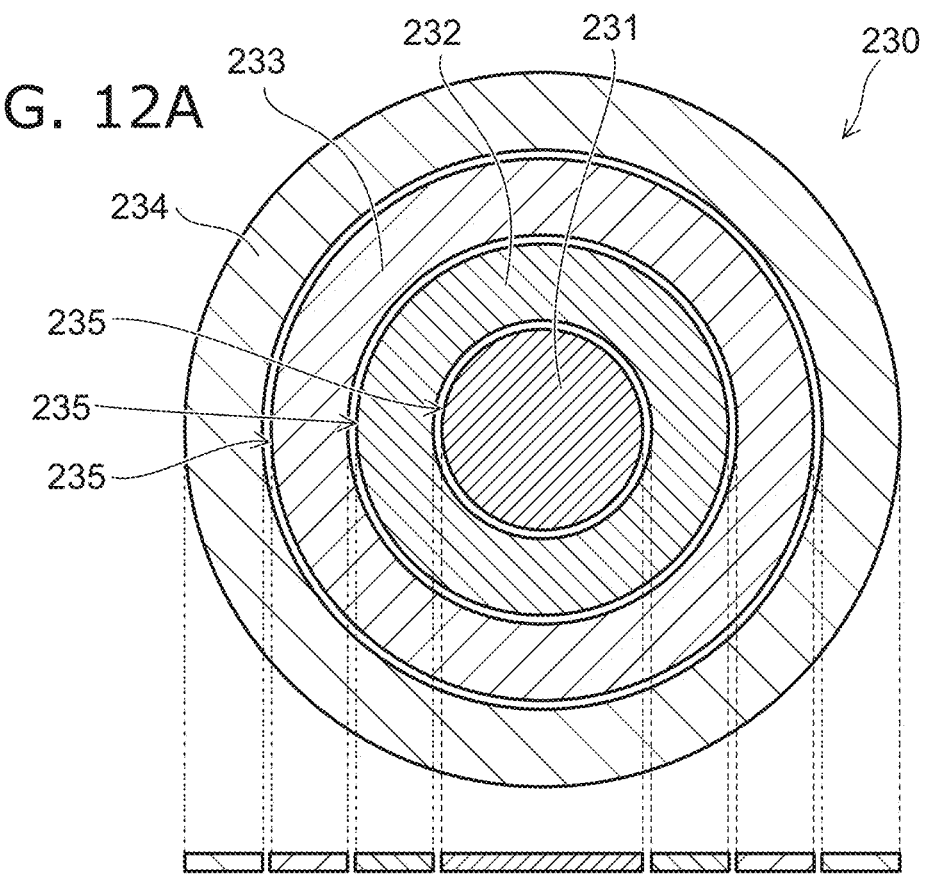
FIG. 12A and FIG. 12B are schematic plan views illustrating the heater element of this specific example.
Figure 12B:
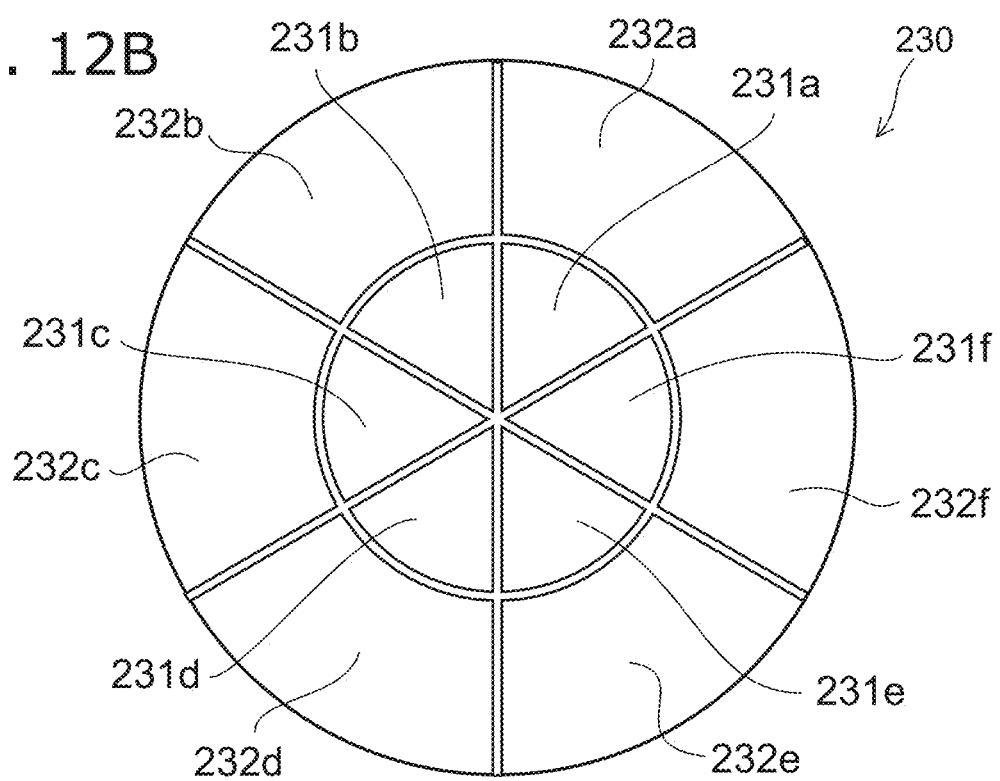
Figure 13:
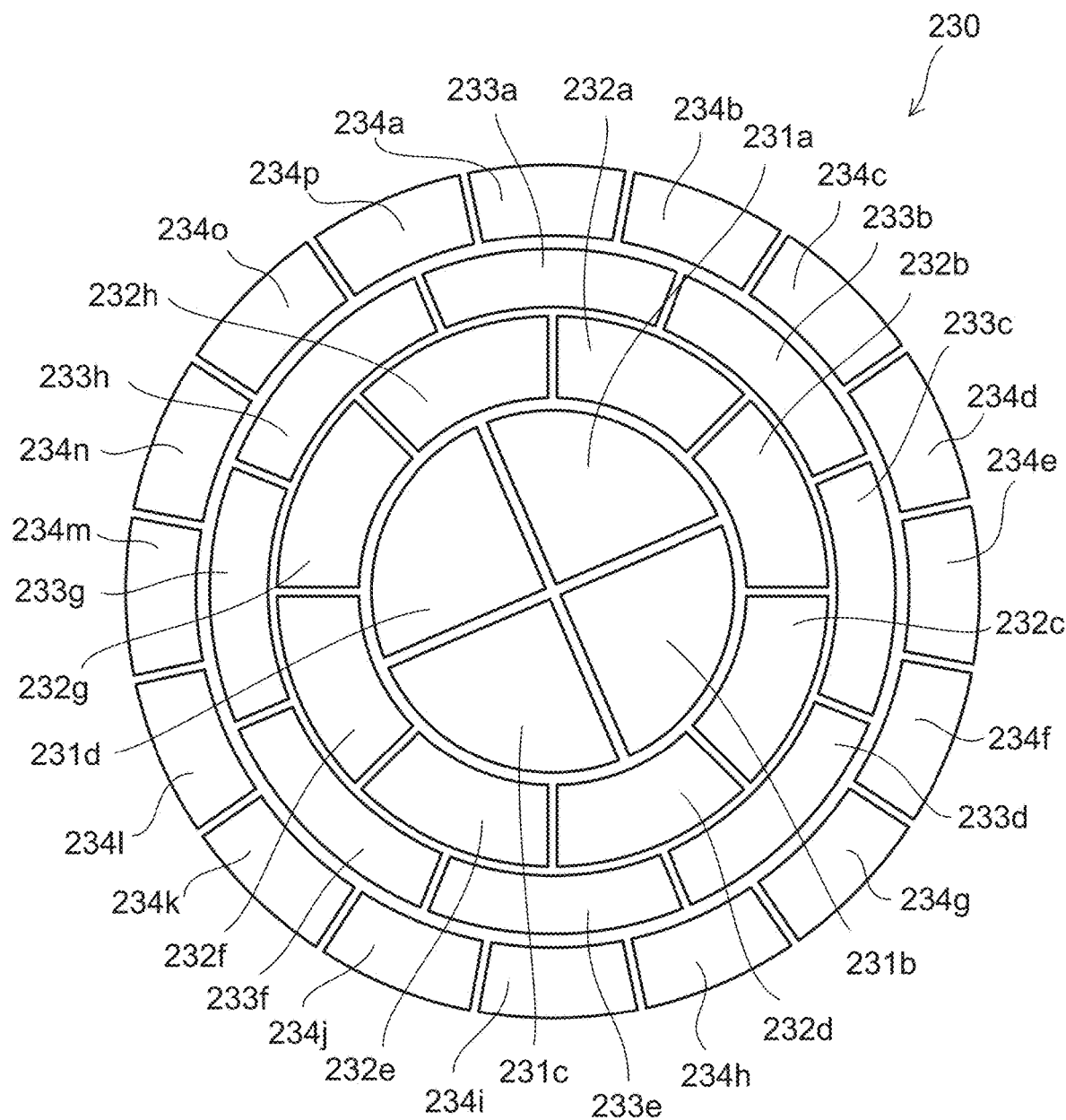
FIG. 13 is a schematic plan view illustrating the heater element of this specific example.

FIG. 12A, FIG. 12B, and 13 are schematic plan views illustrating the heater element of this specific example.

Figure 14A:
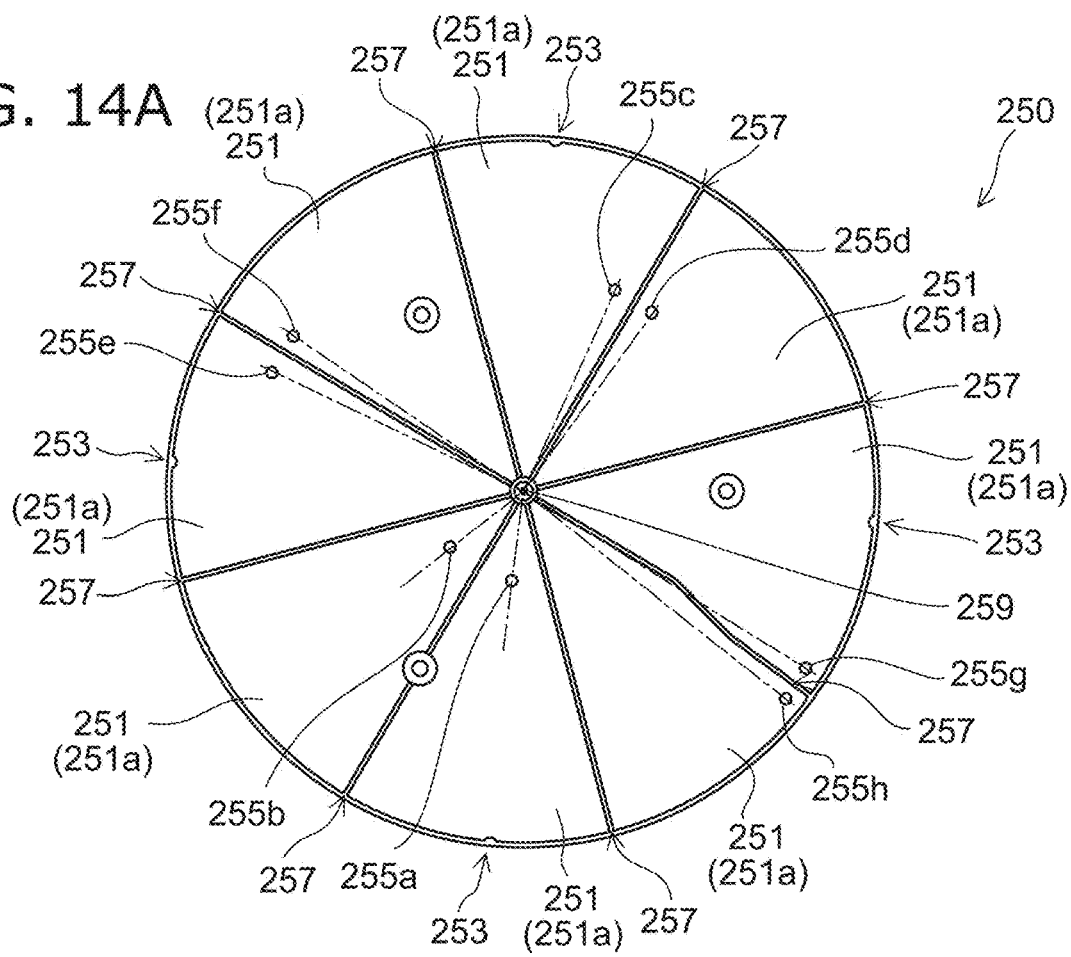
FIG. 14A and FIG. 14B are schematic plan views illustrating the bypass layer of this specific example.
Figure 14B:
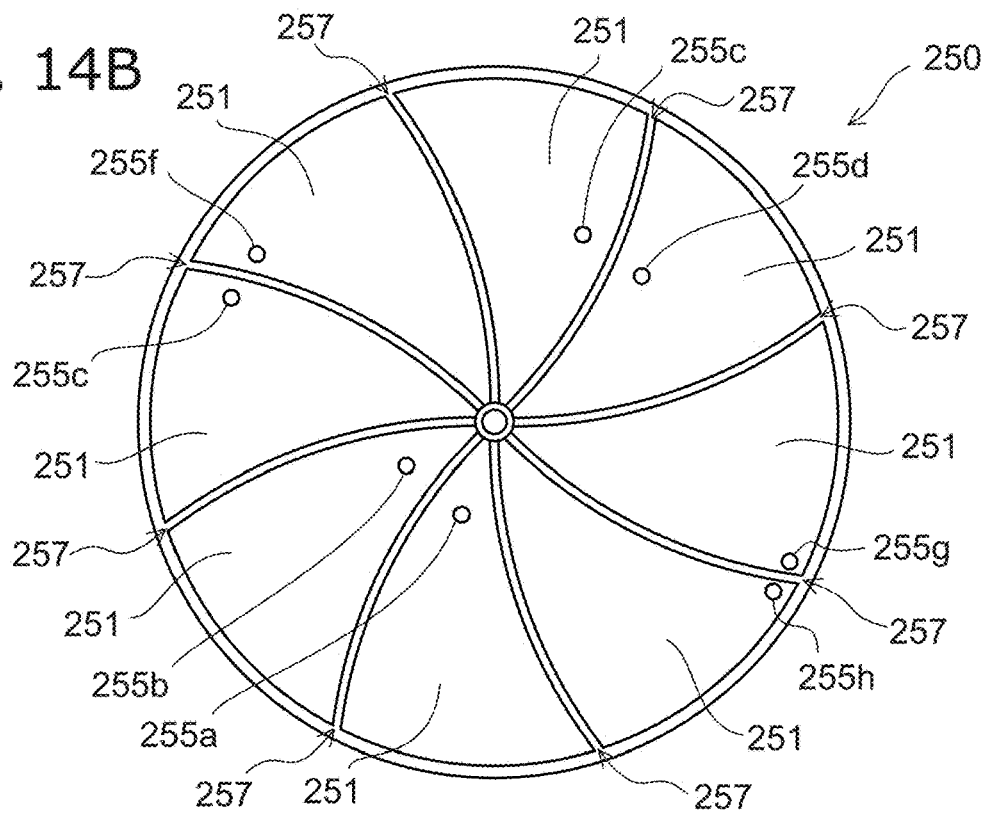

FIG. 14A and FIG. 14B are schematic plan views illustrating the bypass layer of this specific example.

Figure 15A:
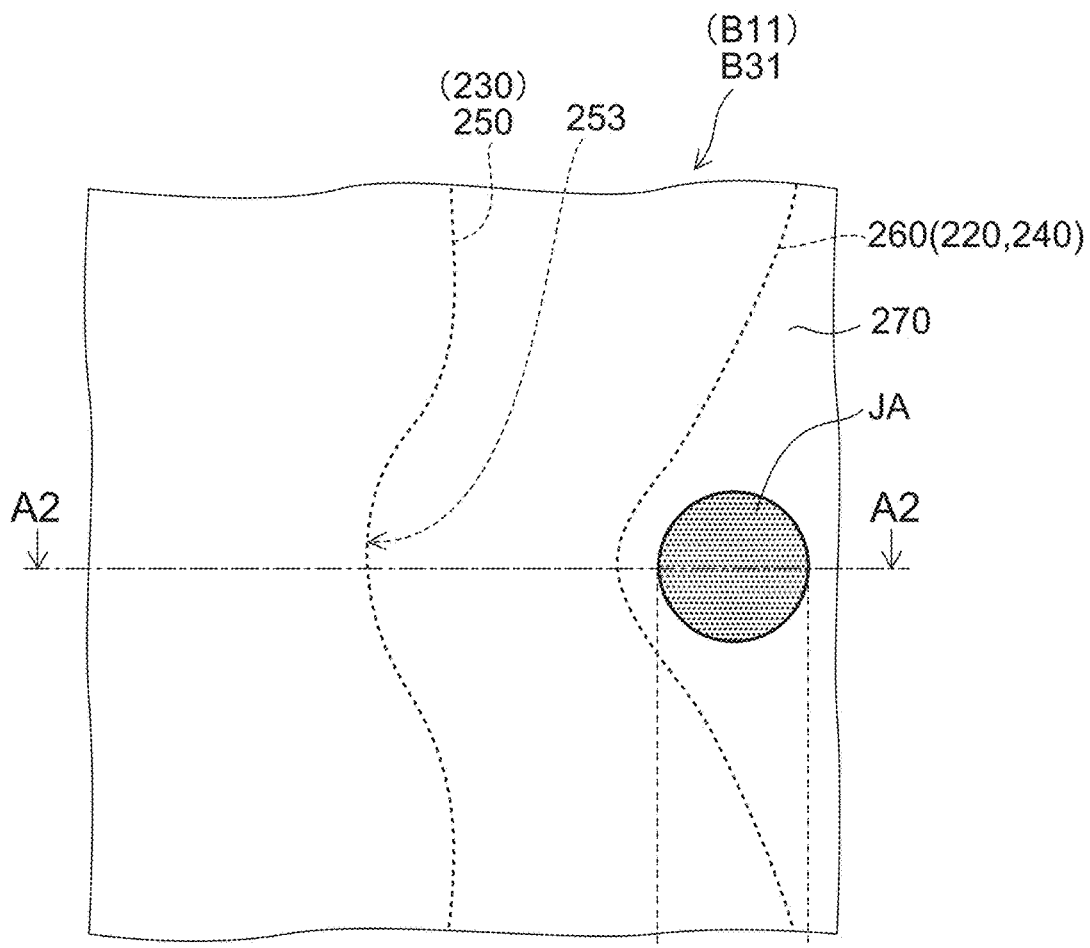
FIG. 15A and FIG. 15B are enlarged views schematically illustrating a portion of the heater plate of this specific example.
Figure 15B:
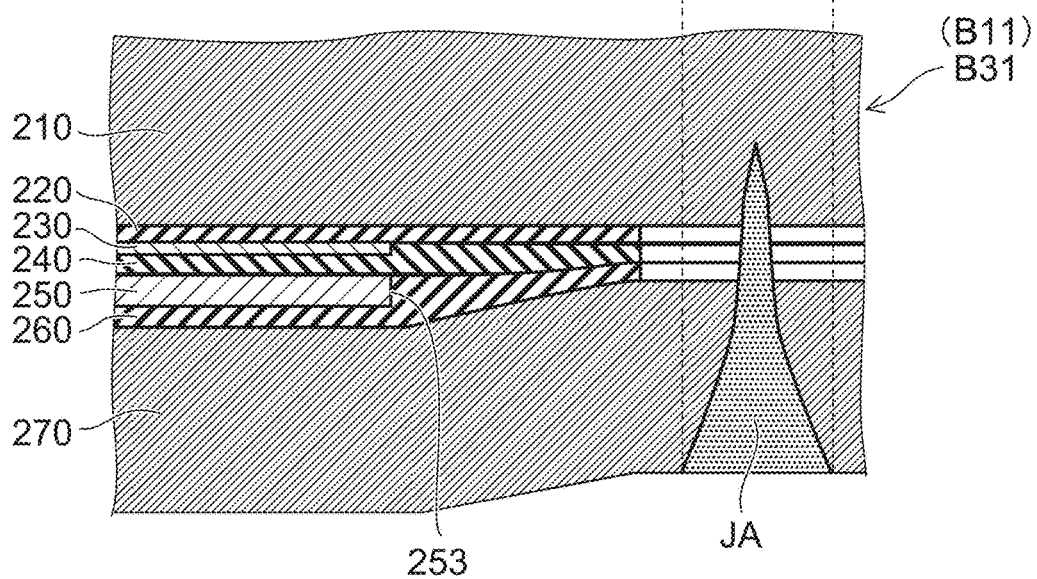

FIG. 15A and FIG. 15B are enlarged views schematically illustrating a portion of the heater plate of this specific example.

FIG. 11A is a schematic plan view of the heater plate of this specific example viewed from the upper surface. FIG. 11B is a schematic plan view of the heater plate of this specific example viewed from the lower surface. FIG. 12A is a schematic plan view illustrating an example of the region of the heater element. FIG. 12B and FIG. 13 are schematic plan views illustrating other examples of the region of the heater element.

As illustrated in FIG. 14, at least one of the multiple bypass portions 251 of the bypass layer 250 has a notch 253 in an edge portion. Four notches 253 are provided in the bypass layer 250 illustrated in FIG. 13. The number of the notches 253 is not limited to four.

Because at least one of the multiple bypass layers 250 includes the notch 253, the second support plate 270 can contact the first support plate 210.

As illustrated in FIG. 11A and FIG. 11B, the first support plate 210 is electrically coupled to the second support plate 270 in regions B11 to B14 and regions B31 to B34. The regions B11 to B14 correspond respectively to the regions B31 to B34. That is, in the specific example illustrated in FIG. 11A to FIG. 13, the first support plate 210 is electrically coupled to the second support plate 270 in four regions and is not electrically coupled to the second support plate 270 in eight regions.

FIG. 15A and FIG. 15B are enlarged views illustrating an example of the region B31 (the region B11). FIG. 15A is a schematic cross-sectional view of the region B31; and FIG. 15B is a schematic plan view of the region B31. FIG. 15B schematically illustrates a cross section A2-A2 of FIG. 15A.

The other regions B12 to B14 and regions B32 to B34 are similar to the regions B11 and B31; and a detailed description is therefore omitted.

As illustrated in FIG. 15A and FIG. 15B, a coupling region JA is provided in the region B31. The coupling region JA couples the first support plate 210 and the second support plate 270 to each other. The coupling region JA is provided at the outer edges of the first support plate 210 and the second support plate 270 to correspond to the notch 253 of the bypass layer 250. The coupling region JA is formed by, for example, laser welding from the second support plate 270 side. Thereby, the coupling region JA is formed in a spot configuration. The coupling region JA may be formed from the first support plate 210 side. The method for forming the coupling region JA is not limited to laser welding and may be another method. The configuration of the coupling region JA is not limited to a spot configuration and may be an elliptical configuration, a semicircular configuration, a polygonal configuration, etc.

The surface area of the coupling region JA where the first support plate 210 is coupled to the second support plate 270 is narrower than the surface area of the surface 211 of the first support plate 210 (referring to FIG. 3). The surface area of the coupling region JA is narrower than the surface area difference of the surface area of the heater element 230 subtracted from the surface area of the surface 211. In other words, the surface area of the coupling region JA is narrower than the surface area of the region of the first support plate 210 not overlapping the heater element 230 when projected onto a plane parallel to the surface 211. The surface area of the coupling region JA where the first support plate 210 is coupled to the second support plate 270 is narrower than the surface area of the surface 271 of the second support plate 270 (referring to FIG. 4A). The surface area of the coupling region JA is narrower than the surface area difference of the surface area of the heater element 230 subtracted from the surface area of the surface 271. In other words, the surface area of the coupling region JA is narrower than the surface area of the region of the second support plate 270 not overlapping the heater element 230 when projected onto a plane parallel to the surface 271.

The diameter of the coupling region JA formed in the spot configuration is, for example, 1 mm (not less than 0.5 mm and not more than 3 mm). On the other hand, the diameter of the first support plate 210 and the second support plate 270 is, for example, 300 mm. The diameter of the first support plate 210 and the second support plate 270 is set according to the processing object W to be held. Thus, the surface area of the coupling region JA is sufficiently small compared to the surface area of the surface 211 of the first support plate 210 and the surface area of the surface 271 of the second support plate 270. The surface area of the coupling region JA is, for example, not more than 1/5000 of the surface area of the surface 211 (the surface area of the surface 271). Here, more specifically, the surface area of the coupling region JA is the surface area when projected onto a plane parallel to the surface 211 of the first support plate 210. In other words, the surface area of the coupling region JA is the surface area when viewed in the top view.

In the example, four coupling regions JA that correspond to the regions B11 to B14 and the regions B31 to B34 are provided. The number of the coupling regions JA is not limited to four. The number of the coupling regions JA may be any number. For example, twelve coupling regions JA may be provided in the first support plate 210 and the second support plate 270 every 30°. Also, the configuration of the coupling region JA is not limited to a spot configuration. The configuration of the coupling region JA may be an elliptical configuration, a polygonal configuration, a line configuration, etc. For example, the coupling region JA may be formed in a ring configuration along the outer edge of the first support plate 210 and the second support plate 270.

The second support plate 270 has the hole 273 (referring to FIG. 4B and FIG. 8). On the other hand, the first support plate 210 does not have a hole where the power supply terminal 280 passes through. Therefore, the surface area of the surface 211 of the first support plate 210 is greater than the surface area of the surface 271 of the second support plate 270.

The heater element 230 includes, for example, the heater electrode 239 having the band configuration. In the specific example illustrated in FIG. 12A, the heater electrode 239 is arranged to form substantially a circle. The heater electrode 239 is disposed in a first region 231, a second region 232, a third region 233, and a fourth region 234. The first region 231 is positioned at the central portion of the heater element 230. The second region 232 is positioned on the outer side of the first region 231. The third region 233 is positioned on the outer side of the second region 232. The fourth region 234 is positioned on the outer side of the third region 233.

The heater electrode 239 that is disposed in the first region 231 is not electrically coupled to the heater electrode 239 disposed in the second region 232. The heater electrode 239 that is disposed in the second region 232 is not electrically coupled to the heater electrode 239 disposed in the third region 233. The heater electrode 239 that is disposed in the third region 233 is not electrically coupled to the heater electrode 239 disposed in the fourth region 234. That is, the heater electrode 239 is provided in a mutually-independent state in multiple regions.

In the specific example illustrated in FIG. 12B, the heater electrode 239 is arranged to form at least a portion of a substantially fan-like shape. The heater electrode 239 is disposed in a first region 231a, a second region 231b, a third region 231c, a fourth region 231d, a fifth region 231e, a sixth region 231f, a seventh region 232a, an eighth region 232b, a ninth region 232c, a tenth region 232d, an eleventh region 232e, and a twelfth region 232f. The heater electrode 239 that is disposed in any region is not electrically coupled to the heater electrode 239 disposed in the other regions. That is, the heater electrode 239 is provided in a mutually-independent state in multiple regions. As illustrated in FIG. 12A and FIG. 12B, the regions where the heater electrode 239 is disposed are not particularly limited.

In the specific example illustrated in FIG. 13, the heater element 230 further includes many regions. In the heater element 230 of FIG. 13, the first region 231 shown in FIG. 12A is further subdivided into four regions 231a to 231d. Also, the second region 232 shown in FIG. 12A is further subdivided into eight regions 232a to 232h. Also, the third region 233 shown in FIG. 12A is further subdivided into eight regions 233a to 233h. Also, the fourth region 234 shown in FIG. 12A is further subdivided into sixteen regions 234a to 234p. Thus, the number and configurations of the regions of the heater element 230 where the heater electrode 239 is disposed may be arbitrary.

As illustrated in FIG. 14A, the bypass portions 251 of the bypass layer 250 have a fan-like shape. The bypass portions 251 of the multiple fan-like shapes are arranged to be separated from each other; and the bypass layer 250 has a substantially circular shape as an entirety. As illustrated in FIG. 14A, a separating portion 257 that is between mutually-adjacent bypass portions 251 extends in the diametrical direction from a center 259 of the bypass layer 250. In other words, the separating portion 257 that is between the mutually-adjacent bypass portions 251 extends in a radial configuration from the center 259 of the bypass layer 250. The surface area of the surface 251a of the bypass portion 251 is greater than the surface area of the separating portion 257. The surface area of the bypass layer 250 (the surface area of the surface 251a of the bypass portion 251) is greater than the surface area of the heater element 230 (the surface area of the heater electrode 239).

As illustrated in FIG. 14B, the configuration of the multiple bypass portions 251 of the bypass layer 250 may be, for example, a curved fan-like configuration. Thus, the number and configurations of the multiple bypass portions 251 provided in the bypass layer 250 may be arbitrary.

In the description hereinbelow relating to FIG. 11 to FIG. 14, the region of the heater element 230 illustrated in FIG. 12A is used as an example. The heater electrode 239 is arranged to form substantially a circle; and the bypass portions 251 that have the multiple fan-like shapes are arranged to be separated from each other. Therefore, when viewed perpendicularly to the surfaces 251a of the bypass portions 251, the heater electrode 239 crosses the separating portion 257 between the mutually-adjacent bypass portions 251. Also, when viewed perpendicularly to the surfaces 251a of the bypass portions 251, a separating portion 235 that is between the regions (the first region 231, the second region 232, the third region 233, and the fourth region 234) of the mutually-adjacent heater elements 230 crosses the separating portion 257 between the mutually-adjacent bypass portions 251.

As illustrated in FIG. 11A and FIG. 11B, the multiple imaginary lines that connect a center 203 of the heater plate 200 to each of coupling portions 255a to 255h between the heater element 230 and the bypass layer 250 do not overlap each other. In other words, the coupling portions 255a to 255h that are between the heater element 230 and the bypass layer 250 are arranged in mutually-different directions when viewed from the center 203 of the heater plate 200. As illustrated in FIG. 11B, the power supply terminal 280 exists on an imaginary line connecting the center 203 of the heater plate 200 to each of the coupling portions 255a to 255h.

The coupling portions 255a and 255b are portions coupling the bypass layer 250 and the heater electrode 239 disposed in the first region 231. The coupling portions 255a and 255b correspond to the first region 231. One of the coupling portion 255a or the coupling portion 255b is a portion where the current enters the heater element 230. The other of the coupling portion 255a or the coupling portion 255b is a portion where the current exits from the heater element 230.

The coupling portions 255c and 255d are portions coupling the bypass layer 250 and the heater electrode 239 disposed in the second region 232. The coupling portions 255c and 255d correspond to the second region 232. One of the coupling portion 255c or the coupling portion 255d is a portion where the current enters the heater element 230. The other of the coupling portion 255c or the coupling portion 255d is a portion where the current exits from the heater element 230.

The coupling portions 255e and 255f are portions coupling the bypass layer 250 and the heater electrode 239 disposed in the third region 233. The coupling portions 255e and 255f correspond to the third region 233. One of the coupling portion 255e or the coupling portion 255f is a portion where the current enters the heater element 230. The other of the coupling portion 255e or the coupling portion 255f is a portion where the current exits from the heater element 230.

The coupling portions 255g and 255h are portions coupling the bypass layer 250 and the heater electrode 239 disposed in the fourth region 234. The coupling portions 255g and 255h correspond to the fourth region 234. One of the coupling portion 255g or the coupling portion 255h is a portion where the current enters the heater element 230. The other of the coupling portion 255g or the coupling portion 255h is a portion where the current exits from the heater element 230.

The coupling portions 255a and 255b exist on a circle that has the center 203 of the heater plate 200 as a center and is different from the circle passing through the coupling portions 255c and 255d. The coupling portions 255a and 255b exist on a circle that has the center 203 of the heater plate 200 as a center and is different from the circle passing through the coupling portions 255e and 255f. The coupling portions 255a and 255b exist on a circle that has the center 203 of the heater plate 200 as a center and is different from the circle passing through the coupling portions 255g and 255h.

The coupling portions 255c and 255d exist on a circle that has the center 203 of the heater plate 200 as a center and is different from the circle passing through the coupling portions 255e and 255f. The coupling portions 255c and 255d exist on a circle that has the center 203 of the heater plate 200 as a center and is different from the circle passing through the coupling portions 255g and 255h.

The coupling portions 255e and 255f exist on a circle that has the center 203 of the heater plate 200 as a center and is different from the circle passing through the coupling portions 255g and 255h.

As illustrated in FIG. 11A and FIG. 11B, the heater plate 200 has a lift pin hole 201. In the specific example illustrated in FIG. 11A and FIG. 11B, the heater plate 200 has three lift pin holes 201. The number of the lift pin holes 201 is not limited to three. The power supply terminal 280 is provided in a region on the center 203 side of the heater plate 200 when viewed from the lift pin hole 201.

According to this specific example, because the heater electrode 239 is disposed in the multiple regions, the temperature in the surface of the processing object W can be controlled independently for each region. Thereby, a temperature difference in the surface of the processing object W can be provided deliberately (temperature controllability).

The structure of the heater plate 200 according to the embodiment will now be described further with reference to the drawings.

Figure 16:
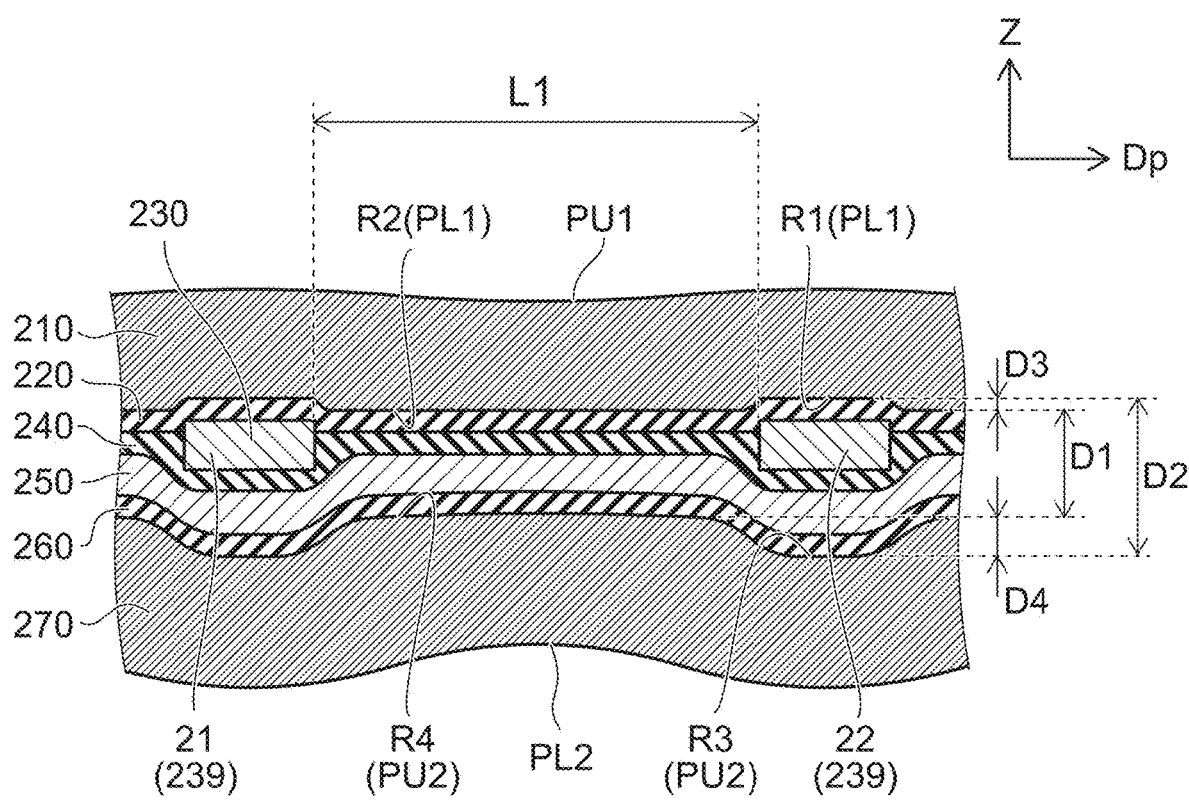
FIG. 16 is a cross-sectional view illustrating a portion of the heater plate of the embodiment.

FIG. 16 is a cross-sectional view illustrating a portion of the heater plate of the embodiment.

In the embodiment, the heater electrode 239 is disposed independently in multiple regions. For example, as illustrated in FIG. 16, the heater electrode 239 (the heater element 230) includes a first electrically conductive portion 21 and a second electrically conductive portion 22. The second electrically conductive portion 22 is separated from the first electrically conductive portion 21 in an in-plane direction Dp (e.g., the X-direction) parallel to the first major surface 101. The first electrically conductive portion 21 and the second electrically conductive portion 22 are portions of the heater electrode 239. A distance L1 between the first electrically conductive portion 21 and the second electrically conductive portion 22 (the width of the separating portion between the first electrically conductive portion 21 and the second electrically conductive portion 22) is, for example, 500 µm or more. Thus, by disposing the heater electrode 239 in the multiple regions, the temperature in the surface of the processing object W can be controlled in each region.

The first support plate 210 has a surface PL1 (the lower surface) on the second support plate 270 side, and a surface PU1 (the upper surface) on the side opposite to the surface PL1. The surface PL1 opposes the first resin layer 220 and contacts, for example, the first resin layer 220.

The surface PL1 (the lower surface) of the first support plate 210 includes a first region R1 and a second region R2. The first region R1 overlaps the heater electrode 239 (the heater element 230) when viewed along the Z-direction (when viewed in the top view). For example, the first region R1 overlaps the first electrically conductive portion 21 or the second electrically conductive portion 22 when viewed along the Z-direction. The second region R2 does not overlap the heater electrode 239 (the heater element 230) when viewed along the Z-direction.

In the electrostatic chuck 10, the second region R2 protrudes toward the second support plate 270 side compared to the first region R1 in the cross section parallel to the Z-direction shown in FIG. 16. In other words, the position in the Z-direction of the second region R2 is between the second support plate 270 and the position in the Z-direction of the first region R1.

In other words, the surface PL1 (the lower surface) of the first support plate 210 includes an unevenness following the configuration of the heater element 230. The first region R1 corresponds to the recess of the first support plate 210; and the second region R2 corresponds to the protrusion of the first support plate 210. Similarly, an unevenness that follows the configuration of the heater element 230 is formed also in the surface PU1 (the upper surface) of the first support plate 210.

The second support plate 270 has a surface PU2 (the upper surface) on the first support plate 210 side, and a surface PL2 (the lower surface) on the side opposite to the surface PU2. The surface PU2 opposes the third resin layer 260 (or the second resin layer 240) and contacts, for example, the third resin layer 260 (or the second resin layer 240).

The surface PU2 (the upper surface) of the second support plate 270 includes a third region R3 and a fourth region R4. The third region R3 overlaps the heater element 230 when viewed along the Z-direction. For example, the third region R3 overlaps the first electrically conductive portion 21 or the second electrically conductive portion 22 when viewed along the Z-direction. The fourth region R4 does not overlap the heater element 230 when viewed along the Z-direction.

In the cross section shown in FIG. 16, the fourth region R4 protrudes toward the first support plate 210 side compared to the third region R3. In other words, the position in the Z-direction of the fourth region R4 is between the first support plate 210 and the position in the Z-direction of the third region R3.

In other words, the surface PU2 (the upper surface) of the second support plate 270 includes an unevenness following the configuration of the heater element 230. The third region R3 corresponds to the recess of the second support plate 270; and the fourth region R4 corresponds to the protrusion of the second support plate 270. Similarly, an unevenness that follows the configuration of the heater element 230 is formed also in the surface PL2 (the lower surface) of the second support plate 270.

A distance D1 along the Z-direction between the second region R2 and the fourth region R4 is shorter than a distance D2 along the Z-direction between the first region R1 and the third region R3.

Thus, unevennesses are formed in the first support plate 210 and the second support plate 270. Such unevennesses are formed by the good adhesion of the members stacked in the heater plate 200. In other words, the adhesion between the surface PL1 and the layers (e.g., the first resin layer 220) proximal to the surface PL1 is high because the unevenness is formed in the surface PL1 (the lower surface) of the first support plate 210. Also, the adhesion between the surface PU2 and the layers (e.g., the third resin layer 260) proximal to the surface PU2 is high because the unevenness is formed in the surface PU2 (the upper surface) of the second support plate 270. Thereby, the peeling of the first support plate 210 and the peeling of the second support plate 270 can be suppressed; and the reliability can be increased. For example, nonuniform heat and/or degradation of the withstand voltage characteristics due to local peeling can be suppressed. The thermal uniformity and the withstand voltage characteristics can be realized as designed.

Also, because the adhesion is high, the thermal conductivity of the heater plate 200 can be improved. Also, for example, the distance between the heater element 230 and the processing object can be shortened by the unevenness of the first support plate 210. Thereby, the increase rate of the temperature of the processing object can be increased. Accordingly, for example, it is possible to realize both the "heating performance of the heater (the temperature increase rate)" and the "temperature uniformity" "withstand voltage reliability."

A distance D3 along the Z-direction between the first region R1 and the second region R2 is shorter than the distance D1. Also, a distance D4 along the Z-direction between the third region R3 and the fourth region R4 is shorter than the distance D1.

In the case where the distance D3 is too long, the unevenness that is formed in the surface PL1 of the first support plate 210 may be too large; and the distortion that is generated in the first support plate 210 and/or the first resin layer 220 may be too large. Also, in the case where the distance D4 is too long, the unevenness that is formed in the second support plate 270 may be too large; and the distortion that is generated in the second support plate 270 and/or the second resin layer 240 may be too large.

Conversely, in the electrostatic chuck 10, the distance D3 and the distance D4 each are shorter than the distance D1. Thereby, the distortion that is generated in the first support plate 210 and/or the first resin layer 220 is prevented from becoming too large while ensuring the adhesion between the first support plate 210 and the layers proximal to the first support plate 210. Also, the distortion that is generated in the second support plate 270 and/or the third resin layer 260 is prevented from becoming too large while ensuring the adhesion between the second support plate 270 and the layers proximal to the second support plate 270.

In the heater plate 200, distortion (thermal distortion) occurs easily in the heater element 230 itself due to the heat generation of the heater element 230. Therefore, in the example shown in FIG. 16, the distance D3 is set to be shorter than the distance D4. That is, the structural distortion of the first support plate 210, etc., on the heater element 230 side is smaller than the structural distortion of the second support plate 270, etc., on the bypass layer 250 side. Thereby, the resistance to thermal distortion of the entire heater plate 200 can be improved.

In the embodiment, one of the distance D3 or the distance D4 may be substantially zero. In other words, one of the surface PL1 or the surface PU2 may be flat. It is sufficient for an unevenness to be formed in one of the surface PL1 or the surface PU2.

FIG. 17A to FIG. 17D are cross-sectional views illustrating portions of the heater plate of the embodiment.

Figure 17A:
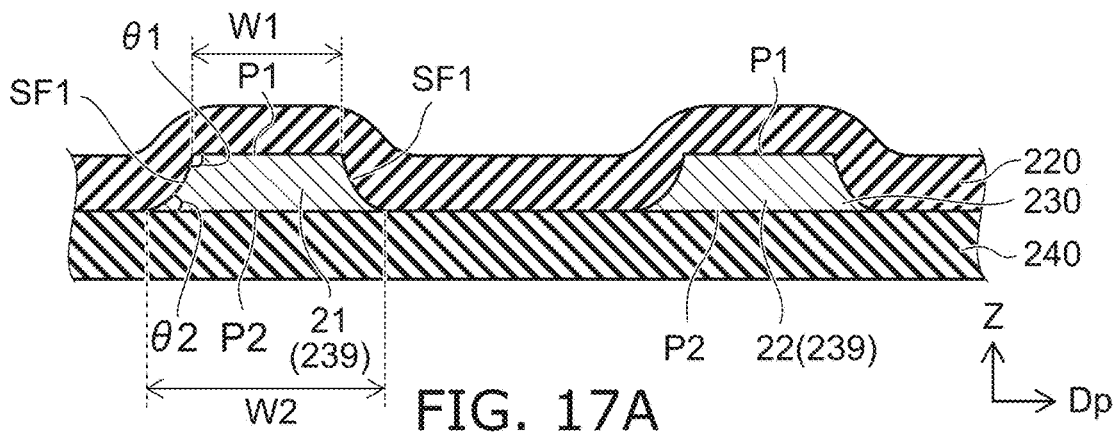
FIG. 17A to FIG. 17D are cross-sectional views illustrating portions of the heater plate of the embodiment.
Figure 17B:
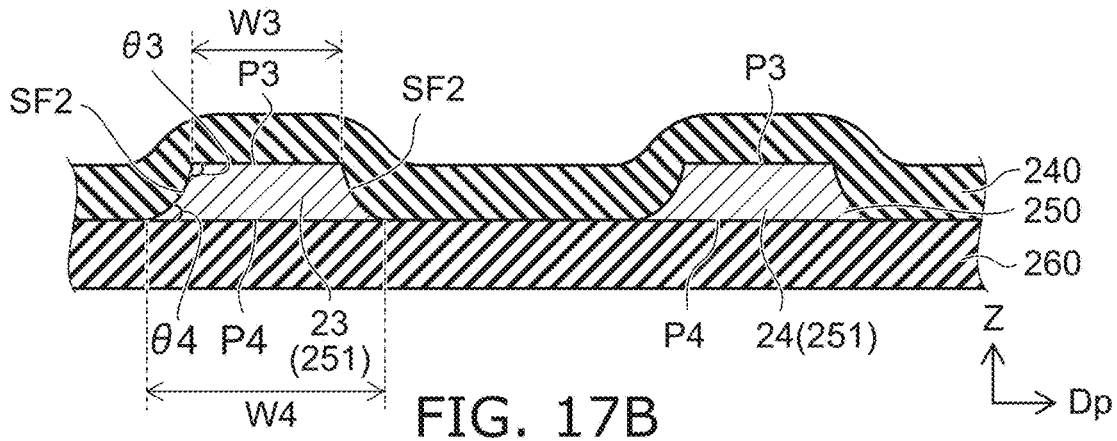
Figure 17C:
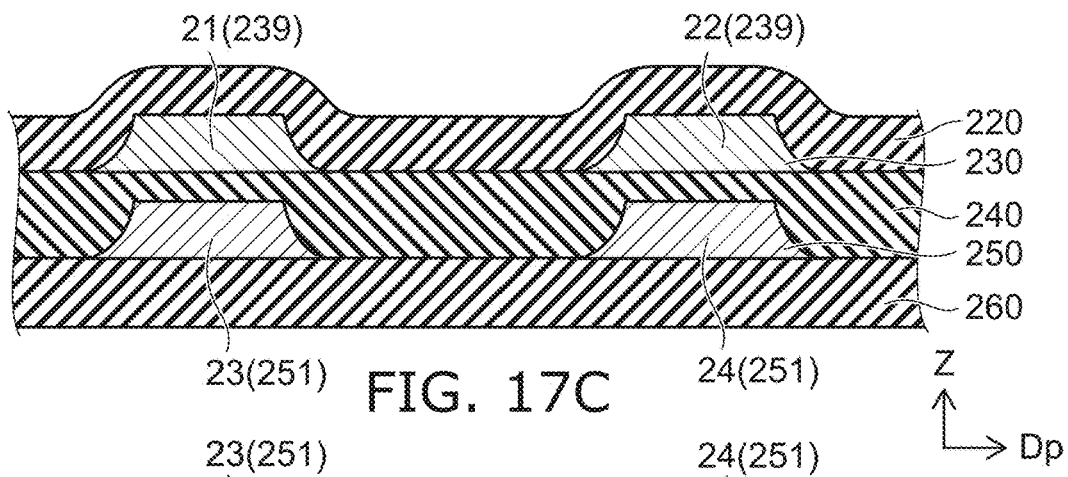
Figure 17D:
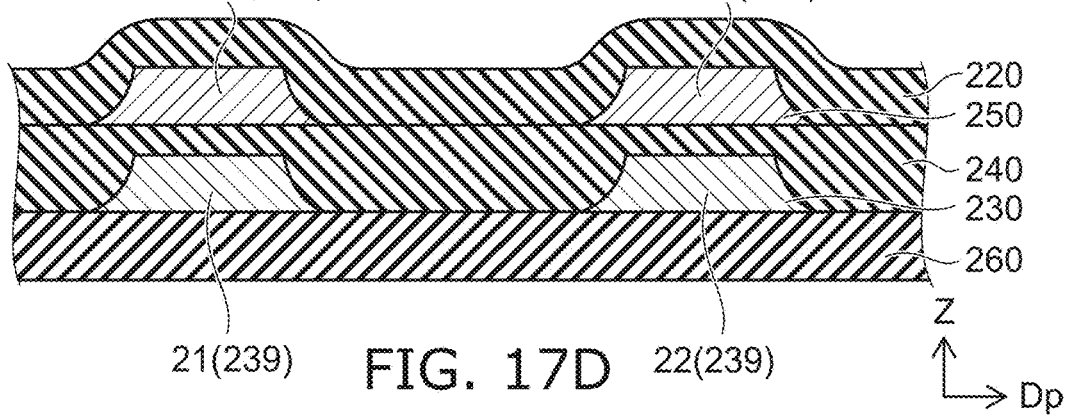

FIG. 17A illustrates a portion of the heater element 230; and FIG. 17B illustrates a portion of the bypass layer 250. Also, FIG. 17C illustrates a portion of the heater element 230 and the bypass layer 250; and FIG. 17D illustrates a modification of the heater element 230 and the bypass layer 250.

The heater electrodes 239 each have a first surface P1 (the upper surface) on the first support plate 210 side, and a second surface P2 (the lower surface) on the second support plate side. The first surface P1 opposes the first resin layer 220. The second surface P2 faces the side opposite to the first surface P1. In other words, the second surface P2 opposes the second resin layer 240.

A width W1 of the first surface P1 is different from a width W2 of the second surface P2. In the example, the width W1 of the first surface P1 is narrower than the width W2 of the second surface P2. In other words, the width of the heater electrode 239 becomes narrower upward (toward the ceramic dielectric substrate 100 side).

The heater electrodes 239 each have a pair of side surfaces SF1 connecting the first surface P1 and the second surface P2. The side surfaces SF1 have curved configurations in the cross section parallel to the Z-direction shown in FIG. 17A. For example, the side surfaces SF1 have concave curved configurations. For example, the side surfaces SF1 may have planar configurations. An angle θ1 between the first surface P1 and the side surface SF1 is different from an angle θ2 between the second surface P2 and the side surface SF1. Also, the surface roughness of the side surface SF1 is rougher than the surface roughness of at least one of the first surface P1 or the second surface P2.

For example, the first surface P1 contacts the first resin layer 220. For example, the second surface P2 contacts the second resin layer 240.

As illustrated in FIG. 17B and FIG. 17C, the bypass portions 251 (the bypass layer 250) include a third electrically conductive portion 23 and a fourth electrically conductive portion 24. The fourth electrically conductive portion 24 is separated from the third electrically conductive portion 23 in the in-plane direction Dp (e.g., the X-direction). The third electrically conductive portion 23 and the fourth electrically conductive portion 24 are some of the bypass portions 251.

The bypass portions 251 each have a third surface P3 (the upper surface) on the first support plate 210 side, and a fourth surface P4 (the lower surface) on the second support plate 270 side. The third surface P3 opposes the second resin layer 240. The fourth surface P4 faces the side opposite to the third surface P3. In other words, the fourth surface P4 opposes the third resin layer 260.

A width W3 of the third surface P3 is different from a width W4 of the fourth surface P4. In the example, the width W3 of the third surface P3 is narrower than the width W4 of the fourth surface P4. In other words, the width of the bypass portion 251 becomes narrower upward (toward the ceramic dielectric substrate 100 side). In the example, the size relationship of the width of the third surface P3 with respect to the fourth surface P4 is the same as the size relationship of the width of the first surface P1 with respect to the second surface P2.

The bypass portions 251 each have a pair of side surfaces SF2 connecting the third surface P3 and the fourth surface P4. For example, the side surfaces SF2 have concave curved configurations. For example, the side surfaces SF2 may have planar configurations. An angle θ3 between the third surface P3 and the side surface SF2 is different from an angle θ4 between the fourth surface P4 and the side surface SF2. Also, the surface roughness of the side surface SF2 is rougher than the surface roughness of at least one of the third surface P3 or the fourth surface P4.

For example, the third surface P3 contacts the second resin layer 240. For example, the fourth surface P4 contacts the third resin layer 260.

Thus, in the electrostatic chuck 10 according to the embodiment, the width W1 of the first surface P1 is different from the width W2 of the second surface P2. Thereby, the stress that is applied to the first resin layer 220, etc., can be reduced even when the heater element 230 deforms due to thermal expansion. Thereby, the peeling of the layers (e.g., the first resin layer 220) proximal to the heater element 230 can be suppressed. The temperature change of the processing object occurring due to the peeling can be suppressed. Accordingly, the reliability of the electrostatic chuck can be increased.

Also, in the electrostatic chuck 10, the width W1 of the first surface P1 is narrower than the width W2 of the second surface P2. Thereby, the contact surface area with the first surface P1 can be small; the stress that is applied to the layers contacting the first surface P1 can be reduced; and the peeling of the layers contacting the first surface P1 can be suppressed. For example, the peeling of the first resin layer 220 can be suppressed. Also, the heat generation amount on the second surface P2 side where the heat escapes easily to the base plate 300 can be more than the heat generation amount on the first surface P1 side; and the fluctuation of the heat distribution in the vertical direction (the Z-direction) perpendicular to the first surface P1 and the second surface P2 can be suppressed. For example, the thermal uniformity can be improved further.

Also, in the electrostatic chuck 10, the side surface SF1 has a concave curved configuration. Thereby, the stress that is applied to the layers proximal to the side surface SF1 can be reduced; and the peeling of the layers proximal to the side surface SF1 can be suppressed. For example, the peeling between the side surface SF1 and the first resin layer 220 (or the second resin layer 240) can be suppressed.

Also, in the electrostatic chuck 10, the angle θ1 between the first surface P1 and the side surface SF1 is different from the angle θ2 between the second surface P2 and the side surface SF1. Thereby, the decrease of the peeling of the second resin layer 240 and the first resin layer 220 proximal to the heater element 230 and thermal characteristics such as thermal uniformity and temperature responsiveness both can be realized by the relaxation of the stress on the resin layers due to heater deformation due to thermal expansion.

Also, in the electrostatic chuck 10, the surface roughness of the side surface SF1 is rougher than the surface roughness of at least one of the first surface P1 or the second surface P2. Thereby, the adhesion at the side surface SF1 portion can be improved; and the peeling of the layers proximal to the heater element 230 can be suppressed further. For example, the peeling between the side surface SF1 and the first resin layer 220 (or the second resin layer 240) can be suppressed further.

Also, in the electrostatic chuck 10, the size relationship of the width of the third surface P3 with respect to the fourth surface P4 is the same as the size relationship of the width of the first surface P1 with respect to the second surface P2. Also, in the electrostatic chuck 10, the widths of the first surface P1 and the third surface P3 are narrower than the widths of the second surface P2 and the fourth surface P4. In such a case, the fluctuation of the heat distribution in the Z-direction can be suppressed further.

In FIG. 17A to FIG. 17C, the heater element 230 is provided on the bypass layer 250. This is not limited thereto; for example, the bypass layer 250 may be provided on the heater element 230 as illustrated in FIG. 17D.

FIG. 18A to FIG. 18D are cross-sectional views illustrating modifications of the heater plate of the embodiment.

Figure 18A:
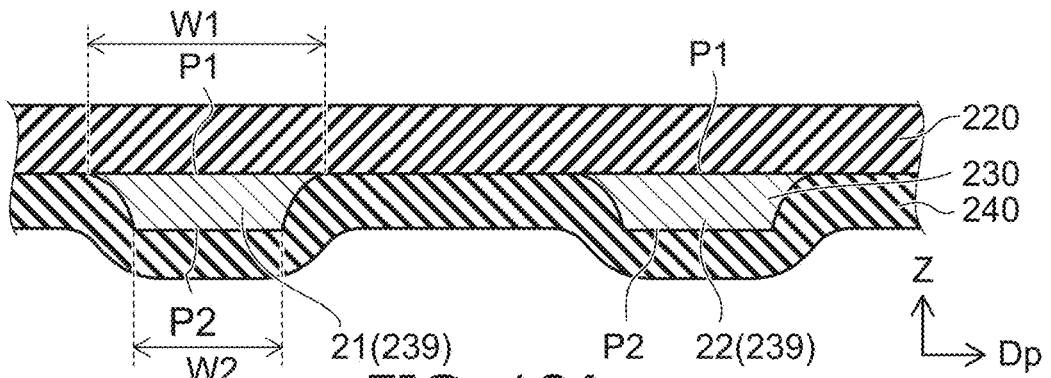
FIG. 18A to FIG. 18D are cross-sectional views illustrating modifications of the heater plate of the embodiment.
Figure 18B:
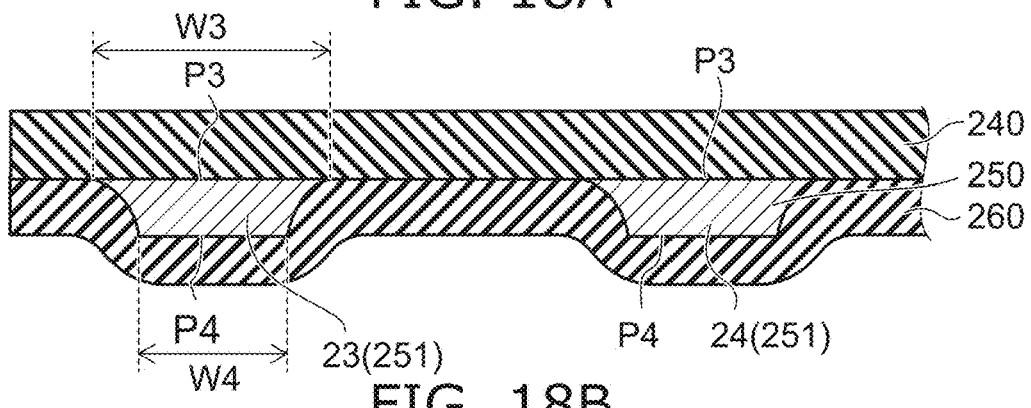
Figure 18C:
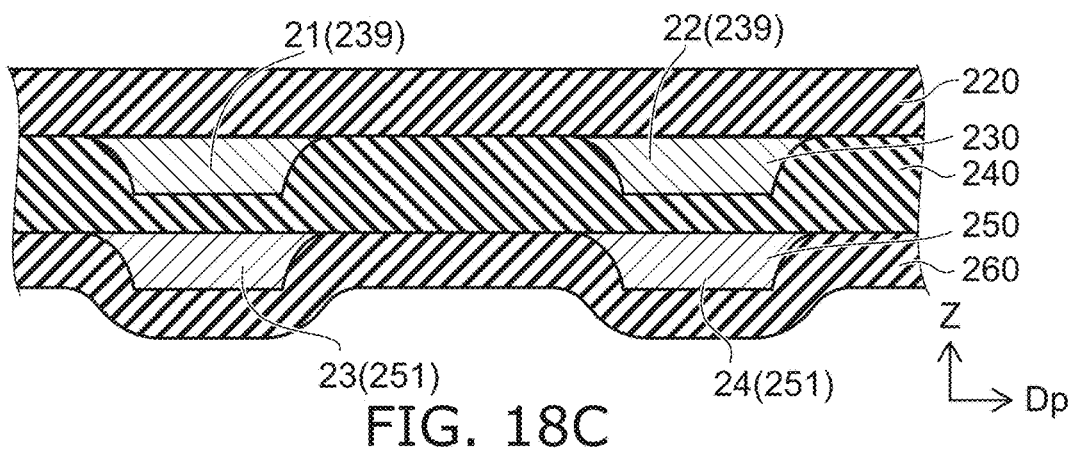

In the examples as illustrated in FIG. 18A and FIG. 18C, the width W1 of the first surface P1 is wider than the width W2 of the second surface P2. In other words, the width of the heater electrode 239 becomes narrower downward (toward the base plate 300 side). Similarly, as illustrated in FIG. 18B and FIG. 18C, the width W3 of the third surface P3 is wider than the width W4 of the fourth surface P4. The width of the bypass portion 251 becomes narrower downward.

Thus, the width W1 of the first surface P1 may be wider than the width W2 of the second surface P2. In such a case, the stress that is applied to the layers contacting the second surface P2 can be reduced; and the peeling of the layers contacting the second surface P2 can be suppressed. Also, the first surface P1 side can hold heat easily; the second surface P2 side can cool heat easily; and the temperature responsiveness (the ramp rate) can be improved further.

Figure 18D:
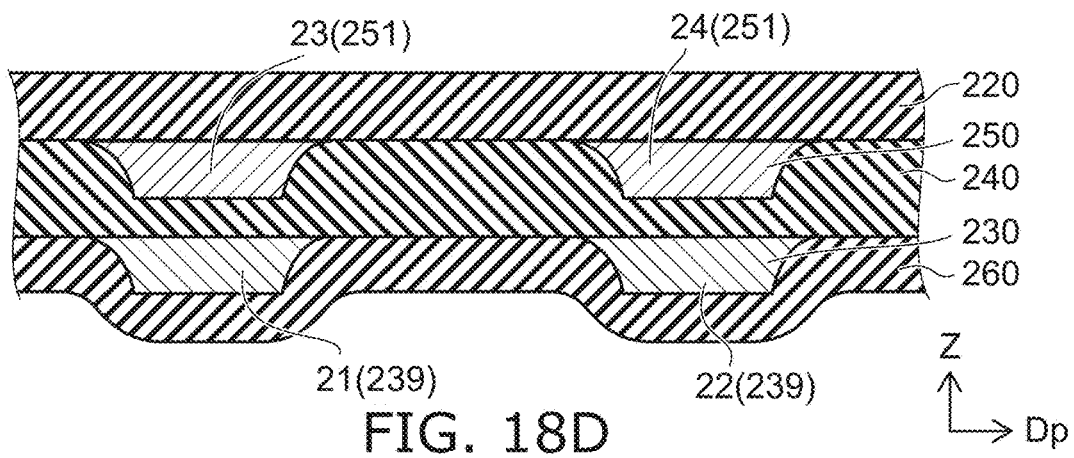

Also, in the example, the size relationship of the width of the third surface P3 with respect to the fourth surface P4 is the same as the size relationship of the width of the first surface P1 with respect to the second surface P2; and the widths of the first surface P1 and the third surface P3 are wider than the widths of the second surface P2 and the fourth surface P4. In such a case, the first surface P1 side and the third surface P3 side can hold heat easily; the second surface P2 side and the fourth surface P4 side can cool heat easily; and the temperature responsiveness can be improved further. Also, as illustrated in FIG. 18D, the bypass layer 250 may be provided on the heater element 230.

FIG. 19A to FIG. 19D are cross-sectional views illustrating modifications of the heater plate of the embodiment.

Figure 19A:
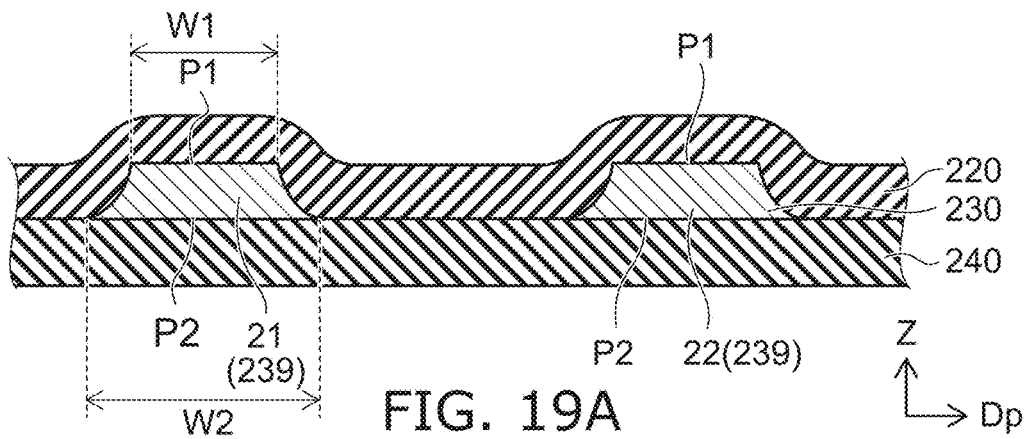
FIG. 19A to FIG. 19D are cross-sectional views illustrating modifications of the heater plate of the embodiment.
Figure 19B:
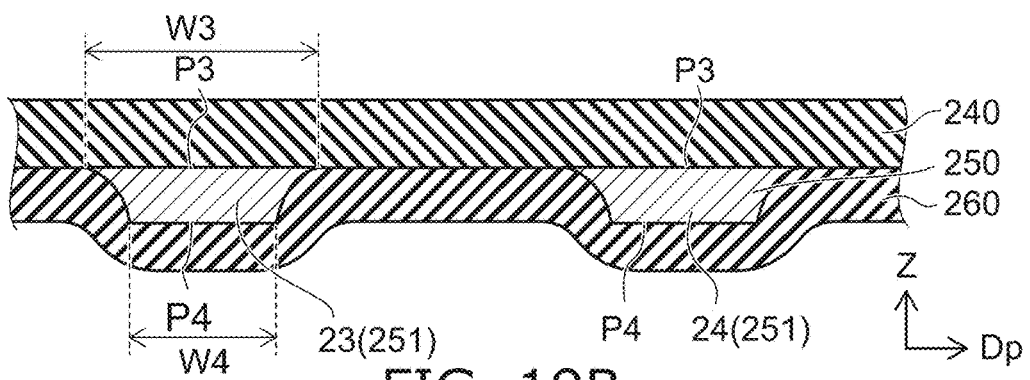
Figure 19C:
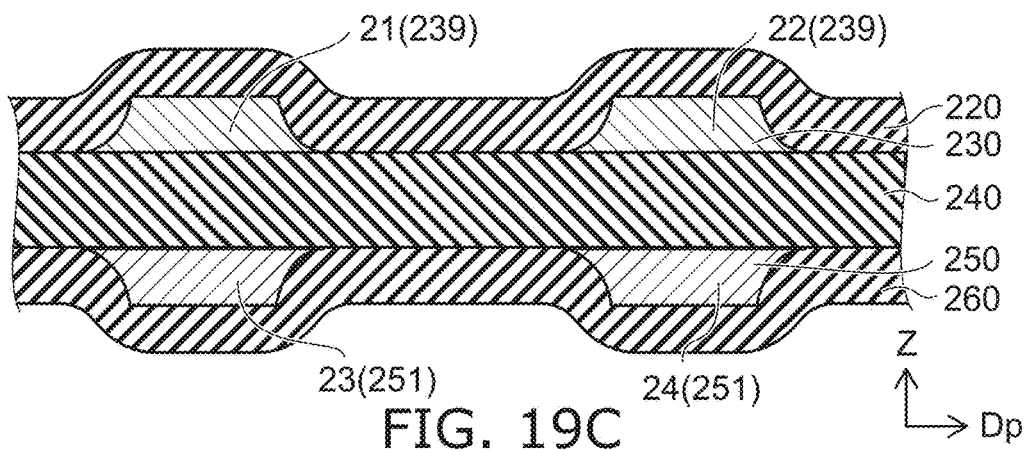

In the examples as illustrated in FIG. 19A and FIG. 19C, the width W1 of the first surface P1 is narrower than the width W2 of the second surface P2. On the other hand, as illustrated in FIG. 19B and FIG. 19C, the width W3 of the third surface P3 is wider than the width W4 of the fourth surface P4. In the examples, the size relationship of the width of the third surface P3 with respect to the fourth surface P4 is the reverse of the size relationship of the width of the first surface P1 with respect to the second surface P2.

Figure 19D:
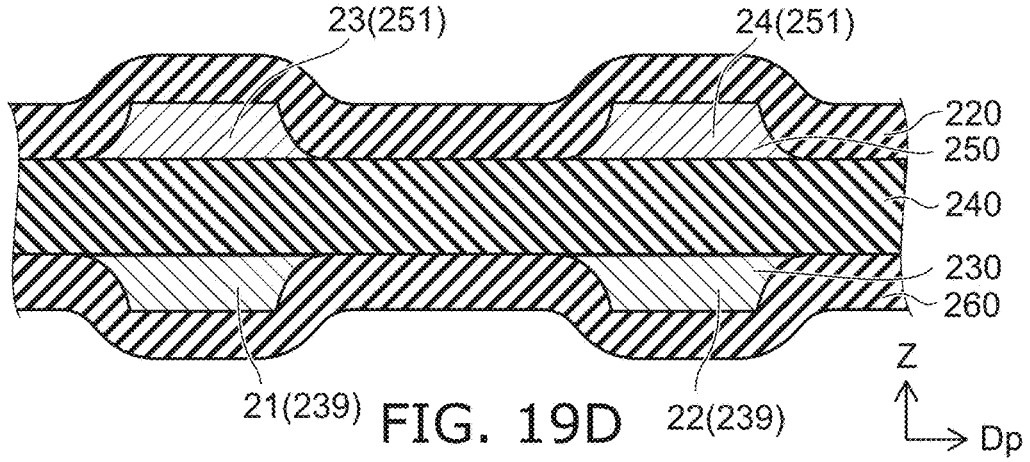

Thus, the size relationship of the width of the third surface P3 with respect to the fourth surface P4 may be the reverse of the size relationship of the width of the first surface P1 with respect to the second surface P2. In such a case, the direction of the stress applied by the thermal expansion of the bypass layer 250 can be the reverse orientation of the direction of the stress applied by the thermal expansion of the heater element 230. Thereby, the effects of the stress can be suppressed further. As illustrated in FIG. 19D, the bypass layer 250 may be provided on the heater element 230.

FIG. 20A to FIG. 20D are cross-sectional views illustrating modifications of the heater plate of the embodiment.

Figure 20A:
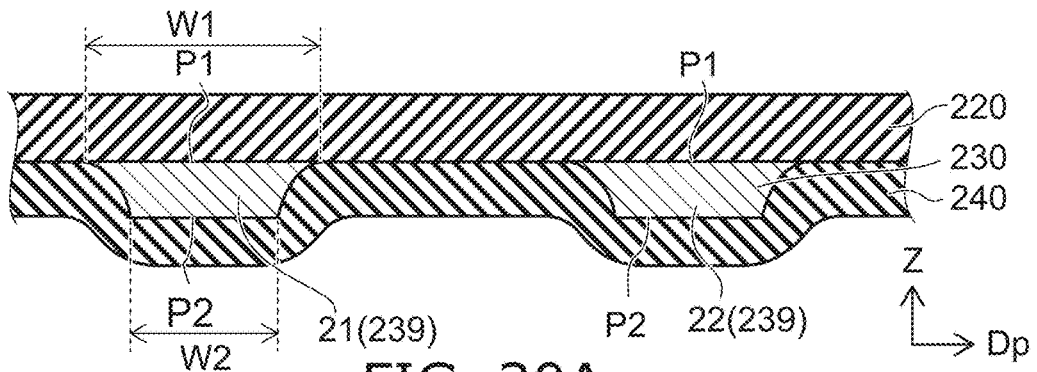
FIG. 20A to FIG. 20D are cross-sectional views illustrating modifications of the heater plate of the embodiment.
Figure 20B:
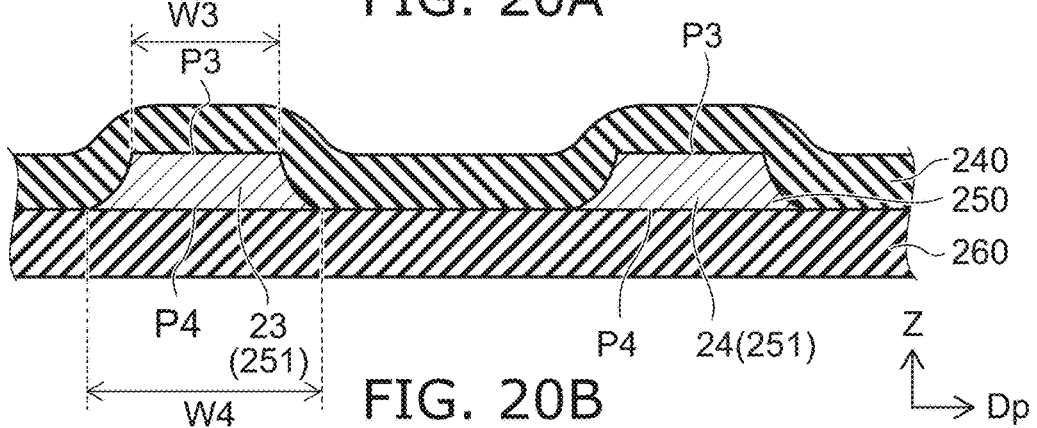
Figure 20C:
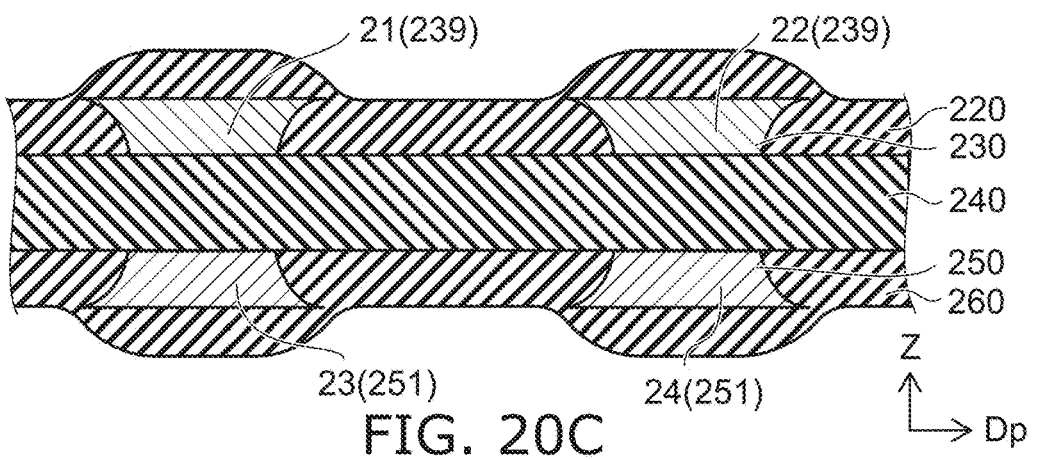
Figure 20D:
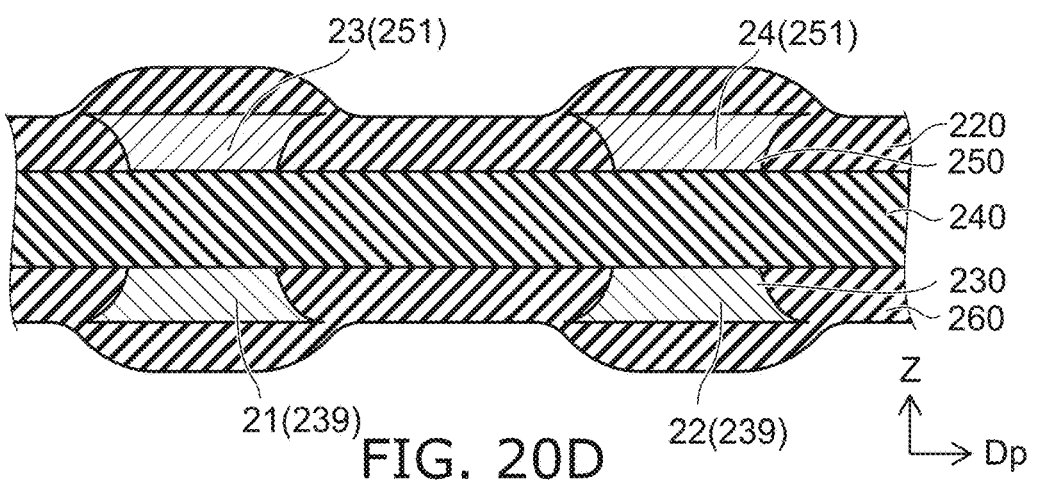

As illustrated in FIG. 20A to FIG. 20C, the width W1 of the first surface P1 may be set to be wider than the width W2 of the second surface P2; and the width W3 of the third surface P3 may be set to be narrower than the width W4 of the fourth surface P4. Also, as illustrated in FIG. 20D, the bypass layer 250 may be provided on the heater element 230.

Figure 21A:
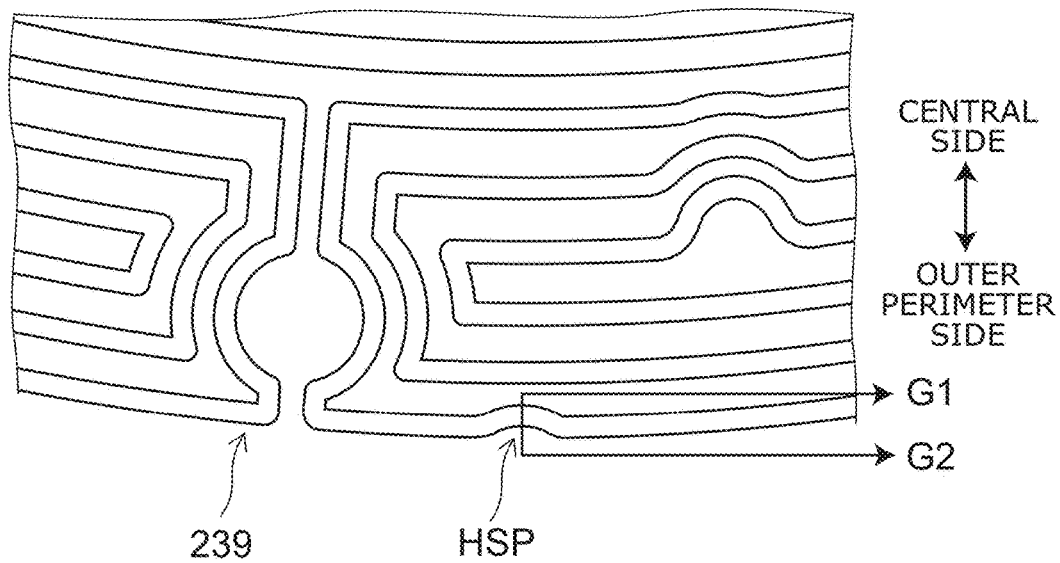
FIG. 21A and FIG. 21B are descriptive views illustrating an example of simulation results of the heater plate.
Figure 21B:
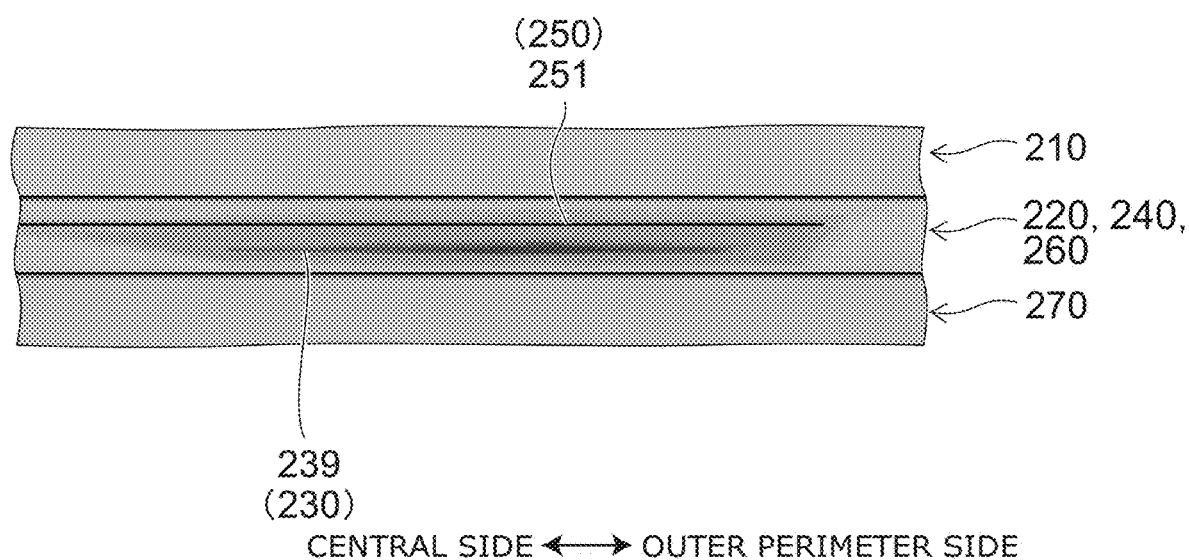

FIG. 21A and FIG. 21B are descriptive views illustrating an example of simulation results of the heater plate.

FIG. 21A illustrates a portion of the heater pattern of the heater electrode 239 used in the simulation. FIG. 21B is a cross-sectional view illustrating an example of the simulation results.

In the simulation, CAE (Computer Aided Engineering) analysis of the heat generation amount when a current is caused to flow in the heater electrode 239 illustrated in FIG. 21A was performed. In FIG. 21B, the analysis results of the heat generation amount are illustrated by the shading of the hatching. In FIG. 21B, the portions where the shading of the hatching is light illustrate where the temperature is low, and illustrates that the temperature increases as the shading becomes darker.

In the simulation, CAE analysis of a hotspot HSP of the heater electrode 239 where the temperature easily becomes high was performed. FIG. 21B illustrates a line G1-G2 cross section of the hotspot HSP. In the simulation model, the bypass layer 250 is provided between the ceramic dielectric substrate 100 and the heater element 230. Also, the first resin layer 220, the second resin layer 240, and the third resin layer 260 are illustrated collectively in one layer (the polyimide layer) for convenience. Also, in the simulation, the width of the heater electrode 239 was taken to be constant. In other words, in the simulation, the width W1 of the first surface P1 is substantially the same as the width W2 of the second surface P2.

The hotspot HSP is positioned at the outermost perimeter of the substantially circular heater plate 200. The hotspot HSP is a portion where the curvature is the reverse of those of the other portions. In the hotspot HSP, the portion on the inner side of the circular arc faces the outer perimeter side of the heater plate 200.

In the heater electrode 239 curved into the circular arc-like configuration, the path on the inner side is short compared to the path on the outer side; and the resistance also becomes low. Therefore, in the heater electrode 239 having the circular arc-like configuration, the current density on the inner side is higher than the current density on the outer side; and there is a tendency also for the temperature to increase. Accordingly, in the hotspot HSP as illustrated in FIG. 21B, the temperature is higher on the outer perimeter side of the heater plate 200 which is the inner side of the circular arc than on the central side of the heater plate 200. Also, because the curvature of the hotspot HSP is the reverse of those of the other portions, the current flows relatively easily also in the portion where the diameter is large on the central side. Therefore, in the hotspot HSP, the temperature increases easily compared to the other portions.

Thus, in the heater electrode 239 curved in the circular arc-like configuration, an unevenness occurs in the temperature distribution between the portion on the inner side and the portion on the outer side. For example, in the case where there is a space (an air layer exists) between the first electrically conductive portion 21 and the second electrically conductive portion 22, that portion undesirably is thermally shielded. In such a case, for example, the members are closely adhered so that the unevennesses following the configuration of the heater element 230 are formed in the lower surface of the first support plate 210 and the upper surface of the second support plate 270. Thereby, the adhesion between the first resin layer 220 and the heater element 230 and the adhesion between the second resin layer 240 and the heater element 230 and between the first resin layer 220 and the second resin layer 240 improve. As a result, the unevenness of the temperature distribution can be suppressed. Also, for example, the thermal uniformity can be improved further.

Also, in the heater electrode 239 as illustrated in FIG. 21B, the temperature easily becomes higher on the ceramic dielectric substrate 100 side (the upper side) than on the base plate 300 side (the lower side). This is because the heat escapes on the base plate 300 side. For example, in the case where a portion where the temperature is high undesirably occurs locally directly above the heater electrode 239, etc., the width W1 of the first surface P1 is set to be narrower than the width W2 of the second surface P2 as illustrated in FIG. 17A, etc. Thereby, as described above, the fluctuation of the heat distribution in the Z-direction can be suppressed. For example, the undesirable local occurrence of the portion where the temperature is high directly above the heater electrode 239 can be suppressed; and the thermal uniformity can be improved further.

Figure 22:
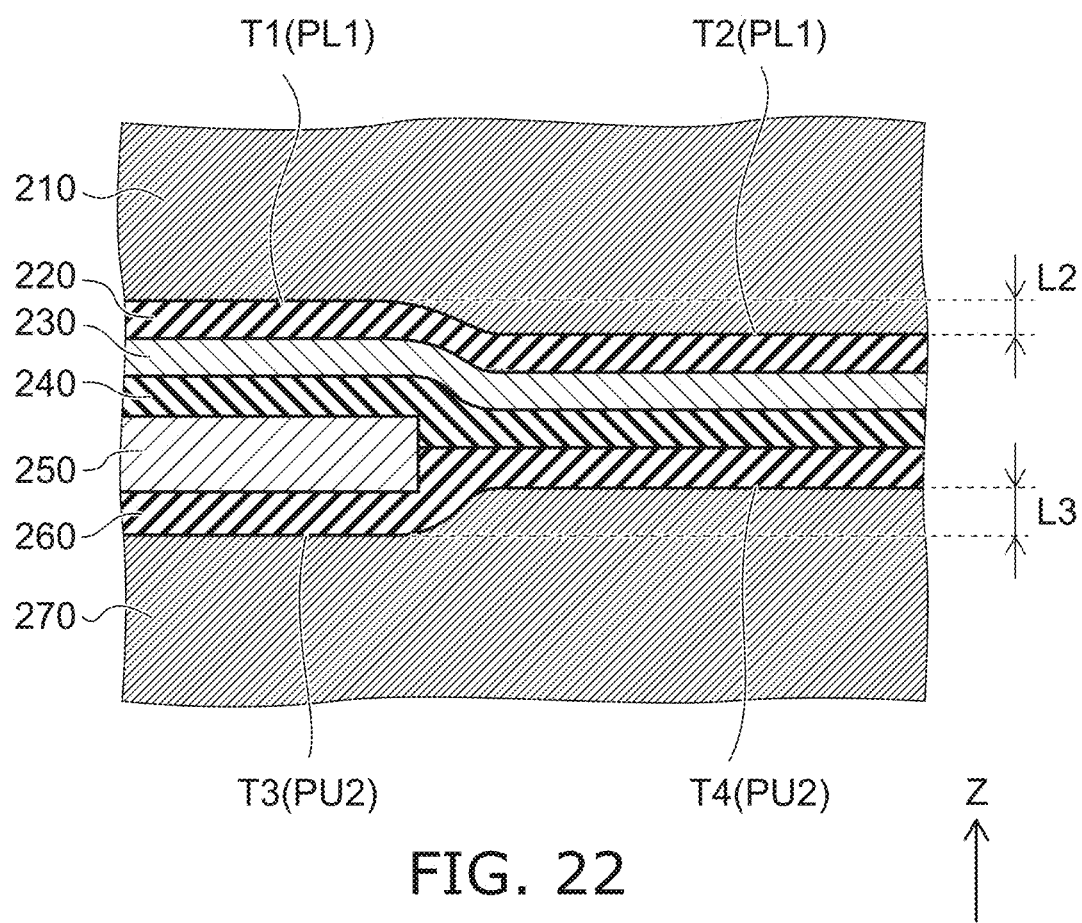
FIG. 22 is a cross-sectional view illustrating a modification of the heater plate of the embodiment.

FIG. 22 is a cross-sectional view illustrating a modification of the heater plate of the embodiment.

In the example, the heater element 230 is provided between the first support plate 210 and the bypass layer 250. Also, the bypass layer 250 is provided between the heater element 230 and the second support plate 270. The bypass layer 250 is thicker than the heater element 230.

The lower surface (the surface PL1) of the first support plate 210 includes a first portion T1 and a second portion T2. The first portion T1 overlaps the bypass layer 250 when viewed along the Z-direction. The second portion T2 does not overlap the bypass layer 250 when viewed along the Z-direction.

The upper surface (the surface PU2) of the second support plate 270 includes a third portion T3 and a fourth portion T4. The third portion T3 overlaps the bypass layer 250 when viewed along the Z-direction. The fourth portion T4 does not overlap the bypass layer 250 when viewed along the Z-direction.

A distance L2 along the Z-direction between the first portion T1 and the second portion T2 is not more than a distance L3 along the Z-direction between the third portion T3 and the fourth portion T4. For example, the distance L2 is shorter than the distance L3.

In other words, the unevenness of the first support plate 210 positioned on the heater element 230 side is smaller than the unevenness of the second support plate 270 positioned on the bypass layer 250 side. In other words, the structural distortion of the first support plate 210, etc., on the heater element 230 side is smaller than the structural distortion of the second support plate 270, etc., on the bypass layer 250 side. The load that is applied to the entire heater plate by the stress due to the thermal distortion can be suppressed by reducing the structural distortion of the heater element side where thermal distortion is generated easily.

Figure 23A:
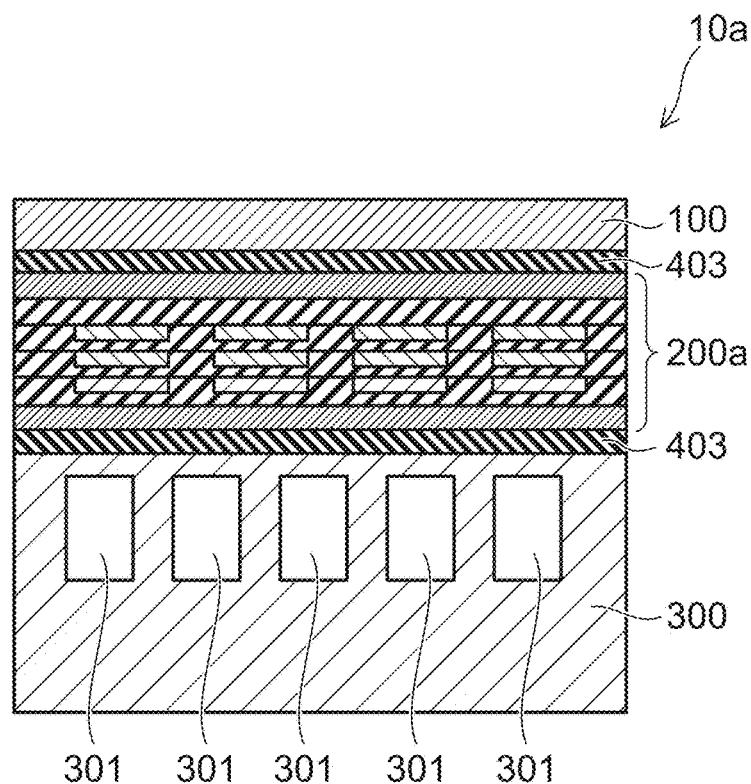
FIG. 23A and FIG. 23B are schematic cross-sectional views illustrating an electrostatic chuck according to a modification of the embodiment.
Figure 23B:
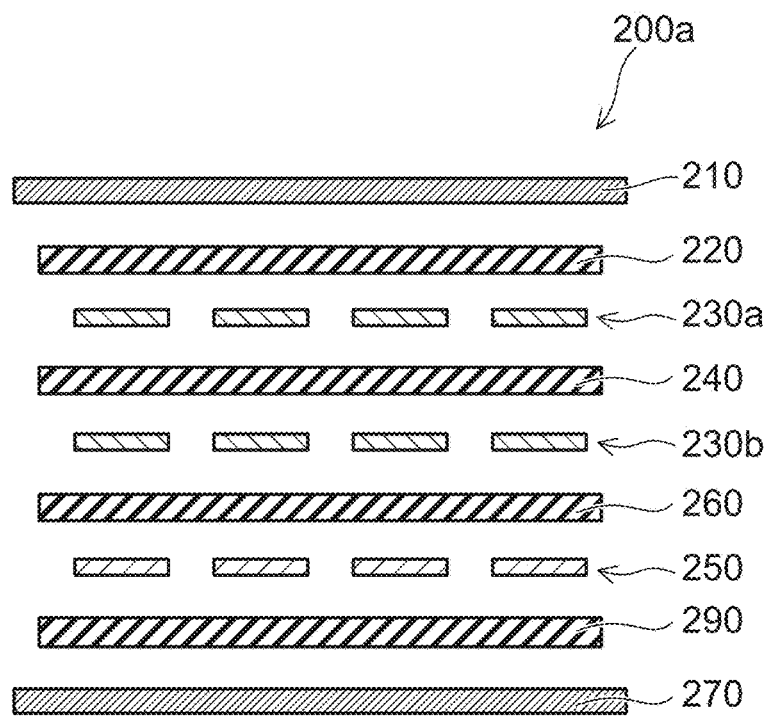

FIG. 23A and FIG. 23B are schematic cross-sectional views illustrating an electrostatic chuck according to a modification of the embodiment.

FIG. 23A is a schematic cross-sectional view illustrating the electrostatic chuck according to the modification of the embodiment. FIG. 23B is a schematic cross-sectional view illustrating the heater plate of the modification. For example, FIG. 23A and FIG. 23B correspond to schematic cross-sectional views of the cross section A1-A1 illustrated in FIG. 1.

The electrostatic chuck 10a illustrated in FIG. 23A includes the ceramic dielectric substrate 100, a heater plate 200a, and the base plate 300. The ceramic dielectric substrate 100 and the base plate 300 are as described above in reference to FIG. 1 and FIG. 2.

As illustrated in FIG. 23B, the heater plate 200a of this specific example includes multiple heater elements. The heater plate 200a illustrated in FIG. 23B includes the first resin layer 220, a first heater element (a heating layer) 230a, the second resin layer 240, a second heater element (a heating layer) 230b, the third resin layer 260, the bypass layer 250, a fourth resin layer 290, and the second support plate 270.

The first resin layer 220 is provided between the first support plate 210 and the second support plate 270. The first heater element 230a is provided between the first resin layer 220 and the second support plate 270. The second resin layer 240 is provided between the first heater element 230a and the second support plate 270. The second heater element 230b is provided between the second resin layer 240 and the second support plate 270. The third resin layer 260 is provided between the second heater element 230b and the second support plate 270. The bypass layer 250 is provided between the third resin layer 260 and the second support plate 270. The fourth resin layer 290 is provided between the bypass layer 250 and the second support plate 270. That is, in this specific example, the first heater element 230a is provided in an independent state in a layer different from that of the second heater element 230b.

The materials, thicknesses, and functions of the first support plate 210, the first resin layer 220, the second resin layer 240, the third resin layer 260, the bypass layer 250, and the second support plate 270 are as described above in reference to FIG. 3 to FIG. 5. The materials, thicknesses, and functions of the first heater element 230a and the second heater element 230b are respectively the same as those of the heater element 230 described above in reference to FIG. 3 to FIG. 5. The fourth resin layer 290 is the same as the first resin layer 220 described above in reference to FIG. 3 to FIG. 5.

According to the modification, because the first heater element 230a is disposed independently in a layer different from that of the second heater element 230b, the temperature in the surface of the processing object W can be controlled independently for each prescribed region.

Figure 24A:
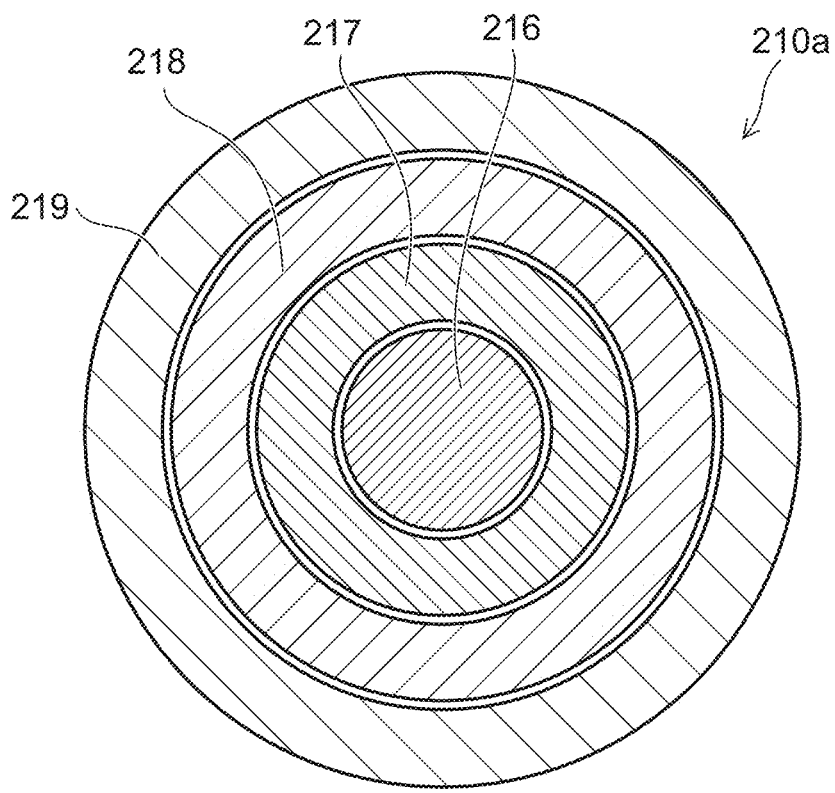
FIG. 24A and FIG. 24B are schematic plan views illustrating modifications of the first support plate of the embodiment.
Figure 24B:
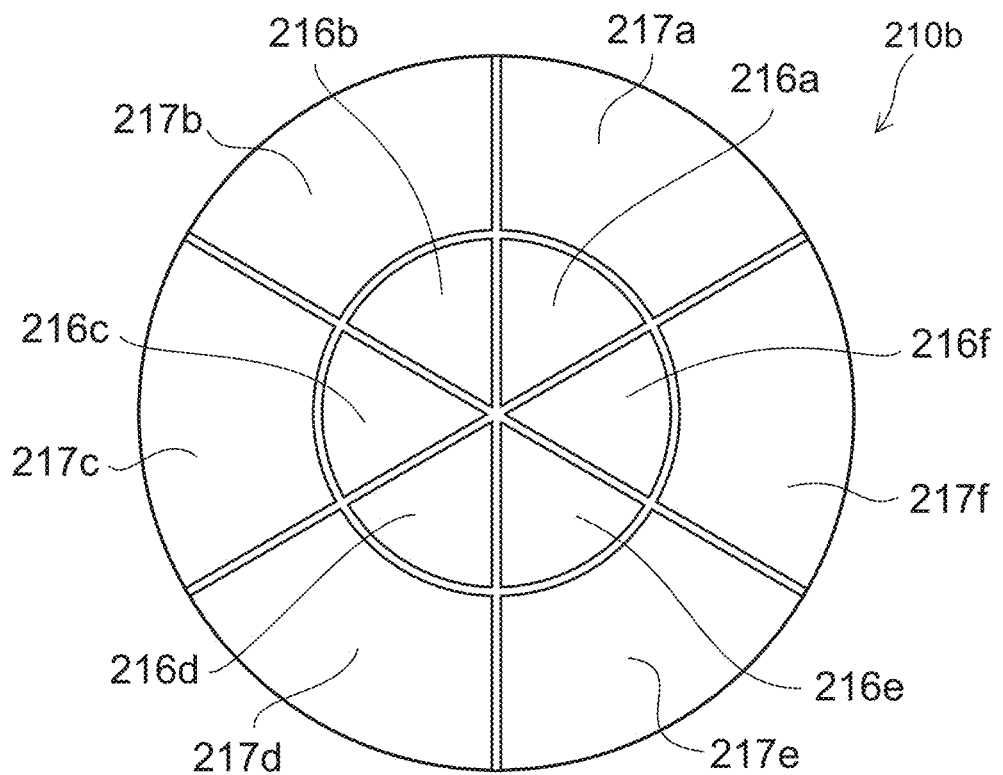
Figure 25:
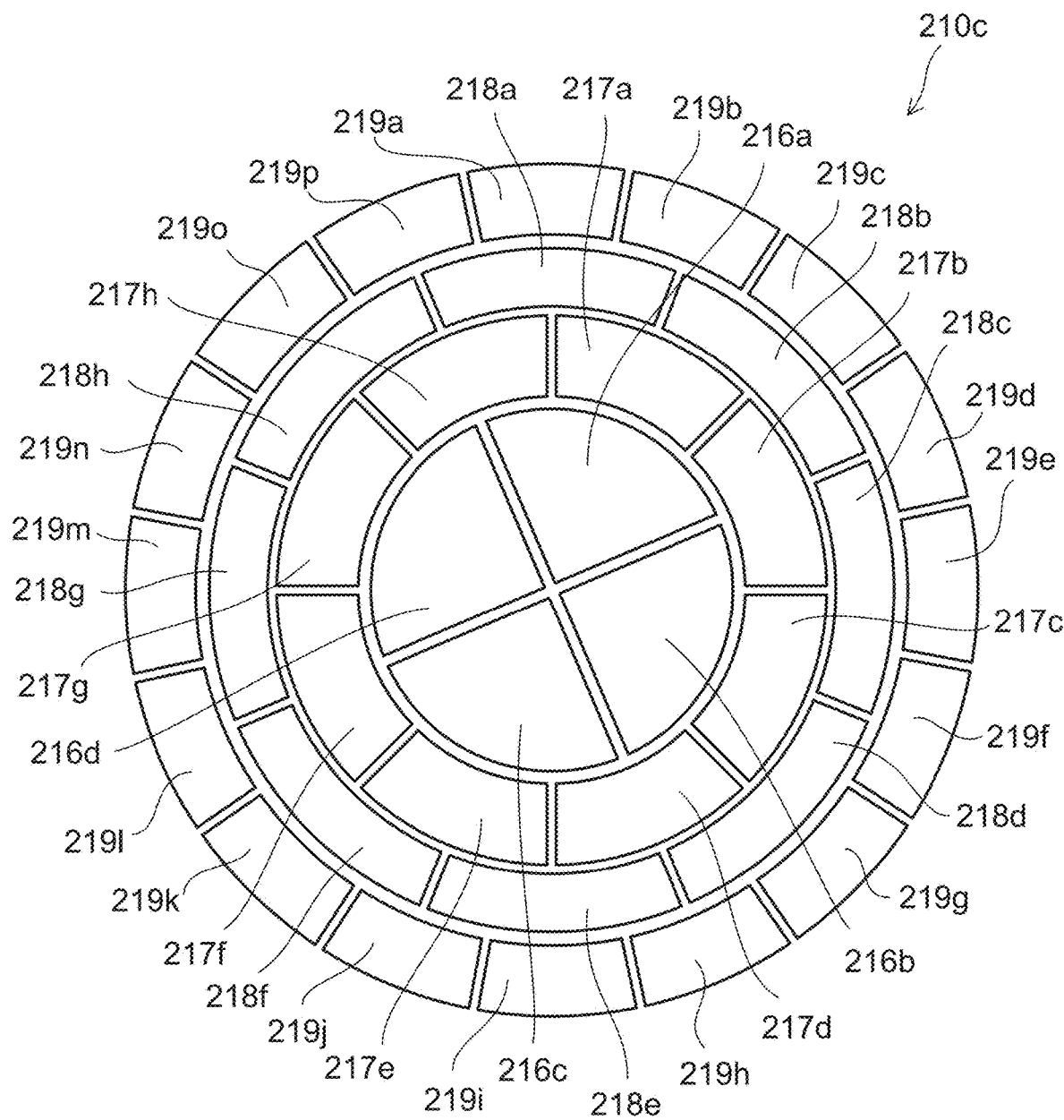
FIG. 25 is a schematic plan view illustrating modifications of the first support plate of the embodiment.

FIG. 24A, FIG. 24B, and FIG. 25 are schematic plan views illustrating modifications of the first support plate of the embodiment.

Figure 26:
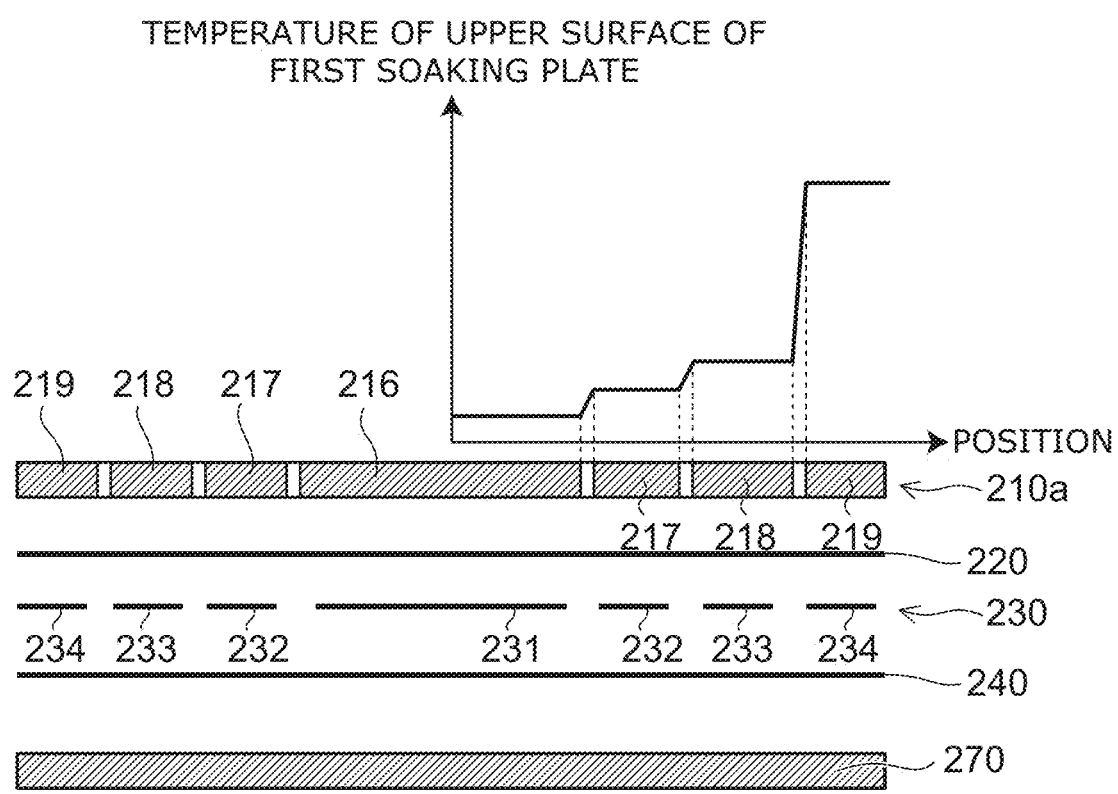
FIG. 26 is a schematic cross-sectional view illustrating the heater plate of the modification.

FIG. 26 is a schematic cross-sectional view illustrating the heater plate of the modification.

FIG. 24A illustrates an example in which the first support plate is subdivided into multiple supporters. FIG. 24B and FIG. 25 illustrate other examples in which the first support plate is subdivided into multiple supporters.

In FIG. 26, the heater plate illustrated in FIG. 24A and a graph of the temperature of the upper surface of the first support plate are illustrated together for convenience of description. The graph illustrated in FIG. 26 is an example of the temperature of the upper surface of the first support plate. The horizontal axis of the graph illustrated in FIG. 26 illustrates the position of the upper surface of a first support plate 210a. The vertical axis of the graph illustrated in FIG. 26 illustrates the temperature of the upper surface of the first support plate 210a. The bypass layer 250 and the third resin layer 260 are not illustrated in FIG. 26 for convenience of description.

In the modifications illustrated in FIG. 24A and FIG. 24B, the first support plate 210a is subdivided into multiple supporters. More specifically, in the modification illustrated in FIG. 24A, the first support plate 210a is subdivided into multiple supporters having concentric circular configurations, and includes a first supporter 216, a second supporter 217, a third supporter 218, and a fourth supporter 219. In the modification illustrated in FIG. 24B, a first support plate 210b is subdivided into multiple supporters having concentric circular configurations and radial configurations, and includes a first supporter 216a, a second supporter 216b, a third supporter 216c, a fourth supporter 216d, a fifth supporter 216e, a sixth supporter 216f, a seventh supporter 217a, an eighth supporter 217b, a ninth supporter 217c, a tenth supporter 217d, an eleventh supporter 217e, and a twelfth supporter 217f.

In the modification illustrated in FIG. 25, a first support plate 210c further includes many supporters. In the first support plate 210c of FIG. 25, the first supporter 216 shown in FIG. 24A is further subdivided into four supporters 216a to 216d. Also, the second supporter 217 shown in FIG. 24A is further subdivided into eight supporters 217a to 217h. Also, the third supporter 218 shown in FIG. 24A is further subdivided into eight regions 218a to 218h. Also, the fourth supporter 219 shown in FIG. 24A is further subdivided into sixteen supporters 219a to 219p. Thus, the number and configurations of the supporters provided in the first support plate 210 may be arbitrary.

The first resin layer 220, the heater element 230, the second resin layer 240, the bypass layer 250, the third resin layer 260, the second support plate 270, and the power supply terminal 280 each are as described above in reference to FIG. 3 to FIG. 5.

In the description hereinbelow relating to FIG. 24A to FIG. 26, the first support plate 210a illustrated in FIG. 24A is used as an example. As illustrated in FIG. 26, the first supporter 216 is provided on the first region 231 of the heater element 230 and corresponds to the first region 231 of the heater element 230. The second supporter 217 is provided on the second region 232 of the heater element 230 and corresponds to the second region 232 of the heater element 230. The third supporter 218 is provided on the third region 233 of the heater element 230 and corresponds to the third region 233 of the heater element 230. The fourth supporter 219 is provided on the fourth region 234 of the heater element 230 and corresponds to the fourth region 234 of the heater element 230.

The first supporter 216 is not electrically coupled to the second supporter 217. The second supporter 217 is not electrically coupled to the third supporter 218. The third supporter 218 is not electrically coupled to the fourth supporter 219.

According to the modification, a temperature difference in the diametrical direction in the surfaces of the first support plates 210a, 210b, and 210c can be provided deliberately (temperature controllability). For example, the temperature difference can be provided in a step configuration from the first supporter 216 to the fourth supporter 219 as in the graph illustrated in FIG. 26. Thereby, the temperature difference can be provided deliberately in the surface of the processing object W (temperature controllability).

Figure 27A:
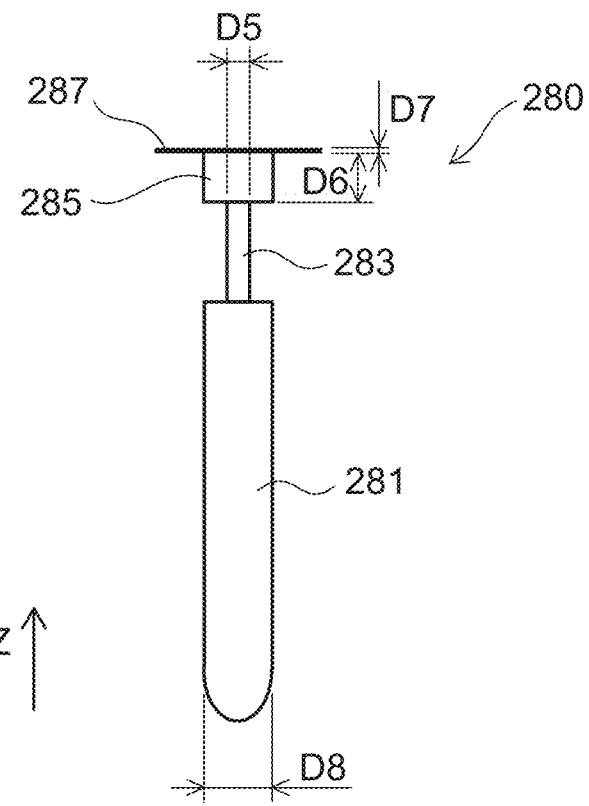
FIG. 27A and FIG. 27B are schematic plan views illustrating a specific example of the power supply terminal of the embodiment.
Figure 27B:
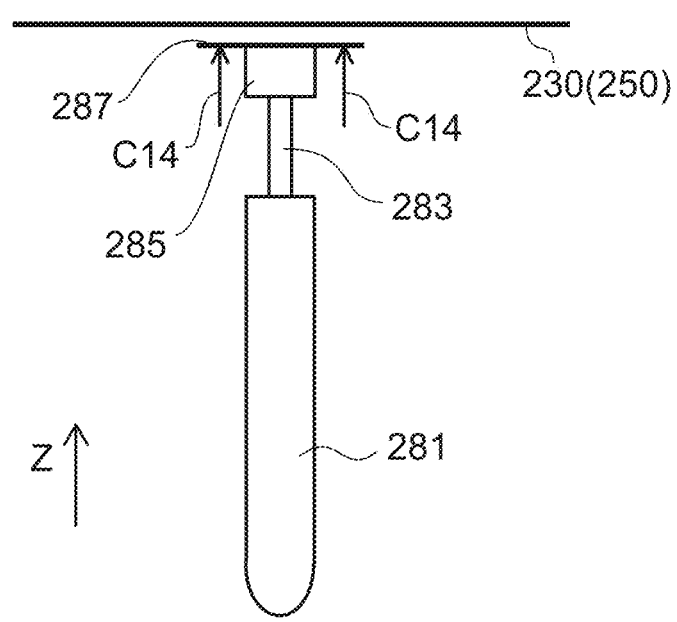

FIG. 27A and FIG. 27B are schematic plan views illustrating a specific example of the power supply terminal of the embodiment.

FIG. 27A is a schematic plan view illustrating the power supply terminal of this specific example. FIG. 27B is a schematic plan view illustrating the method for coupling the power supply terminal of this specific example.

The power supply terminal 280 illustrated in FIG. 27A and FIG. 27B includes a pin portion 281, a conducting lead portion 283, a supporter 285, and a coupling portion 287. The pin portion 281 is connected to a member called a socket, etc. The socket supplies electrical power from outside the electrostatic chuck 10. The conducting lead portion 283 is connected to the pin portion 281 and the supporter 285. The supporter 285 is connected to the conducting lead portion 283 and the coupling portion 287. As illustrated by arrow C14 illustrated in FIG. 27B, the coupling portion 287 is coupled to the heater element 230 or the bypass layer 250.

The conducting lead portion 283 relaxes the stress applied to the power supply terminal 280. In other words, the pin portion 281 is fixed to the base plate 300. On the other hand, the coupling portion 287 is coupled to the heater element 230 or the bypass layer 250. A temperature difference occurs between the base plate 300 and the heater element 230 or between the base plate 300 and the bypass layer 250. Therefore, a thermal expansion difference occurs between the base plate 300 and the heater element 230 or between the base plate 300 and the bypass layer 250. Therefore, the stress that is caused by the thermal expansion difference may be applied to the power supply terminal 280. For example, the stress that is caused by the thermal expansion difference is applied in the diametrical direction of the base plate 300. The conducting lead portion 283 can relax the stress. The coupling between the coupling portion 287 and the heater element 230 or between the coupling portion 287 and the bypass layer 250 is performed by welding, coupling utilizing a laser beam, soldering, brazing, etc.

For example, molybdenum or the like is an example of the material of the pin portion 281. For example, copper or the like is an example of the material of the conducting lead portion 283. A diameter D5 of the conducting lead portion 283 is smaller than a diameter D8 of the pin portion 281. The diameter D5 of the conducting lead portion 283 is, for example, not less than about 0.3 mm and not more than about 2.0 mm. For example, stainless steel or the like is an example of the material of the supporter 285. A thickness D6 (the length in the Z-direction) of the supporter 285 is, for example, not less than about 0.5 mm and not more than about 2.0 mm. For example, stainless steel or the like is an example of the material of the coupling portion 287. A thickness D7 (the length in the Z-direction) of the coupling portion 287 is, for example, not less than about 0.05 mm and not more than about 0.50 mm.

According to this specific example, the pin portion 281 can supply a relatively large current to the heater element 230 because the diameter D8 of the pin portion 281 is larger than the diameter D5 of the conducting lead portion 283. Also, because the diameter D5 of the conducting lead portion 283 is smaller than the diameter D8 of the pin portion 281, the conducting lead portion 283 deforms more easily than the pin portion 281; and the position of the pin portion 281 can be shifted from the center of the coupling portion 287. Thereby, the power supply terminal 280 can be fixed to a member (e.g., the base plate 300) that is different from the heater plate 200.

The supporter 285 is coupled to the conducting lead portion 283 and the coupling portion 287 by, for example, welding, coupling utilizing a laser beam, soldering, brazing, etc. Thereby, a wider contact surface area with the heater element 230 or the bypass layer 250 can be ensured while relaxing the stress applied to the power supply terminal 280.

Figure 28:
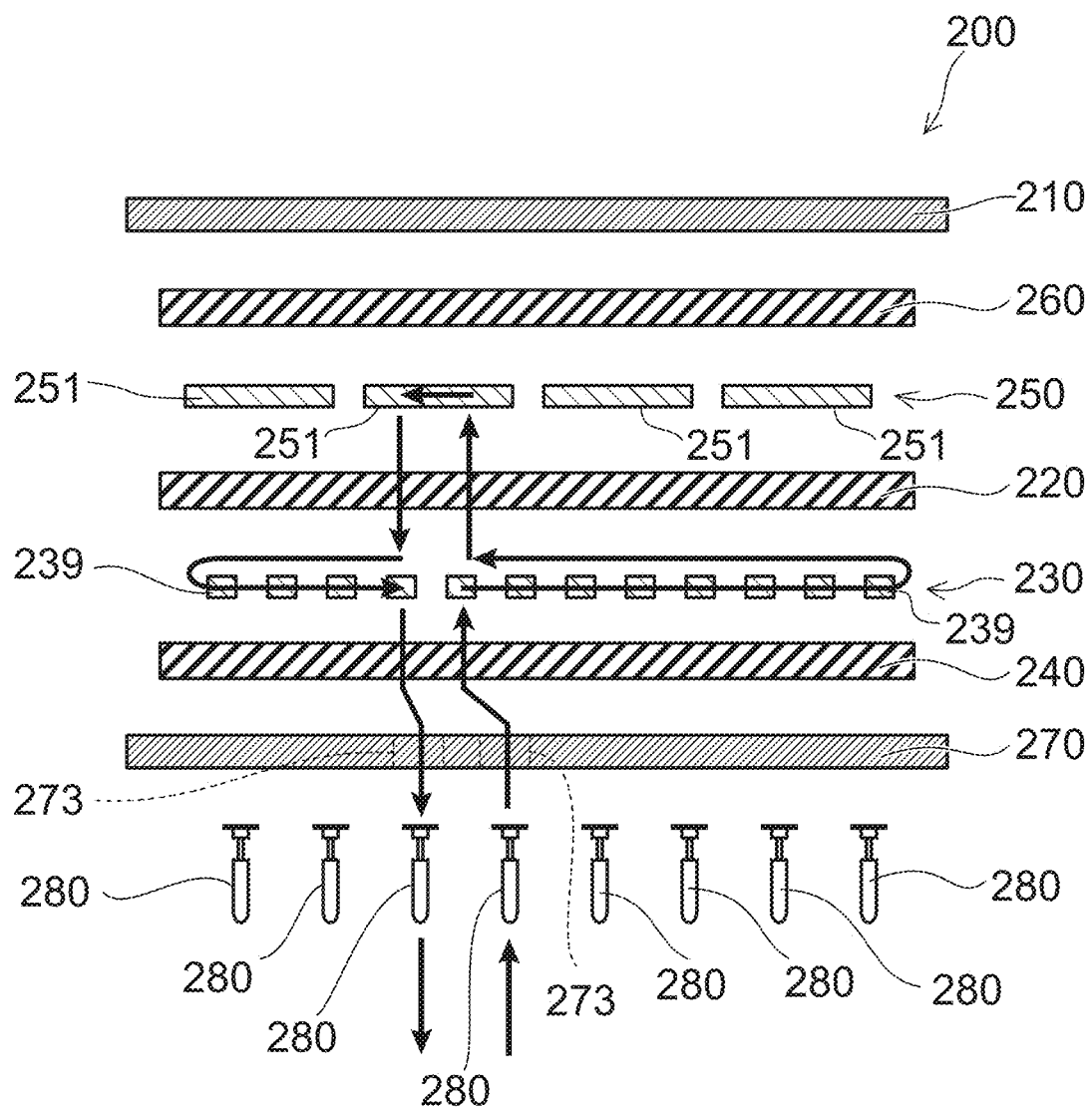
FIG. 28 is a schematic exploded view illustrating a modification of the heater plate of the embodiment.

FIG. 28 is a schematic exploded view illustrating a modification of the heater plate of the embodiment.

In the example as illustrated in FIG. 28, the bypass layer 250 is provided between the first support plate 210 and the heater element 230. More specifically, the bypass layer 250 is provided between the first support plate 210 and the first resin layer 220; and the third resin layer 260 is provided between the first support plate 210 and the bypass layer 250.

Thus, the bypass layer 250 may be provided between the first support plate 210 and the heater element 230. In other words, the bypass layer 250 may be provided between the heater element 230 and the ceramic dielectric substrate 100.

Even in such a case, the diffusability of the heat supplied from the heater element 230 can be improved by the bypass layer 250. For example, the thermal diffusion in the in-plane direction (the horizontal direction) of the processing object W can be improved. Thereby, for example, the uniformity of the temperature distribution in the surface of the processing object W can be increased. For example, the unevenness of the temperature distribution generated by the pattern of the heater element 230 can be relaxed by the bypass layer 250; and the uniformity of the temperature distribution can be increased.

For example, the bypass layer 250 may be provided both between the first support plate 210 and the heater element 230 and between the heater element 230 and the second support plate 270. In other words, the heater plate 200 may include two bypass layers 250 provided respectively between the first support plate 210 and the heater element 230 and between the heater element 230 and the second support plate 270.

Figure 29:
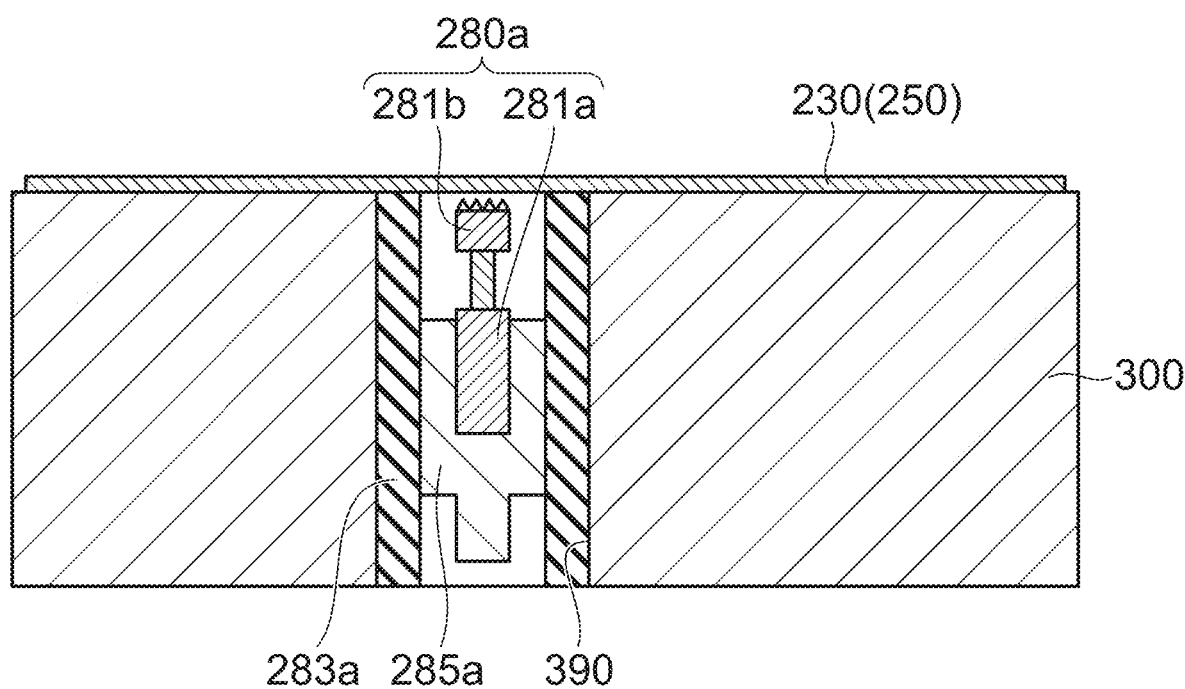
FIG. 29 is a schematic cross-sectional view illustrating a modification of the power supply terminal of the embodiment.

FIG. 29 is a schematic cross-sectional view illustrating a modification of the power supply terminal of the embodiment.

In the example, the electrostatic chuck according to the embodiment includes a power supply terminal 280a instead of the power supply terminal 280 described above. The power supply terminal 280a includes a power supply portion (a main body portion) 281a and a terminal portion 281b. The power supply terminal 280a is, for example, a contact probe.

For example, a hole 390 is provided in the base plate 300. A sleeve 283a that has a tubular configuration is fixed in the hole 390. The power supply terminal 280a is provided in the interior of the sleeve 283a and is fixed to the base plate 300 by, for example, screwing together, etc.

A socket 285a that supplies the electrical power from the outside to the heater element 230 can be connected to the power supply portion 281a.

The terminal portion 281b is provided at the tip of the power supply terminal 280a and contacts the heater element 230 or the bypass layer 250. The terminal portion 281b is slidable with respect to the power supply portion 281a; and the power supply terminal 280a is extendable/retractable. Also, the power supply terminal 280a includes a spring fixed to the power supply portion 281a in the interior of the power supply terminal 280a. The terminal portion 281b is urged by the spring so that the power supply terminal 280a elongates.

The terminal portion 281b is pressed onto the heater plate 200 (the heater element 230 or the bypass layer 250). At this time, the power supply terminal 280a is in a contracted state against the elastic force of the spring. In other words, the terminal portion 281b is pressed by being urged in the direction toward the heater element 230 or the bypass layer 250 by the elastic force of the spring. Thereby, the socket 285a is electrically connected to the heater element 230 or the bypass layer 250 via the power supply terminal 280a. The electrical power is supplied from the outside via the power supply terminal 280a and the socket 285a to the heater element 230 or the bypass layer 250.

In the case where such a power supply terminal 280a is used, the diameter of the hole provided for supplying power (the hole 390 of the base plate 300 and/or the hole 273 of the second support plate 270) can be reduced compared to the case where the coupling of the power supply terminal is performed by welding, etc.

Figure 30:
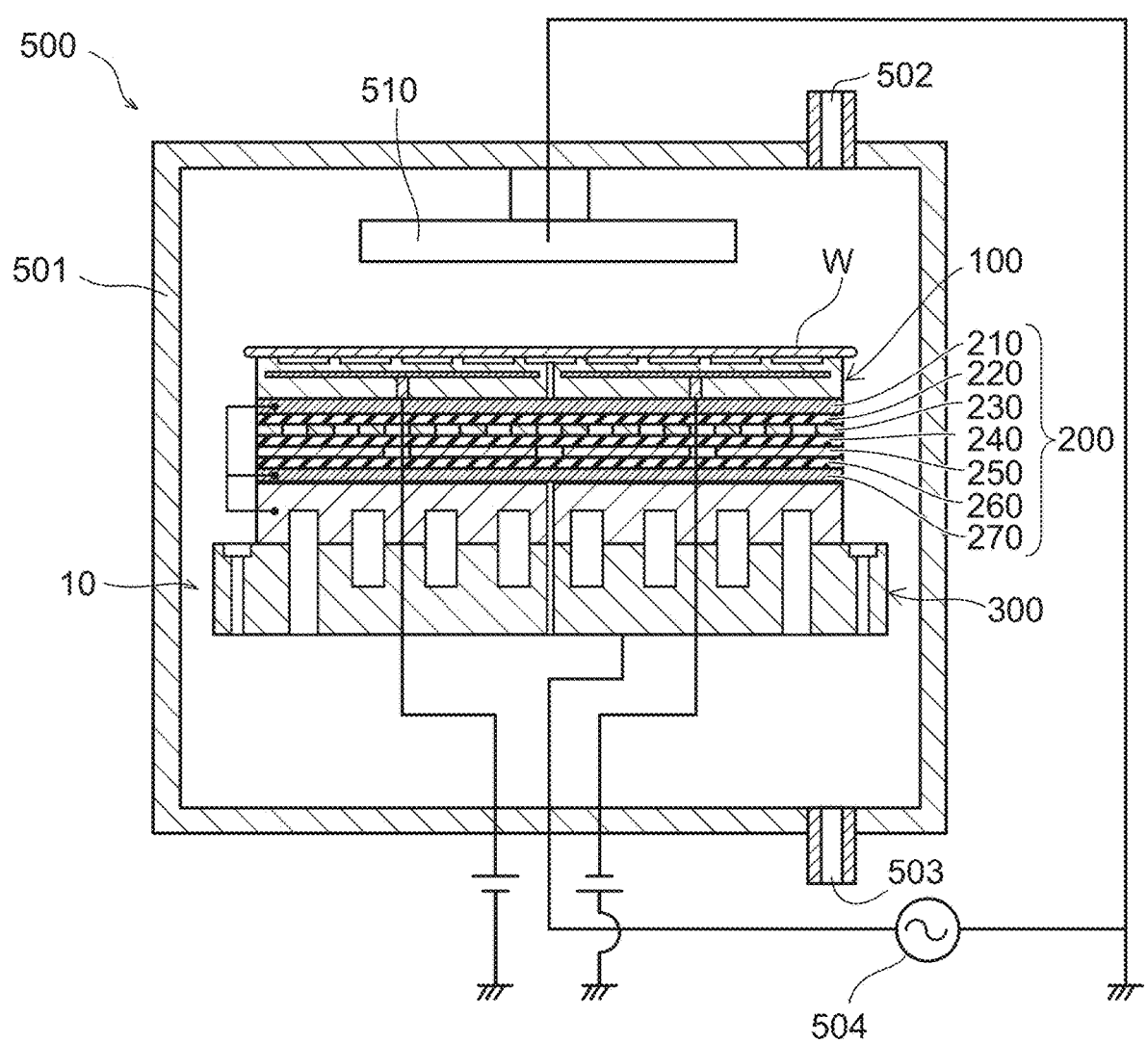
FIG. 30 is a schematic cross-sectional view illustrating a wafer processing apparatus according to another embodiment of the invention.

FIG. 30 is a schematic cross-sectional view illustrating a wafer processing apparatus according to another embodiment of the invention.

The wafer processing apparatus 500 according to the embodiment includes a processing container 501, an upper electrode 510, and an electrostatic chuck (e.g., the electrostatic chuck 10) described above in reference to FIG. 1 to FIG. 29. A processing gas inlet 502 for introducing the processing gas to the interior is provided in the ceiling of the processing container 501. An exhaust port 503 for evacuating the interior is provided in the bottom plate of the processing container 501. Also, a high frequency power supply 504 is connected to the upper electrode 510 and the electrostatic chuck 10; and a pair of electrodes including the upper electrode 510 and the electrostatic chuck 10 opposes itself to be parallel and separated by a prescribed spacing.

When the high frequency voltage is applied between the upper electrode 510 and the electrostatic chuck 10 in the wafer processing apparatus 500 according to the embodiment, high frequency electric discharge occurs; the processing gas that is introduced to the processing container 501 is excited and activated by the plasma; and the processing object W is processed. As the processing object W, a semiconductor substrate (a wafer) can be illustrated. However, the processing object W is not limited to the semiconductor substrate (the wafer) and may be, for example, a glass substrate that is used in a liquid crystal display device, etc.

The high frequency power supply 504 is electrically connected to the base plate 300 of the electrostatic chuck 10. As described above, the base plate 300 includes a metal material such as aluminum, etc. In other words, the base plate 300 is electrically conductive. Thereby, the high frequency voltage is applied between an upper electrode 410 and the base plate 300.

Also, in the wafer processing apparatus 500 of the example, the base plate 300 is electrically connected to the first support plate 210 and the second support plate 270. Thereby, in the wafer processing apparatus 500, the high frequency voltage is applied also between the first support plate 210 and the upper electrode 510 and between the second support plate 270 and the upper electrode 510.

Thus, the high frequency voltage is applied between the upper electrode 510 and each of the support plates 210 and 270. Thereby, compared to the case where the high frequency voltage is applied only between the base plate 300 and the upper electrode 510, the location where the high frequency voltage is applied can be more proximal to the processing object W. Thereby, for example, the plasma can be generated more efficiently and using a low potential.

Although an apparatus that has a configuration such as that of the wafer processing apparatus 500 generally is called a parallel plate-type RIE (Reactive Ion Etching) apparatus, the electrostatic chuck 10 according to the embodiment is not limited to applications for such an apparatus. For example, the electrostatic chuck 10 according to the embodiment is widely applicable to so-called reduced pressure processing apparatuses such as an ECR (Electron Cyclotron Resonance) etching apparatus, an inductively coupled plasma processing apparatus, a helicon wave plasma processing apparatus, a downstream plasma processing apparatus, a surface wave plasma processing apparatus, a plasma CVD (Chemical Vapor Deposition) apparatus, etc. Also, the electrostatic chuck 10 according to the embodiment is widely applicable to substrate processing apparatuses such as an exposure apparatus or an inspection apparatus in which the processing or the inspection is performed at atmospheric pressure. However, considering the high plasma resistance of the electrostatic chuck 10 according to the embodiment, it is favorable for the electrostatic chuck 10 to be applied to a plasma processing apparatus. In the configurations of these apparatuses, known configurations are applicable to the portions other than the electrostatic chuck 10 according to the embodiment; and a description is therefore omitted.

Figure 31:
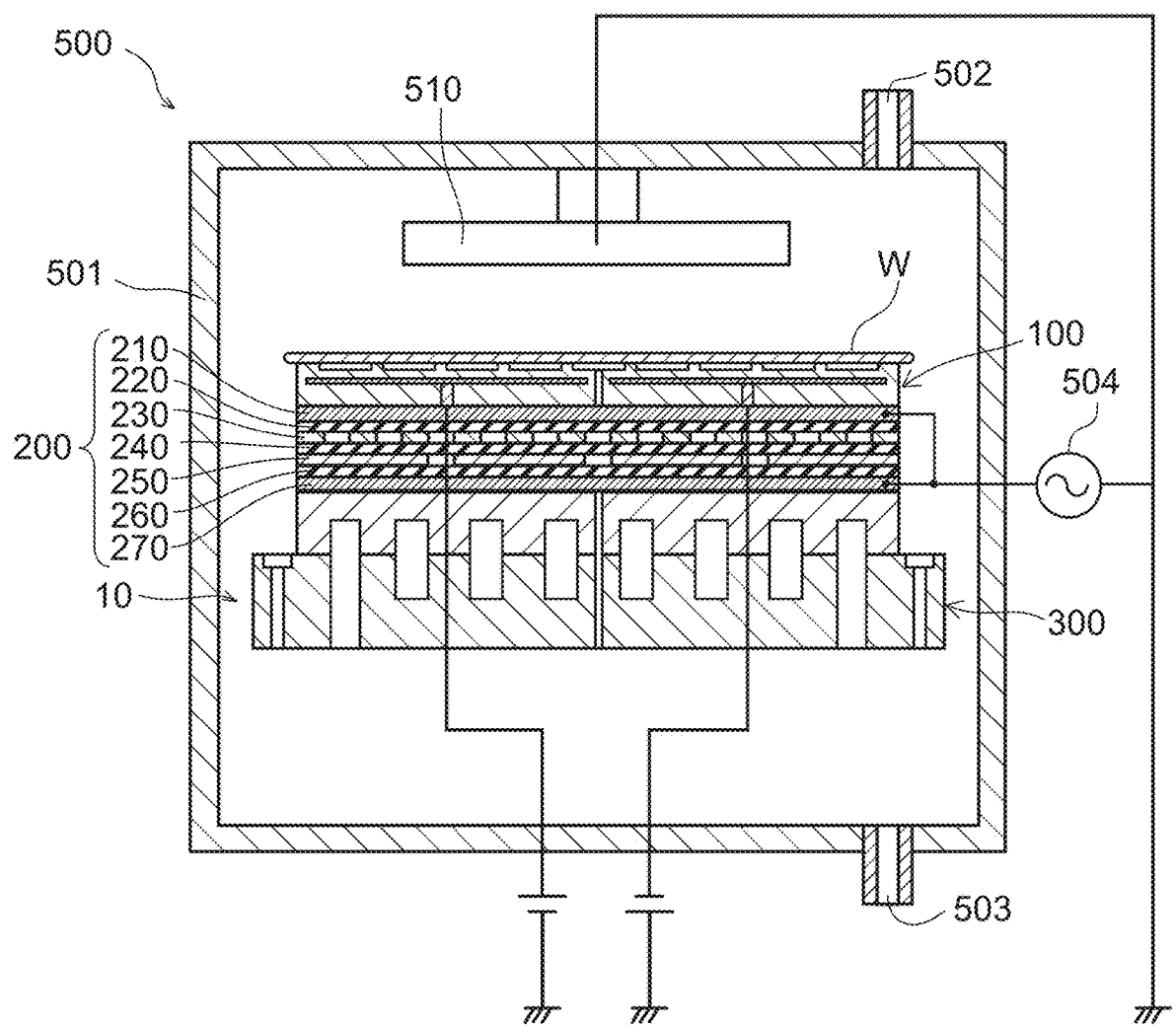
FIG. 31 is a schematic cross-sectional view illustrating a modification of the wafer processing apparatus according to the other embodiment of the invention.

FIG. 31 is a schematic cross-sectional view illustrating a modification of the wafer processing apparatus according to the other embodiment of the invention.

As illustrated in FIG. 31, the high frequency power supply 504 may be connected electrically only between the first support plate 210 and the upper electrode 510 and between the second support plate 270 and the upper electrode 510. Even in such a case, the location where the high frequency voltage is applied can be more proximal to the processing object W; and the plasma can be generated efficiently.

Figure 32:
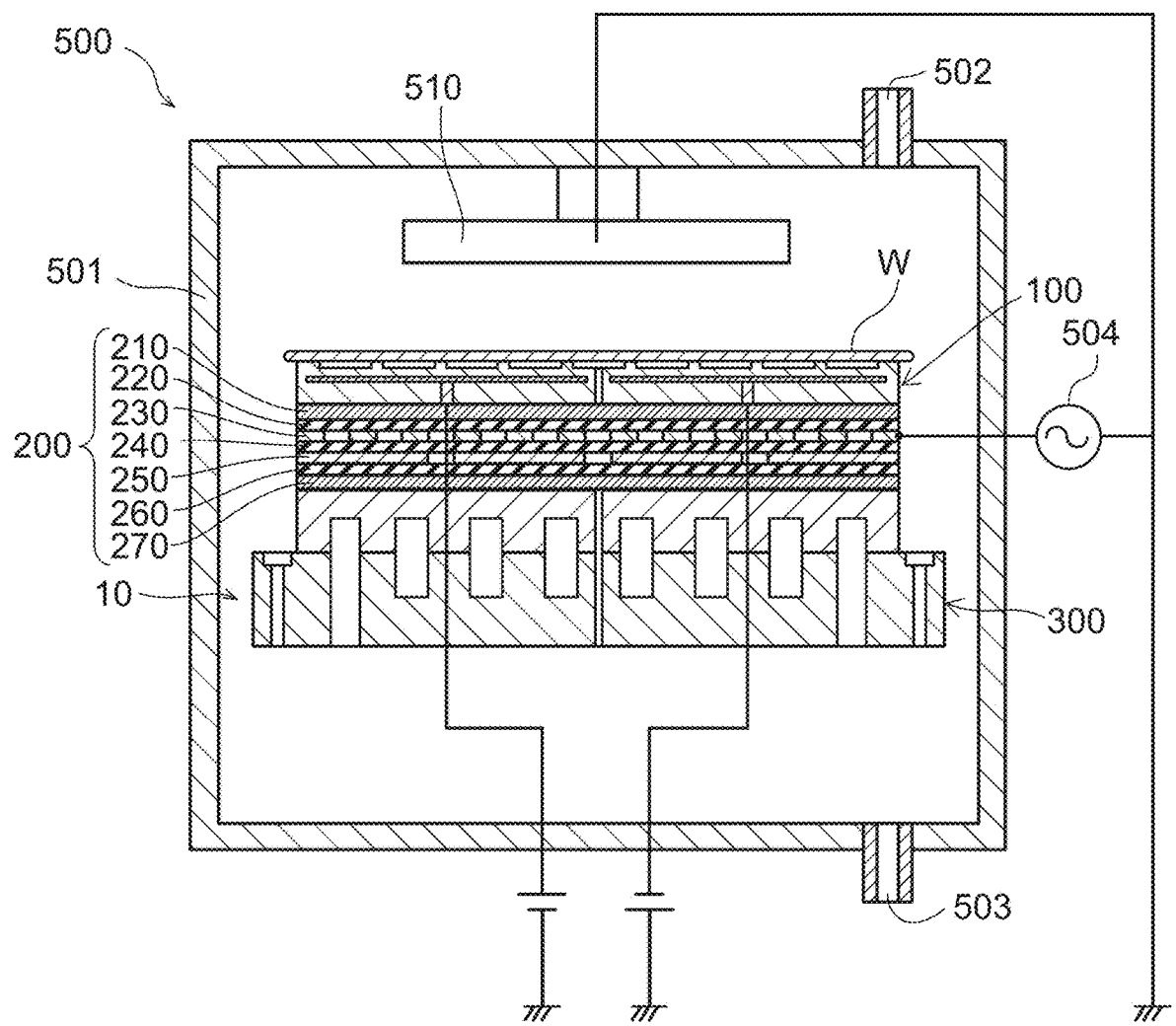
FIG. 32 is a schematic cross-sectional view illustrating a modification of the wafer processing apparatus according to the other embodiment of the invention.

FIG. 32 is a schematic cross-sectional view illustrating a modification of the wafer processing apparatus according to the other embodiment of the invention.

In the example as illustrated in FIG. 32, the high frequency power supply 504 is electrically connected to the heater element 230. Thus, the high frequency voltage may be applied between the heater element 230 and the upper electrode 510. Even in such a case, the location where the high frequency voltage is applied can be more proximal to the processing object W; and the plasma can be generated efficiently.

For example, the high frequency power supply 504 is electrically connected to the heater element 230 via the power supply terminals 280. For example, the high frequency voltage is selectively applied to the multiple regions (e.g., the first to fourth regions 231 to 234 illustrated in FIG. 12A) of the heater element 230. Thereby, the distribution of the high frequency voltage can be controlled.

For example, the high frequency power supply 504 may be connected electrically to the first support plate 210, the second support plate 270, and the heater element 230. The high frequency voltage may be applied between the first support plate 210 and the upper electrode 510, between the second support plate 270 and the upper electrode 510, and between the heater element 230 and the upper electrode 510.

This embodiment includes the following aspects.

[Appendix 1]

An electrostatic chuck that includes a ceramic dielectric substrate, a base plate, and a heater plate; the ceramic dielectric substrate has a first major surface where a processing object is placed, and a second major surface on a side opposite to the first major surface; the base plate supports the ceramic dielectric substrate and is provided at a position separated from the ceramic dielectric substrate in a stacking direction; the heater plate is provided between the ceramic dielectric substrate and the base plate; the heater plate includes a first support plate, a second support plate, a heater element provided between the first support plate and the second support plate, a first resin layer provided between the first support plate and the heater element, and a second resin layer provided between the second support plate and the heater element; the first support plate includes a metal;

the second support plate includes a metal; the heater element generates heat due to a current flowing; a surface of the first support plate on the second support plate side includes a first region and a second region; the first region overlaps the heater element when viewed along the stacking direction; the second region does not overlap the heater element when viewed along the stacking direction; and in a cross section parallel to the stacking direction, the second region protrudes toward the second support plate side compared to the first region.

[Appendix 2]

An electrostatic chuck that includes a ceramic dielectric substrate, a base plate, and a heater plate; the ceramic dielectric substrate has a first major surface where a processing object is placed, and a second major surface on a side opposite to the first major surface; the base plate supports the ceramic dielectric substrate and is provided at a position separated from the ceramic dielectric substrate in a stacking direction; the heater plate is provided between the ceramic dielectric substrate and the base plate; the heater plate includes a first support plate, a second support plate, a heater element provided between the first support plate and the second support plate, a first resin layer provided between the first support plate and the heater element, and a second resin layer provided between the second support plate and the heater element; the first support plate includes a metal; the second support plate includes a metal; the heater element generates heat due to a current flowing; a surface of the second support plate on the first support plate side includes a region overlapping the heater element when viewed along the stacking direction, and a region not overlapping the heater element when viewed along the stacking direction; and in a cross section parallel to the stacking direction, the region not overlapping the heater element protrudes toward the first support plate side compared to the region overlapping the heater element.

[Appendix 3]

The electrostatic chuck of appendix 1, wherein a surface of the second support plate on the first support plate side includes a third region and a fourth region; the third region overlaps the heater element when viewed along the stacking direction; the fourth region does not overlap the heater element when viewed along the stacking direction; and in a cross section parallel to the stacking direction, the fourth region protrudes toward the first support plate side compared to the third region.

[Appendix 4]

The electrostatic chuck of any one of appendix 1 to appendix 3, wherein a surface of the first support plate on the second support plate side includes an unevenness following a configuration of the heater element; and a surface of the second support plate on the first support plate side includes an unevenness following a configuration of the heater element.

[Appendix 5]

The electrostatic chuck of appendix 3, wherein a distance along the stacking direction between the second region and the fourth region is shorter than a distance along the stacking direction between the first region and the third region.

[Appendix 6]

The electrostatic chuck of any one of appendix 3 to appendix 5, wherein a distance along the stacking direction between the first region and the second region is shorter than a distance along the stacking direction between the second region and the fourth region; and a distance along the stacking direction between the third region and the fourth region is shorter than the distance along the stacking direction between the second region and the fourth region.

[Appendix 7]

The electrostatic chuck of any one of appendix 1 to appendix 6, wherein a width of a surface of the heater element on the first support plate side is different from a width of a surface of the heater element on the second support plate side.

[Appendix 8]

The electrostatic chuck of appendix 7, wherein the width of the surface of the heater element on the first support plate side is narrower than the width of the surface of the heater element on the second support plate side.

[Appendix 9]

The electrostatic chuck of appendix 7, wherein the width of the surface of the heater element on the first support plate side is wider than the width of the surface of the heater element on the second support plate side.

[Appendix 10]

The electrostatic chuck of any one of appendix 1 to appendix 9, wherein a side surface of the heater element has a curved configuration in the cross section.

[Appendix 11]

The electrostatic chuck of any one of appendix 1 to appendix 10, wherein a side surface of the heater element is rougher than at least one of a surface of the heater element on the first support plate side or a surface of the heater element on the second support plate side.

[Appendix 12]

The electrostatic chuck of any one of appendix 1 to appendix 11, wherein the first support plate is electrically coupled to the second support plate.

[Appendix 13]

The electrostatic chuck of appendix 12, wherein a surface area of a region where the first support plate is coupled to the second support plate is narrower than a surface area of an upper surface of the first support plate and narrower than a surface area of a lower surface of the second support plate.

[Appendix 14]

The electrostatic chuck of any one of appendix 1 to appendix 13, wherein the heater element includes a heater electrode having a band configuration; and the heater electrode is provided in a mutually-independent state in multiple regions.

[Appendix 15]

The electrostatic chuck of any one of appendix 1 to appendix 14, wherein the heater element is multiply provided; and the multiple heater elements are provided in an independent state in mutually-different layers.

[Appendix 16]

The electrostatic chuck of any one of appendix 1 to appendix 15, further including a bypass layer that is electrically conductive and is provided between the heater element and the second support plate.

[Appendix 17]

The electrostatic chuck of appendix 16, wherein a surface of the first support plate on the second support plate side includes a first portion and a second portion; the first portion overlaps the bypass layer when viewed along the stacking direction; the second portion does not overlap the bypass layer when viewed along the stacking direction; a surface of the second support plate on the first support plate side includes a third portion and a fourth portion; the third portion overlaps the bypass layer when viewed along the stacking direction; the fourth portion does not overlap the bypass layer when viewed along the stacking direction; and a distance along the stacking direction between the first portion and the second portion is shorter than a distance along the stacking direction between the third and the fourth portions.

[Appendix 18]

The electrostatic chuck of appendix 16 or appendix 17, wherein the heater element is electrically coupled to the bypass layer and electrically insulated from the first support plate and the second support plate.

[Appendix 19]

The electrostatic chuck of any one of appendix 16 to appendix 18, wherein a thickness of the bypass layer is thicker than a thickness of the first resin layer.

[Appendix 20]

The electrostatic chuck of any one of appendix 16 to appendix 19, wherein a thickness of the bypass layer is thicker than a thickness of the heater element.

[Appendix 21]

The electrostatic chuck of any one of appendix 16 to appendix 20, wherein the bypass layer is provided between the heater element and the base plate.

[Appendix 22]

A twenty-second invention is the electrostatic chuck of any one of the sixteenth to twentieth inventions, wherein the bypass layer is provided between the heater element and the ceramic dielectric substrate.

[Appendix 23]

The electrostatic chuck of any one of appendix 16 to appendix 22, wherein a size relationship of a width of a lower surface of the bypass layer with respect to a width of an upper surface of the bypass layer is the same as a size relationship of a width of a lower surface of the heater element with respect to a width of an upper surface of the heater element.

[Appendix 24]

The electrostatic chuck of any one of appendix 16 to appendix 22, wherein a size relationship of a width of a lower surface of the bypass layer with respect to a width of an upper surface of the bypass layer is the reverse of a size relationship of a width of a lower surface of the heater element with respect to a width of an upper surface of the heater element.

[Appendix 25]

The electrostatic chuck of any one of appendix 1 to appendix 24, wherein a surface area of an upper surface of the first support plate is greater than a surface area of a lower surface of the second support plate.

[Appendix 26]

The electrostatic chuck of any one of appendix 1 to appendix 25, wherein the first support plate includes multiple supporters; and the multiple supporters are provided in a mutually-independent state.

[Appendix 27]

The electrostatic chuck of any one of appendix 1 to appendix 26 that further includes a power supply terminal that is provided from the heater plate toward the base plate and supplies electrical power to the heater plate.

[Appendix 28]

The electrostatic chuck of appendix 27, wherein the power supply terminal includes a pin portion, a conducting lead portion, a supporter, and a coupling portion; the pin portion is connected to a socket supplying electrical power from the outside; the conducting lead portion is finer than the pin portion; the supporter is connected to the conducting lead portion; and the coupling portion is connected to the supporter and coupled to the heater element.

[Appendix 29]

The electrostatic chuck of any one of appendix 16 to appendix 24 that further includes a power supply terminal that is provided from the heater plate toward the base plate and supplies electrical power to the heater plate; the power supply terminal includes a pin portion, a conducting lead portion, a supporter, and a coupling portion; the pin portion is connected to a socket supplying electrical power from the outside; the conducting lead portion is finer than the pin portion; the supporter is connected to the conducting lead portion; the coupling portion is connected to the supporter and coupled to the bypass layer; and the electrical power is supplied to the heater element via the bypass layer.

[Appendix 30]

The electrostatic chuck of any one of the appendix 1 to appendix 26 that further includes a power supply terminal that is provided in the base plate and supplies electrical power to the heater plate; the power supply terminal includes a power supply portion and a terminal portion; the power supply portion is connected to a socket supplying electrical power from the outside; and the terminal portion is connected to the power supply portion and pressed onto the heater plate.

Hereinabove, embodiments of the invention are described. However, the invention is not limited to these descriptions. Appropriate design modifications made by one skilled in the art for the embodiments described above also are within the scope of the invention to the extent that the features of the invention are included. For example, the configurations, the dimensions, the materials, the arrangements, etc., of the components included in the heater plates 200, 200a, and 200b, etc., and the mounting methods and the like of the heater element 230, the first heater element 230a, the second heater element 230b, and the bypass layer 250 are not limited to those illustrated and can be modified appropriately.

Also, the components included in the embodiments described above can be combined within the limits of technical feasibility; and such combinations are within the scope of the invention to the extent that the features of the invention are included.

What is claimed is:

1. An electrostatic chuck, comprising:
    a ceramic dielectric substrate having a first major surface where a processing object is placed, and a second major surface on a side opposite to the first major surface;
    a base plate supporting the ceramic dielectric substrate and being provided at a position separated from the ceramic dielectric substrate in a stacking direction; and
    a heater plate provided between the ceramic dielectric substrate and the base plate, the heater plate including
        a first support plate including a metal,
        a second support plate including a metal,
        a heater element provided between the first support plate and the second support plate, the heater element emitting heat due to a current flowing,
        a first resin layer provided between the first support plate and the heater element, and
        a second resin layer provided between the second support plate and the heater element,
    the heater element including a first electrically conductive portion and a second electrically conductive portion, the second electrically conductive portion being separated from the first electrically conductive portion in an in-plane direction parallel to the first major surface,
    a surface of the first support plate on the second support plate side including a first region and a second region, the first region overlapping the heater element when viewed along the stacking direction, the second region not overlapping the heater element when viewed along the stacking direction, the first region including a first part and a second part, the first part overlapping the first electrically conductive portion when viewed along the stacking direction, the second part overlapping the second electrically conductive portion when viewed along the stacking direction, the second region being disposed between the first part and the second part, in a cross section parallel to the stacking direction, the second region protruding toward the second support plate side compared to the first region part and the second part.

2. The electrostatic chuck according to claim 1, wherein a surface of the second support plate on the first support plate side includes a third region and a fourth region, the third region overlapping the heater element when viewed along the stacking direction, the fourth region not overlapping the heater element when viewed along the stacking direction, and in a cross section parallel to the stacking direction, the fourth region protrudes toward the first support plate side compared to the third region.

3. The electrostatic chuck according to claim 2, wherein a distance along the stacking direction between the second region and the fourth region is shorter than a distance along the stacking direction between the first region and the third region.

4. The electrostatic chuck according to claim 2, wherein a distance along the stacking direction between the first region and the second region is shorter than a distance along the stacking direction between the second region and the fourth region, and a distance along the stacking direction between the third region and the fourth region is shorter than the distance along the stacking direction between the second region and the fourth region.

5. The electrostatic chuck according to claim 1, wherein a surface of the first support plate on the second support plate side includes an unevenness following a configuration of the heater element, and a surface of the second support plate on the first support plate side includes an unevenness following a configuration of the heater element.

6. The electrostatic chuck according to claim 1, wherein a width of a surface of the heater element on the first support plate side is different from a width of a surface of the heater element on the second support plate side.

7. The electrostatic chuck according to claim 6, wherein the width of the surface of the heater element on the first support plate side is narrower than the width of the surface of the heater element on the second support plate side.

8. The electrostatic chuck according to claim 6, wherein the width of the surface of the heater element on the first support plate side is wider than the width of the surface of the heater element on the second support plate side.

9. The electrostatic chuck according to claim 1, wherein a side surface of the heater element has a curved configuration in the cross section.

10. The electrostatic chuck according to claim 1, wherein a side surface of the heater element is rougher than at least one of a surface of the heater element on the first support plate side or a surface of the heater element on the second support plate side.

11. The electrostatic chuck according to claim 1, wherein the first support plate is electrically coupled to the second support plate.

12. The electrostatic chuck according to claim 11, wherein a surface area of a region where the first support plate is coupled to the second support plate is narrower than a surface area of an upper surface of the first support plate and narrower than a surface area of a lower surface of the second support plate.

13. The electrostatic chuck according to claim 1, wherein the heater element includes a heater electrode having a band configuration, and the heater electrode is provided in a mutually-independent state in a plurality of regions.

14. The electrostatic chuck according to claim 1, wherein a plurality of the heater elements is provided, and the plurality of heater elements is provided in an independent state in mutually-different layers.

15. The electrostatic chuck according to claim 1, further comprising a bypass layer provided between the heater element and the second support plate, the bypass layer being electrically conductive.

16. The electrostatic chuck according to claim 15, wherein a surface of the first support plate on the second support plate side includes a first portion and a second portion, the first portion overlapping the bypass layer when viewed along the stacking direction, the second portion not overlapping the bypass layer when viewed along the stacking direction, a surface on the first support plate side of the second support plate includes a fourth portion, the third portion overlapping the bypass layer when viewed along the stacking direction, the fourth portion not overlapping the bypass layer when viewed along the stacking direction, and a distance along the stacking direction between the first portion and the second portion is shorter than a distance along the stacking direction between the third and the fourth portions.

17. The electrostatic chuck according to claim 15, wherein the heater element is electrically coupled to the bypass layer and electrically insulated from the first support plate and the second support plate.

18. The electrostatic chuck according to claim 15, wherein a thickness of the bypass layer is thicker than a thickness of the first resin layer.

19. The electrostatic chuck according to claim 15, wherein a thickness of the bypass layer is thicker than a thickness of the heater element.

20. The electrostatic chuck according to claim 15, wherein the bypass layer is provided between the heater element and the base plate.

21. The electrostatic chuck according to claim 15, wherein the bypass layer is provided between the heater element and the ceramic dielectric substrate.

22. The electrostatic chuck according to claim 15, wherein a size relationship of a width of a lower surface of the bypass layer with respect to a width of an upper surface of the bypass layer is the same as a size relationship of a width of a lower surface of the heater element with respect to a width of an upper surface of the heater element.

23. The electrostatic chuck according to claim 15, wherein a size relationship of a width of a lower surface of the bypass layer with respect to a width of an upper surface of the bypass layer is the reverse of a size relationship of a width of a lower surface of the heater element with respect to a width of an upper surface of the heater element.

24. The electrostatic chuck according to claim 15, further comprising a power supply terminal supplying electrical power to the heater plate and being provided from the heater plate toward the base plate, the power supply terminal including:
a pin portion connected to a socket supplying electrical power from the outside;
a conducting lead portion finer than the pin portion;
a supporter connected to the conducting lead portion; and
a coupling portion connected to the supporter and coupled to the bypass layer, the electrical power being supplied to the heater element via the bypass layer.

25. The electrostatic chuck according to claim 1, wherein a surface area of an upper surface of the first support plate is greater than a surface area of a lower surface of the second support plate.

26. The electrostatic chuck according to claim 1, wherein the first support plate includes a plurality of supporters, and
the plurality of supporters is provided in a mutually-independent state.

27. The electrostatic chuck according to claim 1, further comprising a power supply terminal supplying electrical power to the heater plate and being provided from the heater plate toward the base plate.

28. The electrostatic chuck according to claim 27, wherein
the power supply terminal includes:
a pin portion connected to a socket supplying electrical power from the outside;
a conducting lead portion finer than the pin portion;
a supporter connected to the conducting lead portion; and
a coupling portion connected to the supporter and coupled to the heater element.

29. The electrostatic chuck according to claim 1, further comprising a power supply terminal supplying electrical power to the heater plate and being provided in the base plate,
the power supply terminal including:
a power supply portion connected to a socket supplying electrical power from the outside; and
a terminal portion connected to the power supply portion and pressed onto the heater plate.

30. An electrostatic chuck, comprising:
a ceramic dielectric substrate having a first major surface where a processing object is placed, and a second major surface on a side opposite to the first major surface;
a base plate supporting the ceramic dielectric substrate and being provided at a position separated from the ceramic dielectric substrate in a stacking direction; and
a heater plate provided between the ceramic dielectric substrate and the base plate, the heater plate including
a first support plate including a metal,
a second support plate including a metal,
a heater element provided between the first support plate and the second support plate, the heater element emitting heat due to a current flowing,
a first resin layer provided between the first support plate and the heater element, and
a second resin layer provided between the second support plate and the heater element,
the heater element including a first electrically conductive portion and a second electrically conductive portion, the second electrically conductive portion being separated from the first electrically conductive portion in an in-plane direction parallel to the first major surface,
a surface of the second support plate on the first support plate side includes a region overlapping the heater element when viewed along the stacking direction, and a region not overlapping the heater element when viewed along the stacking direction,
the region overlapping the heater element including a first overlapping part and a second overlapping part, the first overlapping part overlapping the first electrically conductive portion when viewed along the stacking direction, the second overlapping part overlapping the second electrically conductive portion when viewed along the stacking direction, the region not overlapping the heater element being disposed between the first overlapping part and the second overlapping part,
in a cross section parallel to the stacking direction, the region not overlapping the heater element protrudes toward the first support plate side compared to the first overlapping part and the second overlapping part.

* * * * *